United States Patent
Kang et al.

(10) Patent No.: US 9,366,929 B2
(45) Date of Patent: Jun. 14, 2016

(54) DISPLAY PANEL AND DISPLAY DEVICE

(71) Applicant: LG ELECTRONICS INC., Seoul (KR)

(72) Inventors: Wanjune Kang, Pyeongtaek-si (KR);
Dongwon Choi, Pyeongtaek-si (KR);
Jungmin Park, Pyeongtaek-si (KR);
Sangchul Han, Pyeongtaek-si (KR);
Dongho Ham, Pyeongtaek-si (KR)

(73) Assignee: LG ELECTRONICS, INC., Seoul (KR)

( * ) Notice: Subject to any disclaimer, the term of this patent is extended or adjusted under 35 U.S.C. 154(b) by 0 days.

(21) Appl. No.: 14/803,599

(22) Filed: Jul. 20, 2015

(65) Prior Publication Data

US 2015/0323848 A1 Nov. 12, 2015

Related U.S. Application Data

(63) Continuation of application No. 14/640,486, filed on Mar. 6, 2015, now Pat. No. 9,123,593, which is a continuation of application No. 14/163,792, filed on Jan. 24, 2014, now Pat. No. 8,994,042.

(30) Foreign Application Priority Data

May 20, 2013 (KR) .................. 10-2013-0056499
May 20, 2013 (KR) .................. 10-2013-0056507
May 20, 2013 (KR) .................. 10-2013-0056515

(51) Int. Cl.
*G02F 1/1362* (2006.01)
*H01L 27/12* (2006.01)
(Continued)

(52) U.S. Cl.
CPC ........ *G02F 1/136286* (2013.01); *G02F 1/1345* (2013.01); *G02F 1/1368* (2013.01); *G02F 1/13452* (2013.01); *G02F 1/13458* (2013.01); *G02F 1/133305* (2013.01);
(Continued)

(58) Field of Classification Search
CPC ............... H01L 27/124; G02F 1/1345; G02F 1/133305; G02F 1/133308
See application file for complete search history.

(56) References Cited

U.S. PATENT DOCUMENTS

2002/0122143 A1* 9/2002 Woo .................. G02F 1/1339
349/42
2005/0217720 A1 10/2005 Rey-Mermet et al.
(Continued)

FOREIGN PATENT DOCUMENTS

EP 2 138 892 A1 12/2009
EP 2 395 496 A1 12/2011
(Continued)

OTHER PUBLICATIONS

European Search Report issued in Application No. 14 15 2762.2 dated Jun. 25, 2014.
(Continued)

*Primary Examiner* — Kyoung Lee
(74) *Attorney, Agent, or Firm* — KED & Associates, LLP

(57) ABSTRACT

A display panel includes a first substrate on which an electrode line and a switching element are disposed, a second substrate positioned opposite the first substrate, a seal provided between the first substrate and the second substrate, a pad electrode that vertically overlaps the seal and is electrically connected to the electrode line, and a side electrode which is connected to one end of the pad electrode and includes a portion positioned on an exterior facing side of the seal.

21 Claims, 60 Drawing Sheets

(51) Int. Cl.
  *G02F 1/1368* (2006.01)
  *G02F 1/1343* (2006.01)
  *G02F 1/1345* (2006.01)
  *G02F 1/1333* (2006.01)

(52) U.S. Cl.
  CPC ... *G02F 1/133308* (2013.01); *G02F 1/134309* (2013.01); *H01L 27/124* (2013.01); *G02F 1/133351* (2013.01)

(56) References Cited

U.S. PATENT DOCUMENTS

2005/0237445 A1   10/2005   Grupp et al.
2010/0315570 A1   12/2010   Mathew et al.

FOREIGN PATENT DOCUMENTS

EP   2 520 968 A1   11/2012
JP   H03-110518 A   5/1991
JP   H04-009924 A   1/1992

OTHER PUBLICATIONS

European Search Report dated Sep. 9, 2014 issued in Application No. 14152762.2 (with English translation).

U.S. Notice of Allowance dated Nov. 24, 2014 issued in U.S. Appl. No. 14/163,792.

U.S. Notice of Allowance dated Apr. 20, 2015 issued in U.S. Appl. No. 14/640,486.

* cited by examiner

DISPLAY PANEL AND DISPLAY DEVICE

CROSS-REFERENCE TO RELATED APPLICATIONS

This application is a Continuation application of prior U.S. application Ser. No. 14/640,486 filed on Mar. 6, 2015, which is a Continuation application of prior U.S. application Ser. No. 14/163,792 filed on Jan. 24, 2014, which claims priority under 35 U.S.C. §119 to Korean Application Nos. 10-2013-0056499, 10-2013-0056507 and 10-2013-0056515 filed in Korea on May 20, 2013, whose entire disclosures are hereby incorporated by reference.

BACKGROUND

1. Field

Embodiments relate to a display panel and a display device.

2. Background

Various different types of display devices, such as liquid crystal displays (LCDs), plasma display panels (PDPs), electroluminescent displays (ELDs), and vacuum fluorescent displays (VFDs), may be considered to meet various demands for display devices in various different applications and environments. A liquid crystal display panel of the liquid crystal display may include a liquid crystal layer, and a thin film transistor (TFT) substrate and a color filter substrate which are positioned opposite each other with the liquid crystal layer interposed therebetween. The liquid crystal display panel may display an image using light provided by a backlight device of the liquid crystal display.

BRIEF DESCRIPTION OF THE DRAWINGS

The embodiments will be described in detail with reference to the following drawings in which like reference numerals refer to like elements wherein.

DETAILED DESCRIPTION

Figure 1:
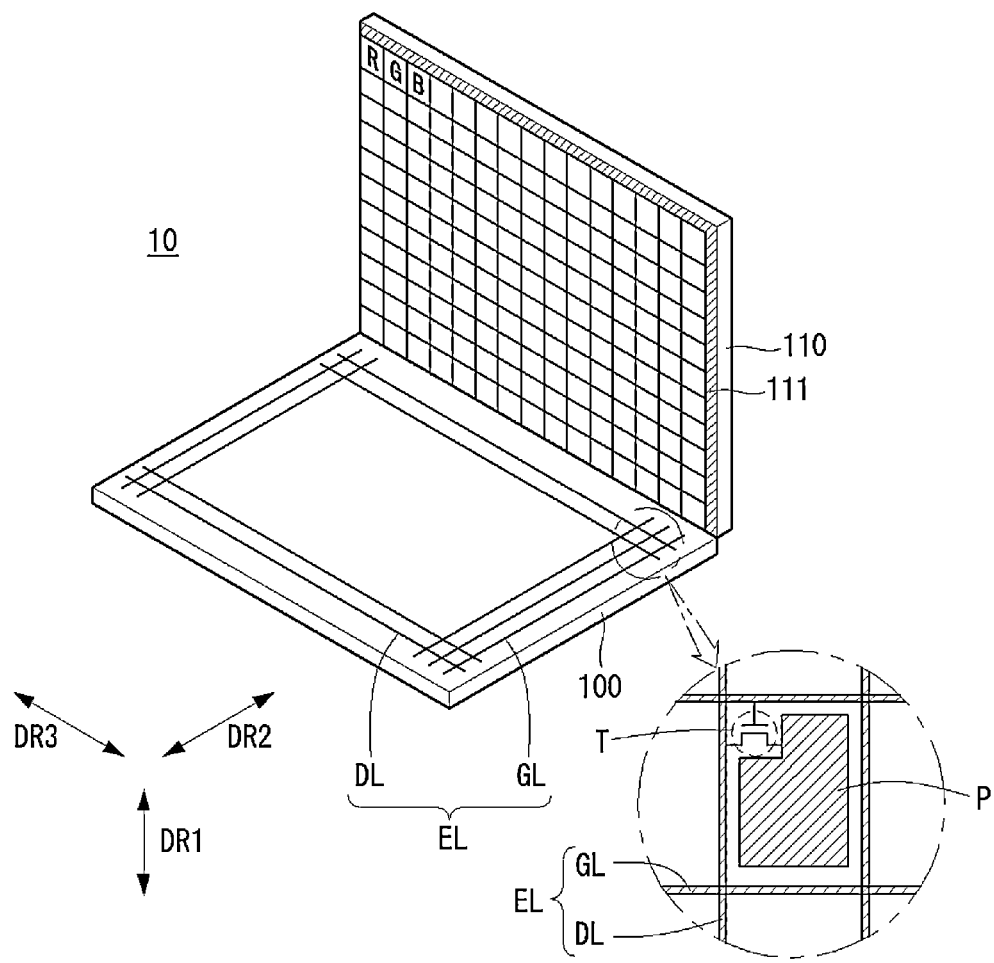
FIG. 1 illustrates a display panel according to an exemplary embodiment as broadly described herein.

Reference will now be made in detail to various embodiments, examples of which are illustrated in the accompanying drawings. Since embodiments may be modified in various ways and may have various forms, specific embodiments are illustrated in the drawings and are described in detail for purposes of explanation and illustration. However, it should be understood that embodiments are not limited to the specific disclosed embodiments, but include all modifications, equivalents and substitutes included within the spirit and technical scope as broadly described herein.

The terms 'first', 'second', etc. may be used to describe various components, but the components are not limited by such terms. The terms are used only for the purpose of distinguishing one component from other components. For example, a first component may be designated as a second component without departing from the scope as broadly described herein. In the same manner, the second component may be designated as the first component.

The term "and/or" encompasses both combinations of the plurality of related items disclosed and any item from among the plurality of related items disclosed.

When an arbitrary component is described as "being connected to" or" being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

Terminology as used herein may be directed to specific embodiments or examples, but is not intended to be limiting. A singular expression may include a plural expression as long as it does not have an apparently different meaning in context.

The terms "include" and "have" may be understood to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present disclosure pertains. The terms defined in a generally used dictionary may be understood to have the same meanings as those used in the context of the related art, and are not to be construed to have ideal or excessively formal meanings unless they are obviously specified as such.

The following exemplary embodiments are provided to those skilled in the art for completeness. Accordingly, shapes and sizes of elements shown in the drawings may be exaggerated for clarity.

As shown in FIG. 1, a display panel 10 as embodied and broadly described herein may include a first substrate 100 and a second substrate 110 which are positioned opposite each other. A liquid crystal layer may be disposed between the first substrate 100 and the second substrate 110.

Electrode lines EL may be disposed on the first substrate 100. The electrode lines EL may include gate lines GL and data lines DL crossing the gate lines GL. The electrode lines EL may be referred to as electrode wirings. The gate lines GL may extend in a direction DR2, and the data lines DL may extend in a direction DR3 crossing the direction DR2.

Switching elements T may be respectively disposed at crossings of the gate lines GL and the data lines DL of the first substrate 100. Pixel electrodes P electrically connected to the switching elements T may be disposed on the first substrate 100. The switching element T may be implemented as a thin film transistor (TFT). Further, the switching elements T may be arranged on the first substrate 100 in a matrix form. Each of the gate line GL and the data line DL may be electrically connected to the switching element T.

The first substrate 100 may be referred to as an array substrate.

A color filter 111 may be disposed on the second substrate 110. The color filter 111 may include a red area (R), a green area (G), and a blue area (B).

In certain embodiments, a black matrix layer for dividing a pixel area may be formed on the second substrate 110.

In certain embodiments, another electrode, for example, a common electrode may be disposed on the second substrate 110.

The second substrate 110 may be referred to as a color filter substrate.

Figure 2:
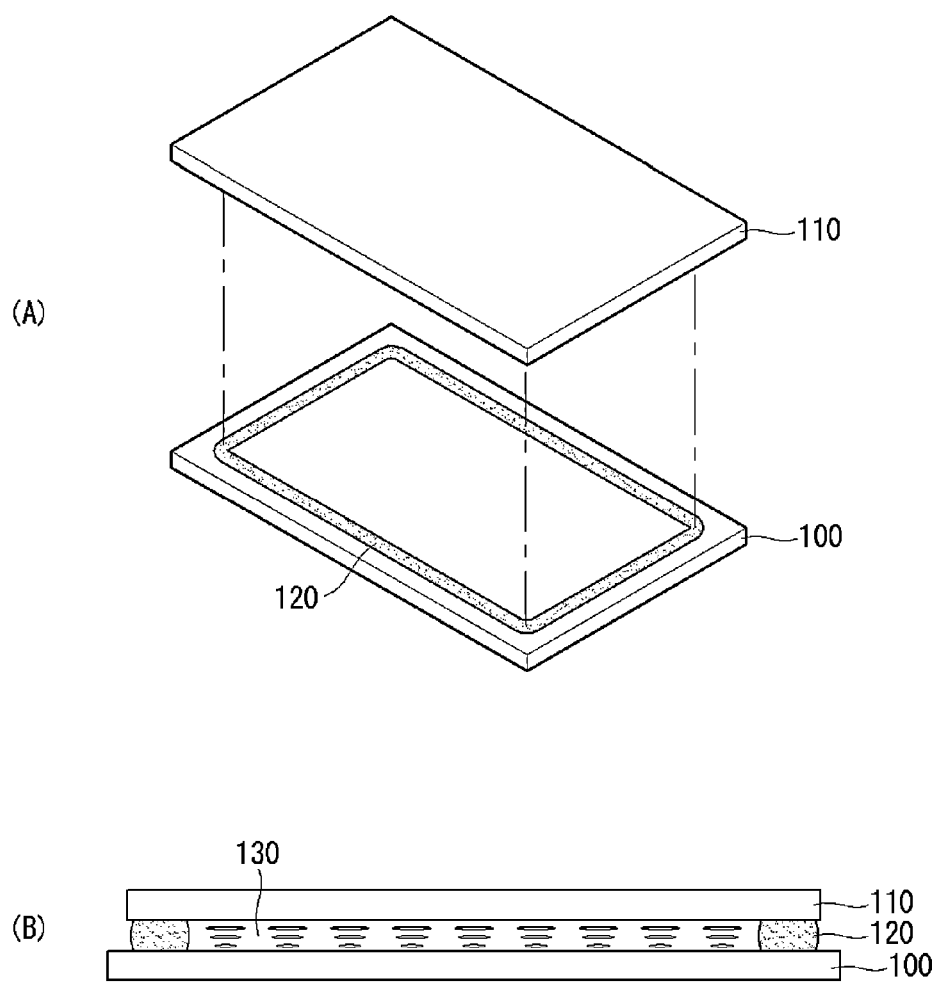
FIGS. 2 to 32 illustrate a method for manufacturing a display panel and a structure of the display panel, in accordance with embodiments as broadly described herein.

As shown in FIG. 2A, the first substrate 100, on which the electrode lines EL and the switching elements T are formed, and the second substrate 110 may be attached to each other using a seal 120. The seal 120 may be formed at an edge of at least one of the first substrate 100 or the second substrate 110. Afterwards, as shown in FIG. 2B, a liquid crystal layer 130 may be inserted into an area between the first substrate 100 and the second substrate 110 which are attached to each other by the seal 120.

Figure 3:
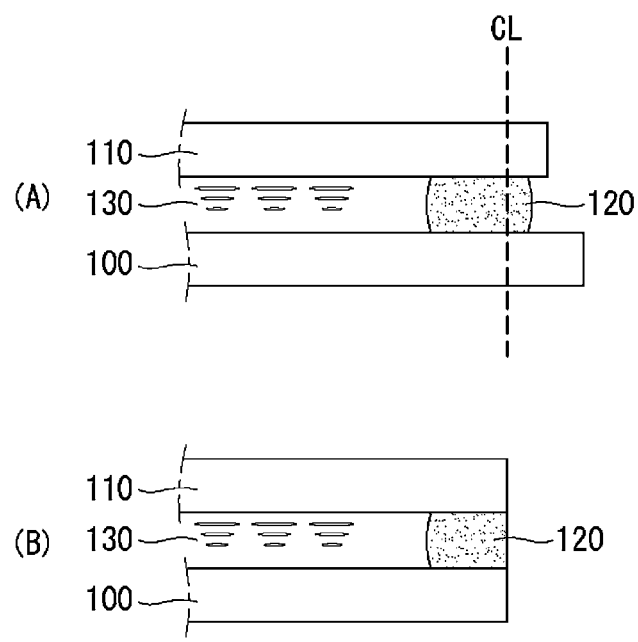

As shown in FIG. 3A, an edge of the display panel may then be cut along a cutting line CL. The first substrate 100, the second substrate 110, and the seal 120 may be partially cut in a cutting process. Hence, as shown in FIG. 3B, after the cutting process, ends of the first substrate 100, the second substrate 110, and the seal 120 may be aligned along a straight line. As described above, when the edge of the display panel is cut and removed, a size of a bezel area may be reduced.

Figure 4:
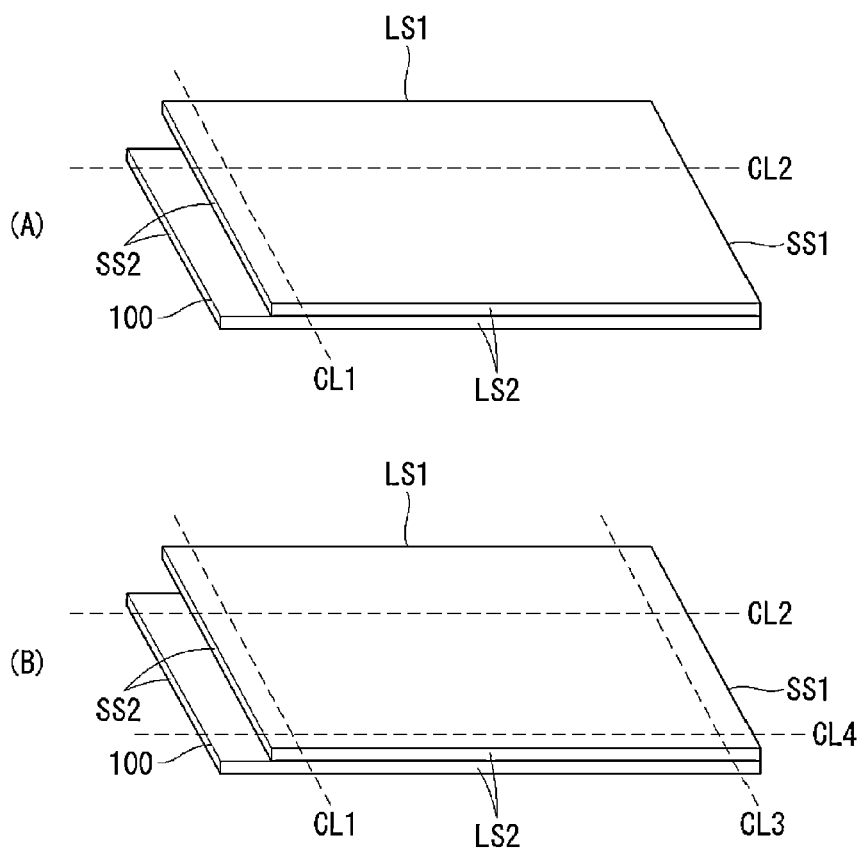

A cutting position of the display panel may be changed depending on a structure of the electrode lines EL disposed on the first substrate 100. For example, as shown in FIG. 4A, when the first substrate 100 and the second substrate 110 are attached to each other, areas around first long sides LS1 of the first substrate 100 and the second substrate 110 may be cut along a second cutting line CL2, and areas around second short sides SS2 of the first substrate 100 and the second substrate 110 may be cut along a first cutting line CL1. In this instance, pad electrodes may be disposed in the areas around the first long sides LS1 and the second short sides SS2 of the first substrate 100 and the second substrate 110.

Alternatively, as shown in FIG. 4B, when the first substrate 100 and the second substrate 110 are attached to each other, areas around the first long sides LS1 of the first substrate 100 and the second substrate 110 may be cut along the second cutting line CL2, areas around second long sides LS2 of the first substrate 100 and the second substrate 110 may be cut along a fourth cutting line CL4, areas around first short sides SS1 of the first substrate 100 and the second substrate 110 may be cut along a third cutting line CL3, and areas around the second short sides SS2 of the first substrate 100 and the second substrate 110 may be cut along the first cutting line CL1.

In this instance, although not shown, the pad electrodes may be disposed in each of the areas around the first long sides LS1, the second long sides LS2, the first short sides SS1, and the second short sides SS2 of the first substrate 100 and the second substrate 110.

Figure 5:
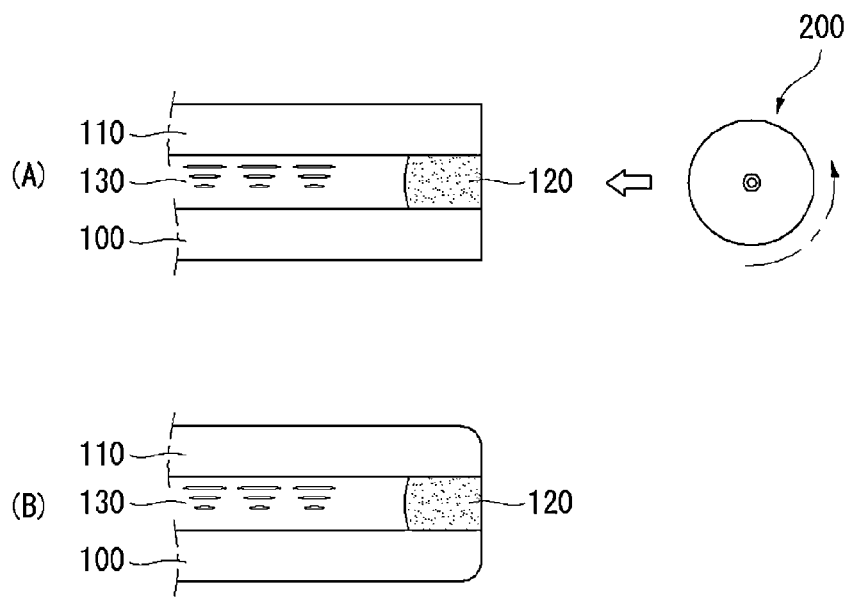

As shown in FIG. 5A, after the edge of the display panel is cut, the side of the cut display panel may be ground using a grinder 200. Hence, as shown in FIG. 5B, the side of the display panel may be smoothly processed. As a result, structural stability of at least one of the first substrate 100 or the second substrate 110 may be improved.

Figure 6:
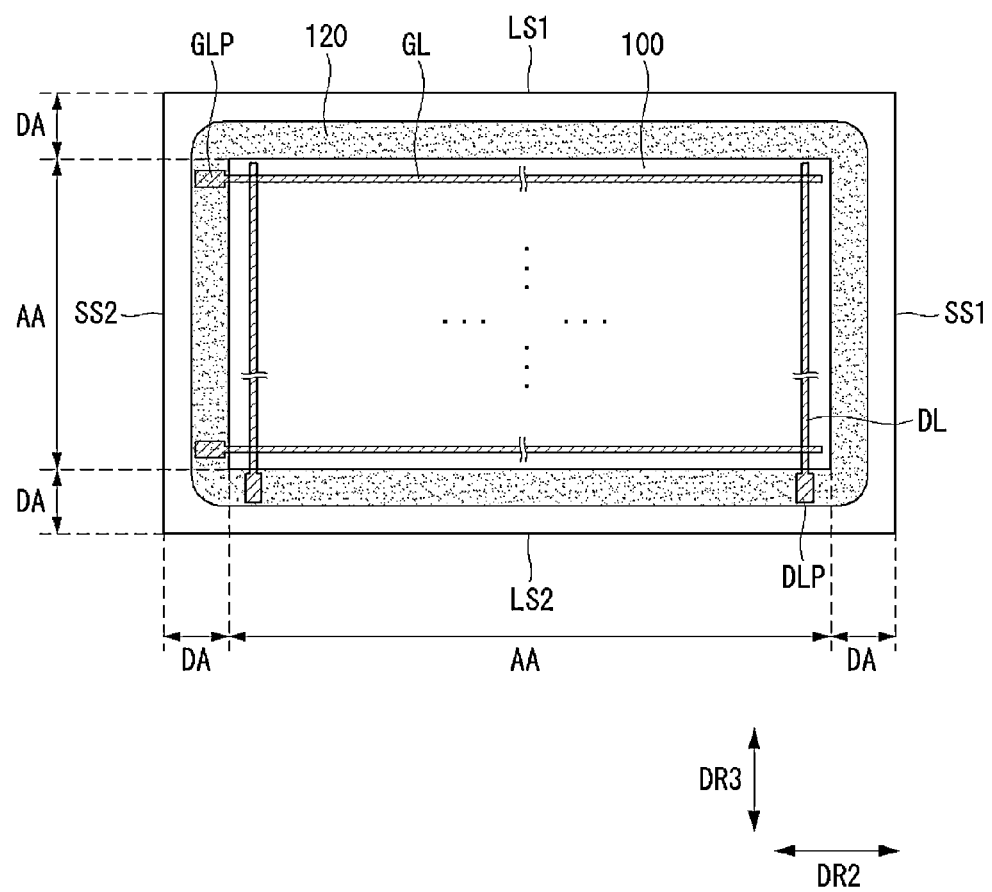

As shown in FIG. 6, a pad electrode ELP may be disposed at the edge of the first substrate 100. The pad electrode ELP may be electrically connected to the electrode line EL. For example, a data pad electrode DLP electrically connected to the data line DL may be disposed in the area around the second long side LS2 of the first substrate 100, and a gate pad electrode GLP electrically connected to the gate line GL may be disposed in the area around the second short side SS2 of the first substrate 100. The pad electrode ELP may be positioned at an end of at least one side of the electrode line EL. The pad electrode ELP and the electrode line EL may be formed as a single body. Alternatively, after the pad electrode ELP and the electrode line EL are separately formed, the pad electrode ELP may be electrically connected to the electrode line EL.

The seal 120 may be formed at a position overlapping the pad electrode ELP, i.e., the data pad electrode DLP and the gate pad electrode GLP. In other words, the data pad electrode DLP and the gate pad electrode GLP may be disposed at a position overlapping the seal 120 in a vertical direction crossing the direction DR2 and the direction DR3.

In the following description, a first direction DR1 may be, for example, a vertical direction, and the second direction DR2 and the third direction DR3 may both be oriented orthogonal to the first direction DR1, for example, a horizontal direction, with the second and third directions DR2 and DR3 crossing each other.

An area in which the seal is formed 120 may be referred to as a dummy area DA. An area bounded or enclosed by the dummy area DA may be referred to as an active area AA. The active area AA may be an area on which an image is displayed.

A width of the pad electrode ELP may be greater than a width of the electrode line EL.

Figure 7:
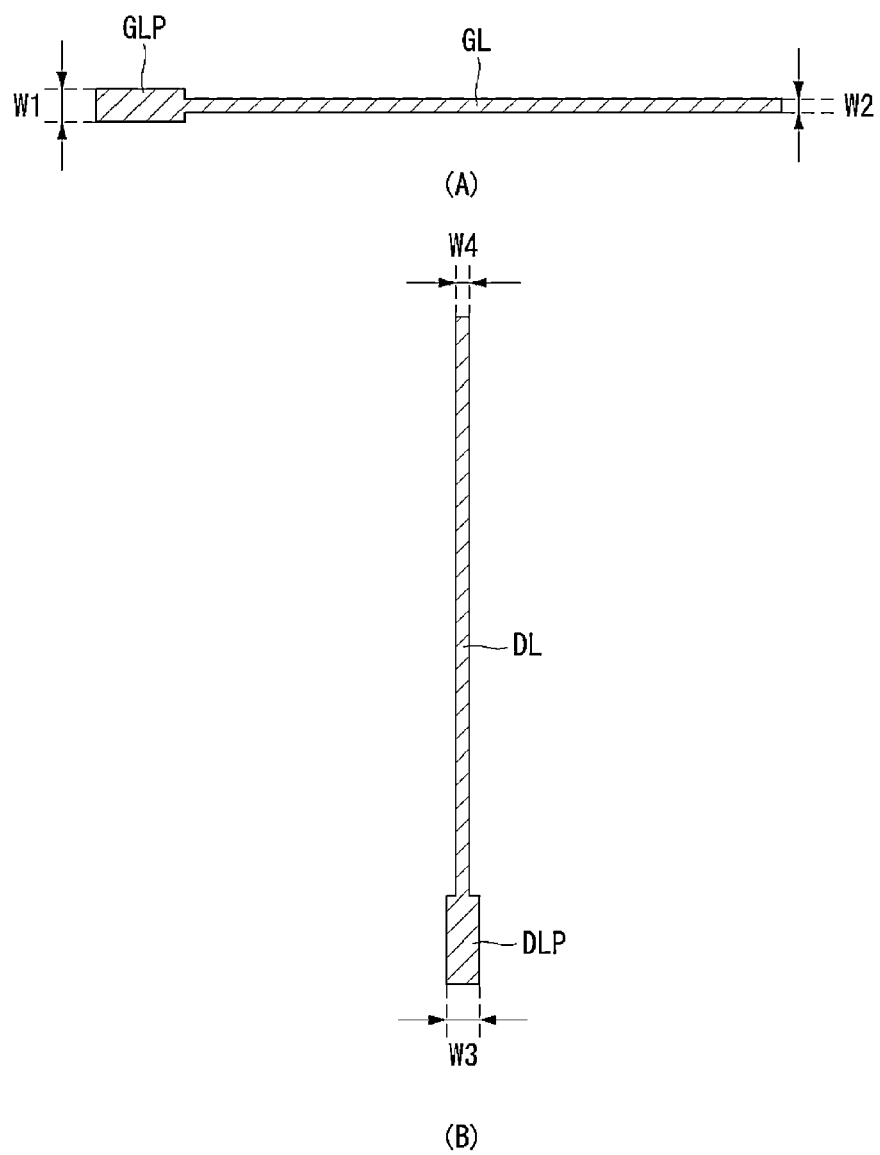

For example, as shown in FIGS. 7A and 7B, a width W1 of the gate pad electrode GLP may be greater than a width W2 of the gate line GL, and a width W3 of the data pad electrode DLP may be greater than a width W4 of the data line DL. In this instance, an electrical connection between the gate pad electrode GLP and the data pad electrode DLP and a flexible substrate may be easily established.

In the exemplary embodiment described hereinafter the width of the pad electrode ELP is assumed to be greater than the width of the electrode line EL. However, in alternative embodiments the width of the pad electrode ELP may be almost equal to the width of the electrode line EL.

An insulating layer for insulating the electrode line EL may be disposed on the first substrate 100.

Figure 8:
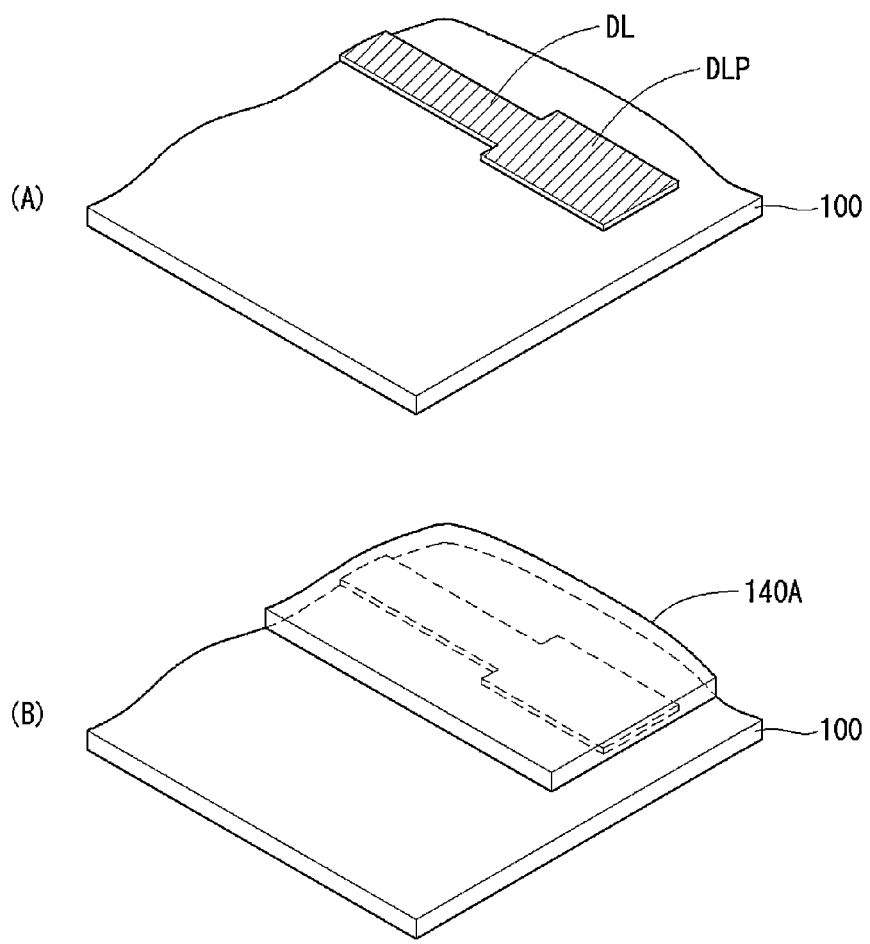

For example, as shown in FIG. 8A, the data line DL and the data pad electrode DLP may be formed on the first substrate 100. Afterwards, as shown in FIG. 8B, a first insulating layer 140A covering the data line DL and the data pad electrode DLP may be formed on the first substrate 100.

Figure 9:
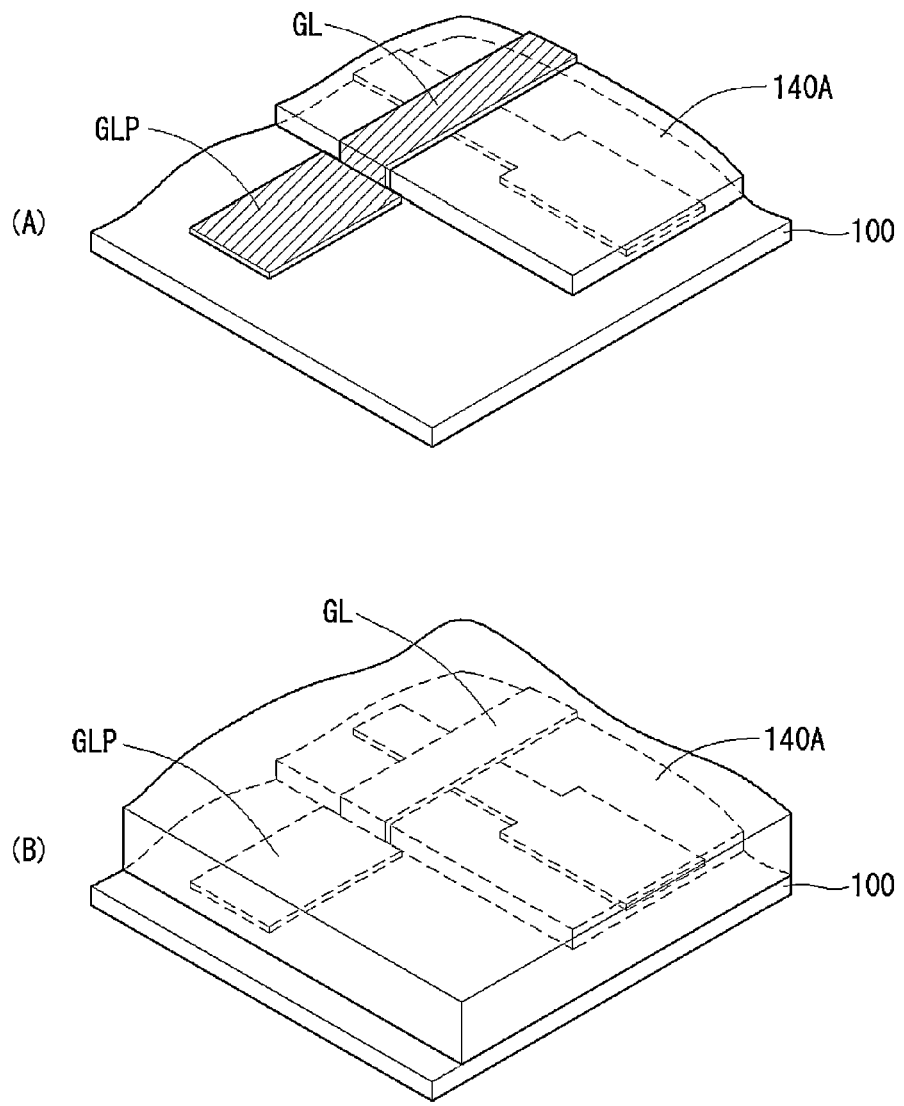

Next, as shown in FIG. 9A, the gate line GL and the gate pad electrode GLP may be formed on the first substrate 100, on which the first insulating layer 140A is formed. For example, the gate line GL may be formed on the first insulating layer 140A, and the gate pad electrode GLP may be formed on the first substrate 100. Afterwards, as shown in FIG. 9B, a second insulating layer 140B covering the first insulating layer 140A, the gate line GL, and the gate pad electrode GLP may be formed on the first substrate 100. In this instance, the insulating layer, i.e., the second insulating layer 140B may be positioned between the gate line GL and the data line DL. Hence, the gate line GL and the data line DL may be electrically insulated from each other. When the gate line GL and the gate pad electrode GLP are formed as shown in FIGS. 9A-9B, at least a portion of the gate line GL may be positioned on a layer different from the gate pad electrode GLP, or at least a portion of the gate pad electrode GLP may be positioned on a layer different from the gate line GL.

In certain embodiments, a process for forming the switching element T may be performed between a process for forming the data line DL shown in FIG. 8A and a process for forming the gate line GL shown in FIG. 9A.

In the following description, the first insulating layer 140A and the second insulating layer 140B may be commonly referred to as an insulating layer 140. A structure of the insulating layer 140 is not limited to this structure. For example, the insulating layer 140 may have a three-layered structure or a four-layered structure.

In the cutting process, a portion of the gate pad electrode GLP and a portion of the data pad electrode DLP may be cut along with the first substrate 100, the second substrate 110, and the seal 120, so that the side of the gate pad electrode GLP and the side of the data pad electrode DLP are exposed.

Figure 10:
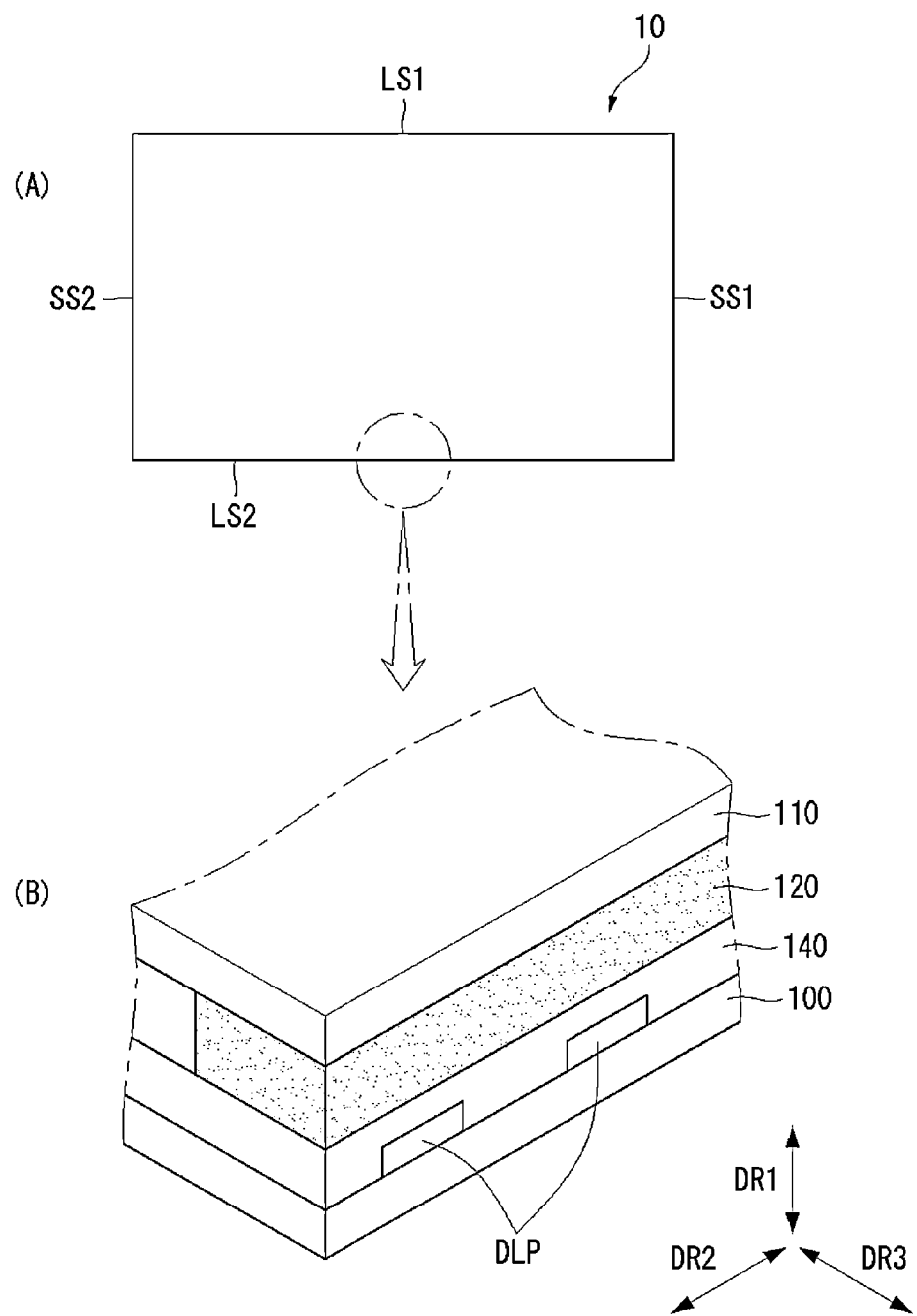

Referring again to FIG. 6, it is assumed that the data pad electrode DLP is disposed on a second long side LS2 of the first substrate 100, and the gate pad electrode GLP is disposed on a second short side SS2 of the first substrate 100. When a second long side LS2 of the display panel 10 is cut as shown in FIG. 10A, the side of the data pad electrode DLP may be exposed between the first substrate 100 and the insulating layer 140 as shown in FIG. 10B. In other words, one end of the data pad electrode DLP may be exposed between the first substrate 100 and the insulating layer 140.

Figure 11:
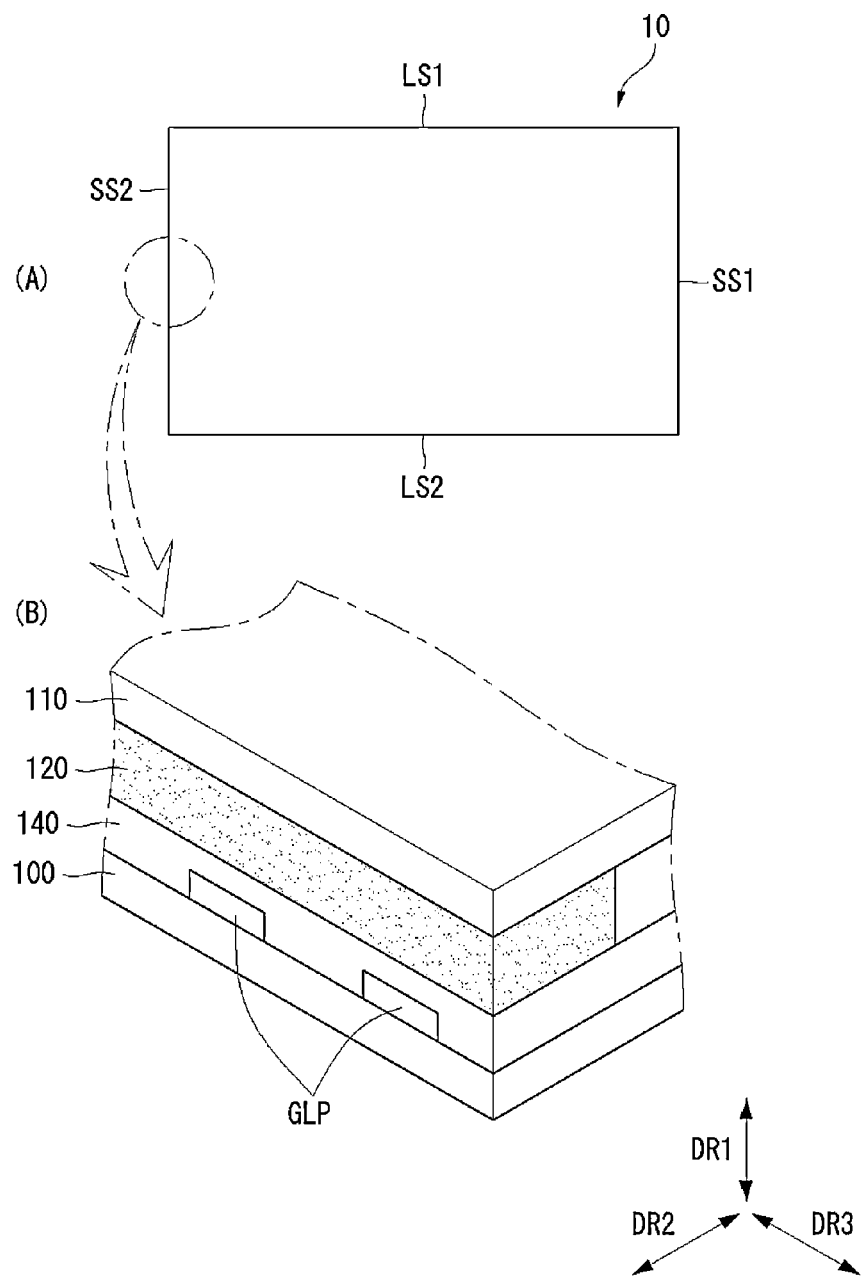

When a second short side SS2 of the display panel 10 is cut as shown in FIG. 11A, the side of the gate pad electrode GLP may be exposed between the first substrate 100 and the insulating layer 140 as shown in FIG. 11B. In other words, one end of the gate pad electrode GLP may be exposed between the first substrate 100 and the insulating layer 140.

As shown in FIGS. 9A through 10B, one end of the pad electrode ELP and the end of the seal 120 may be aligned along a straight line. In other words, one end of the pad electrode ELP may be the same as the end of the seal 120.

Figure 12:
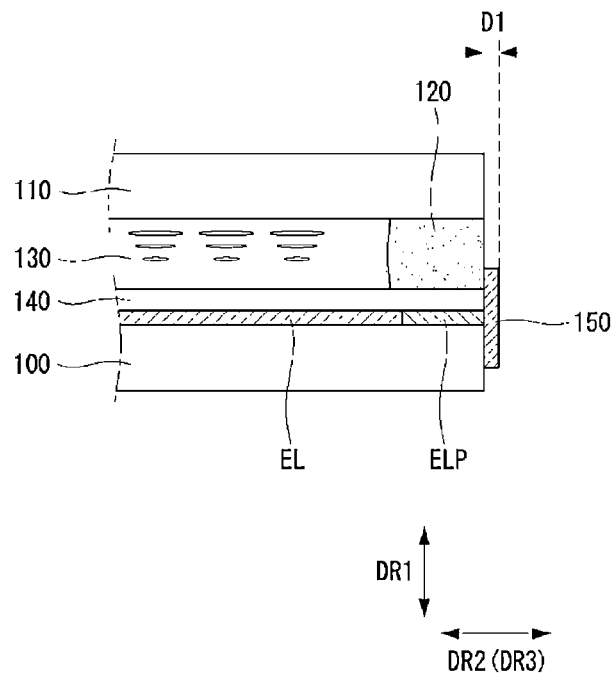

Afterwards, as shown in FIG. 12, a side electrode 150 may be formed on the side of the cut display panel 10. FIG. 12 illustrates an example in which the electrode line EL and the pad electrode ELP are formed on the same layer, simply for ease of explanation. However, the electrode line EL and the pad electrode ELP may be formed on different layers, as described above with reference to FIGS. 9A-9B.

The side electrode 150 may be connected to the exposed side (i.e., the end) of the pad electrode ELP in the cutting process. The side electrode 150 may include a portion positioned on the side of the seal 120 as well as a portion connected to the pad electrode ELP. In this instance, an electrical connection between the flexible substrate and the side electrode 150 may be easily established by increasing an area of the side electrode 150.

The side electrode 150 may include a portion positioned on the side of the first substrate 100. The side electrode 150 may include a portion which extends further than the first substrate 100, the second substrate 110, and the seal 120 by a predetermined distance D1 in the horizontal direction (i.e., the second direction DR2 or the third direction DR3). In other words the side electrode 150 may include a portion which extends further than the first substrate 100, the second substrate 110, and the seal part 120 in the horizontal direction (i.e., the second direction DR2 and/or the third direction DR3).

The side electrode 150 may have sufficiently high electrical conductivity, so as to efficiently supply a driving signal supplied through the flexible substrate to the pad electrode ELP and the electrode line EL. Because the side electrode 150 is configured so that it is connected to at least one end of the pad electrode ELP after forming the pad electrode ELP and the electrode line EL, electrical resistance may increase at a boundary between the side electrode 150 and the pad electrode ELP. The electrical conductivity of the side electrode 150 may be greater than electrical conductivity of the pad electrode ELP and the electrode line EL, so as to compensate for a loss resulting from the electrical resistance generated at the boundary between the side electrode 150 and the pad electrode ELP. In other words, the side electrode 150 may contain a material having greater electrical conductivity than that of the pad electrode ELP and the electrode line EL. For example, if the pad electrode ELP and the electrode line EL are formed of copper (Cu), the side electrode 150 may be formed of aluminum (Al), silver (Ag), or gold (Au).

When a quantity of electrical resistance at the boundary between the side electrode 150 and the pad electrode ELP is negligible, the electrical conductivity of the side electrode 150 may be almost equal to the electrical conductivity of the pad electrode ELP. In this instance, the pad electrode ELP and the electrode line EL may be formed of the same material as the side electrode 150.

The side electrode 150 may be formed using various methods. A method for forming the side electrode 150 is described in detail below.

Figure 13:
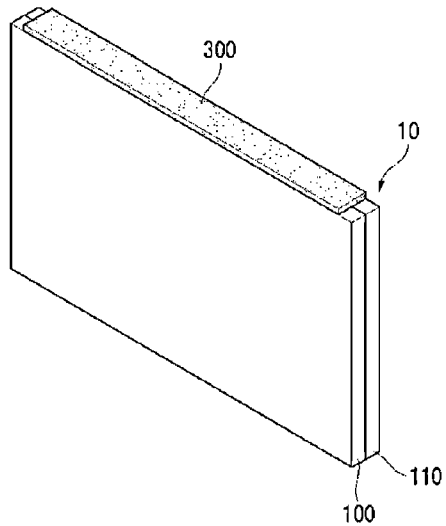

As shown in FIG. 13, an electrode material layer 300 may be formed on the side of the display panel 10. The electrode material layer 300 may contain a photosensitive material.

Figure 14:
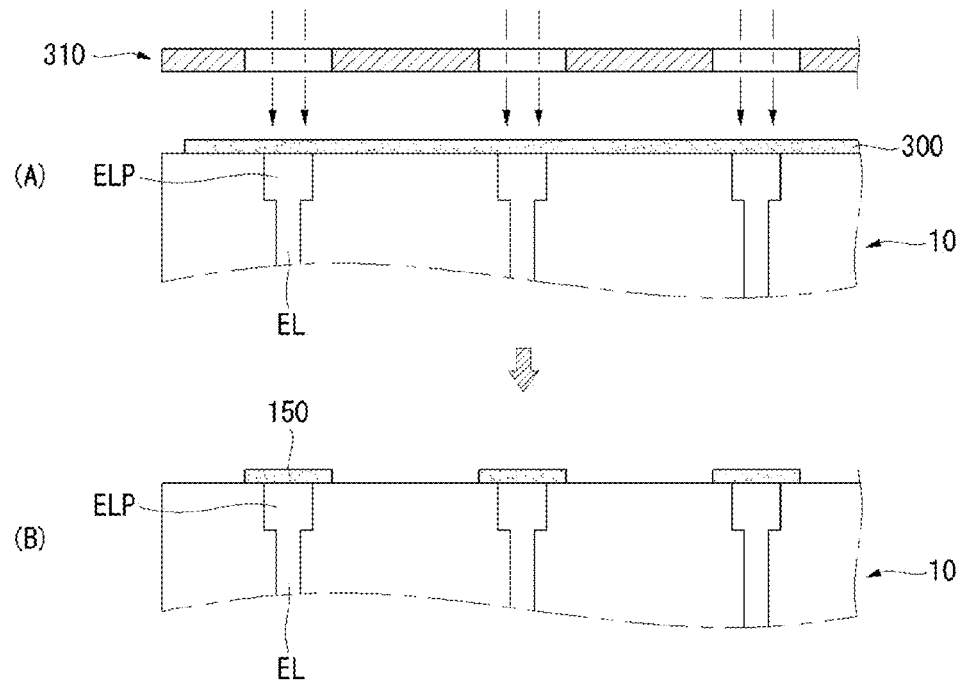

Next, as shown in FIG. 14A, a photomask 310 having a predetermined pattern may be disposed on the electrode material layer 300. Light, for example, ultraviolet rays may be irradiated onto the electrode material layer 300 through the pattern of the photomask 310. A portion of the electrode material layer 300, which is exposed to the light by the photosensitive material, may be hardened.

Figure 15:
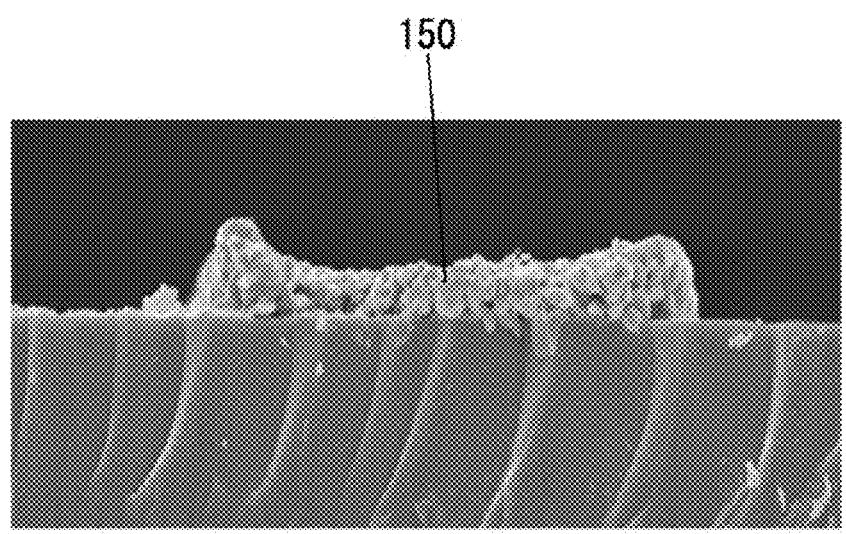

Next, an etching process or a sandblasting process may be performed to remove a non-hardened portion of the electrode material layer 300 while a hardened portion of the electrode material layer 300 may remain. Hence, as shown in FIG. 14B, the side electrode 150 may be formed on the side of the display panel 10. The side electrode 150 formed by the exemplary photo process described above may have a form shown in FIG. 15.

Alternatively, the side electrode 150 may be formed using an offset method, which will be described below. The offset method is an example of a direct patterning printing method.

Figure 16:
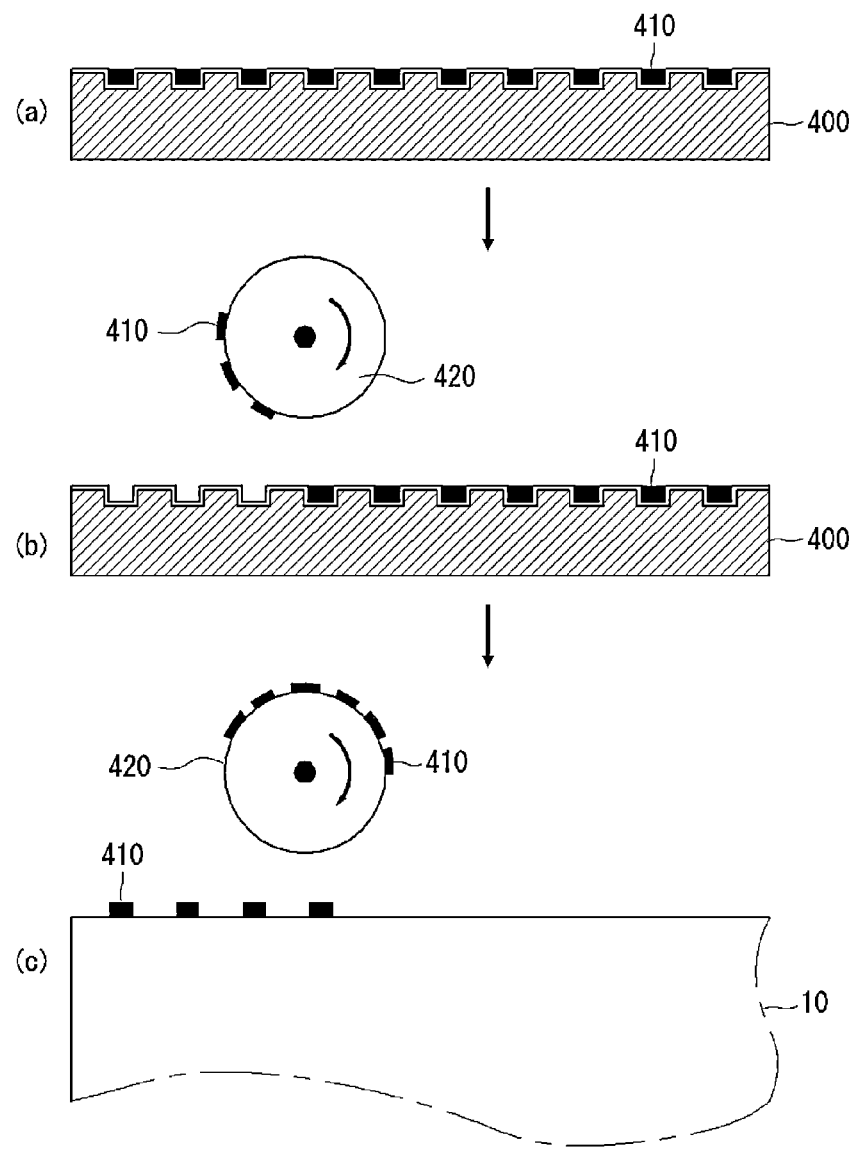

As shown in FIG. 16A, an electrode material 410 in a paste state or a slurry state may be applied to the surface of a mold 400.

Afterwards, as shown in FIG. 16B, a blanket 420 may move on the surface of the mold 400 to which the electrode material 410 has been applied. Hence, the surface of the blanket 420 may be smeared with the electrode material 410.

In certain embodiments, the blanket 420 may have the form of a roller, so that the surface of the blanket 420 may be more efficiently smeared with the electrode material 410. When the blanket 420 has the form of the roller as described above, the surface of the blanket 420 may be smeared with the electrode material 410 while the blanket 420 rotates on the surface of the mold 400.

Afterwards, as shown in FIG. 16C, the blanket 420 smeared with the electrode material 410 may move on the side of the cut display panel 10, and thus the electrode material 410 on the surface of the blanket 420 may be printed on the side of the cut display panel 10.

Afterwards, a firing process or a drying process may be performed to complete fabrication of the side electrode 150 on the side of the display panel 10.

Figure 17:
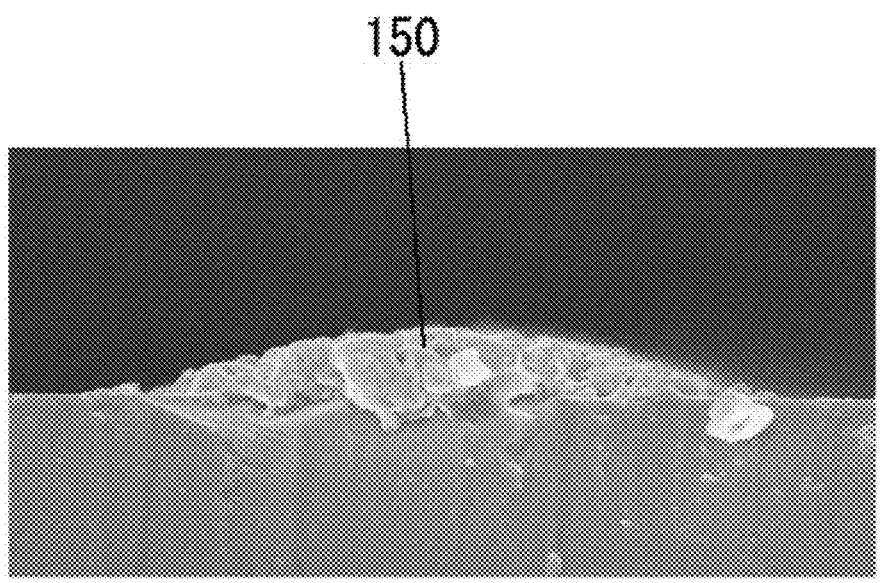

An example of the side electrode 150 formed in this manner is shown in FIG. 17.

Alternatively, the side electrode 150 may be formed using a plating method. Examples of such a plating method may include an electroplating method and an electroless plating method. A method for forming the side electrode 150 using the electroplating method is described below.

Figure 18:
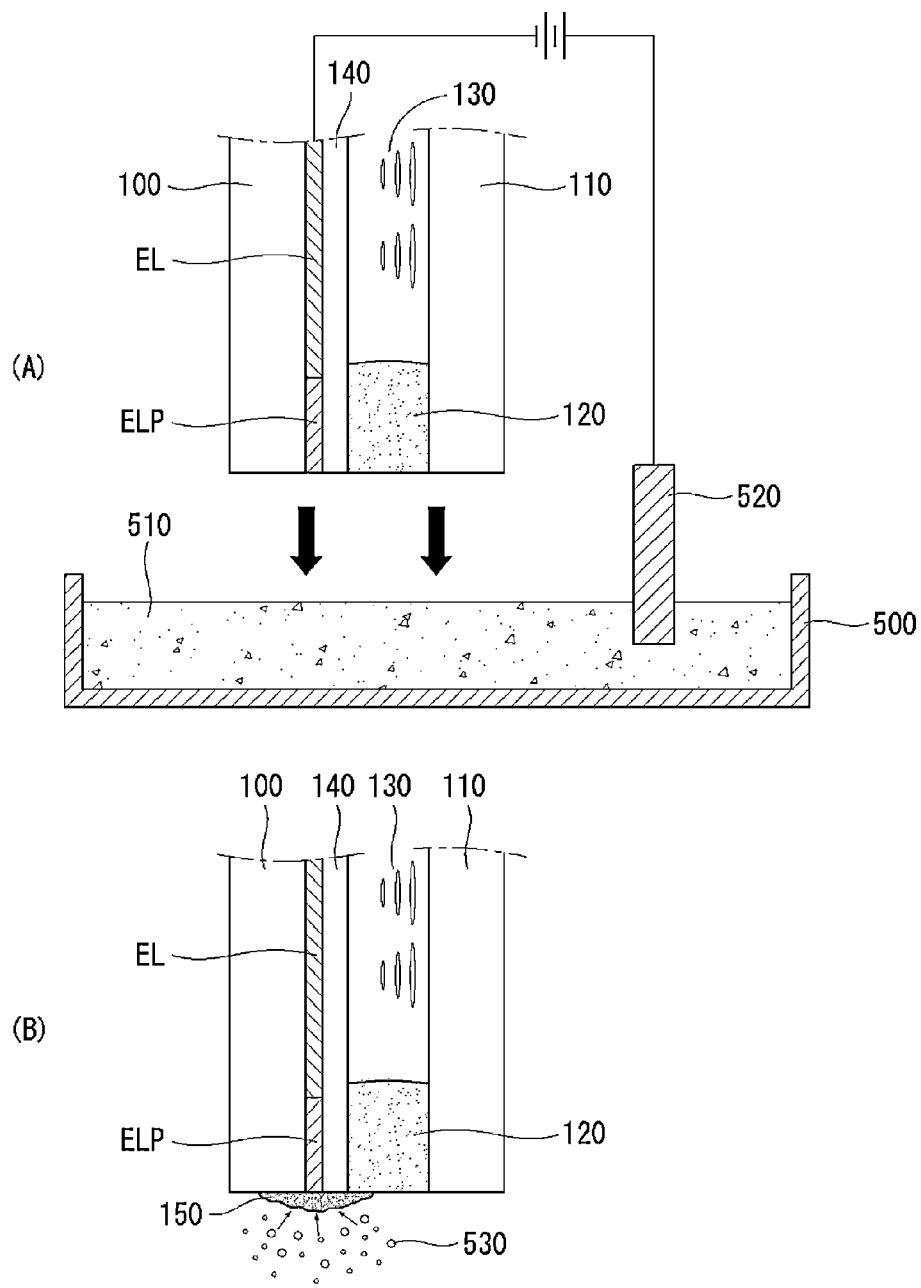

As shown in FIG. 18A, the display panel 10, of which the edge is cut so as to expose the pad electrode ELP, may be dipped in an electrolyte solution 510. A metal electrode 520 may also be dipped in the electrolyte solution 510.

As shown in FIG. 18B, when a predetermined voltage is applied to the electrode line EL or the pad electrode ELP and the metal electrode 520 in this state, a metal component 530 included in the electrolyte solution 510 may be deposited on the exposed side of the pad electrode ELP to form the side electrode 150.

For example, when a positive voltage is applied to the metal electrode 520 and a negative voltage is applied to the electrode line EL or the pad electrode ELP, the metal component 530 included in the electrolyte solution 510 may be gathered and deposited on the exposed side of the pad electrode ELP.

Figure 19:
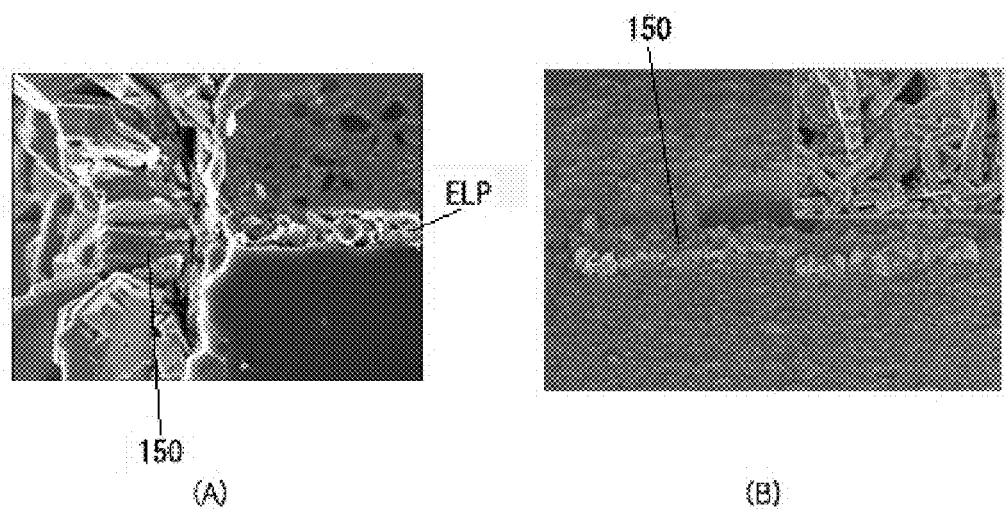

An example of a side electrode 150 formed in this manner is shown in FIGS. 19A and 19B.

The metal component 530 may contain a material having excellent electrical conductivity, for example, silver (Ag). In this instance, the side electrode 150 may be formed of silver (Ag).

The size of each particle of the metal component 530 may be several nanometers that the metal component 530 may be effectively deposited. The electrolyte solution 510 may be, for example, an Ag-acetate aqueous solution, and a concentration of the electrolyte solution 510 may be greater than or equal to about 0.1 wt %.

Alternatively, a predetermined container 500 may be filled with the electrolyte solution 510, and a predetermined voltage may be applied to the container 500. In this instance, the metal electrode 520 may be omitted.

Next, a method for forming the side electrode 150 using an electroless plating method is described below.

As shown in FIG. 20A, the display panel 10, of which the edge is cut so as to expose the pad electrode ELP, may be dipped in a H2SO4 aqueous solution. Hence, an oxide layer formed on the exposed surface of the pad electrode ELP may be removed.

If the pad electrode ELP is formed of a material which is not easily oxidized, a process step shown in FIG. 20A may be omitted.

If the pad electrode ELP is formed of a material, for example, copper (Cu) which is easily oxidized, copper (Cu) may be oxidized on the exposed side of the pad electrode ELP to form a copper oxide layer. Thus, as shown in FIG. 20A, a process for removing the copper oxide layer formed on the exposed side of the pad electrode ELP may be performed.

Afterwards, as shown in FIG. 20A, the side of the pad electrode ELP may be dipped in a palladium (Pd) aqueous solution for forming a seed in a state where the oxide layer is removed from the side of the pad electrode ELP.

Hence, palladium (Pd) contained in the palladium (Pd) aqueous solution may be adhered to the side of the pad electrode ELP to form seeds 540 as shown in FIG. 20C. In this instance, the seed 540 may be formed of palladium (Pd).

In the example shown in FIGS. 20A-20C, the seeds 540 are formed using palladium (Pd). However, other metal materials may be used for the seeds 540.

Afterwards, as shown in FIG. 21A, the side of the pad electrode ELP having the seeds 540 formed thereon may be dipped in an electrolyte solution 550. The electrolyte solution 550 may contain a metal material for forming the side electrode 150. For example, the electrolyte solution 550 may be an Ag-acetate aqueous solution.

As described above, when the side of the pad electrode ELP with the seeds 540 formed thereon is dipped in the electrolyte solution 550, the metal material contained in the electrolyte solution 550 may be gathered at the seeds 540 and the side of the pad electrode ELP and thus may be grown as the side electrode 150 as shown in FIG. 21B.

The seeds 540 may be used to reduce time required in the process for forming the side electrode 150 by improving a growth rate of the side electrode 150.

As shown in FIG. 21B, the seeds 540 may be positioned between the side of the pad electrode ELP and the side electrode 150.

For example, the seeds 540 may be formed of palladium (Pd), the side electrode 150 may be formed of silver (Ag), and the pad electrode ELP may be formed of copper (Cu). In this instance, the seeds 540 containing a material different from the pad electrode ELP and/or the side electrode 150 may be formed between the pad electrode ELP and the side electrode 150.

The structure and the shape of the side electrode 150 formed in this manner may be similar to that shown in FIGS. 19A and 19B.

Figure 22:
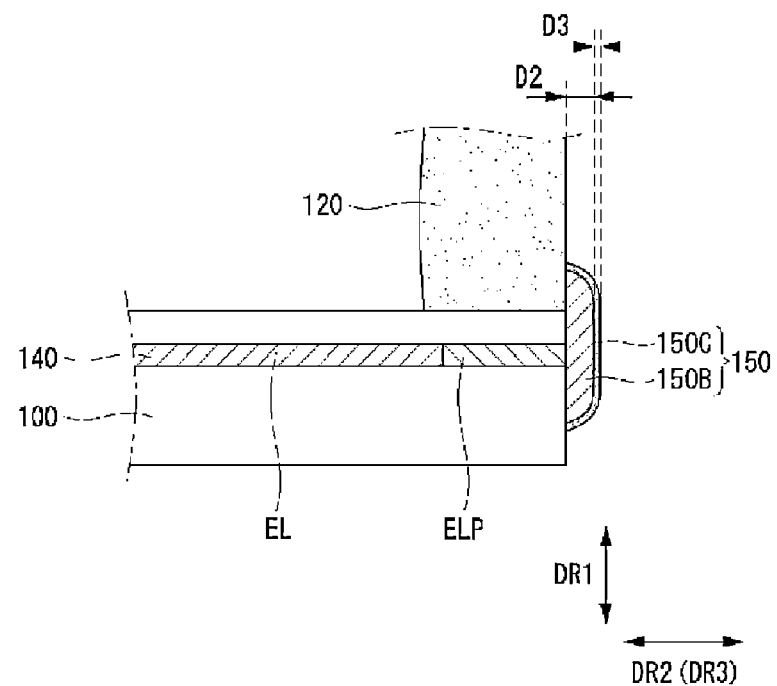

As shown in FIG. 22, a protective electrode 150C may be formed on the surface of the pad electrode ELP. More specifically, the side electrode 150 may include a base electrode 150B and the protective electrode 150C coated on the surface of the base electrode 150B.

The base electrode 150B may be positioned at one end of the pad electrode ELP. Namely, the base electrode 150B may be connected to one end of the pad electrode ELP. A thickness D3 of the protective electrode 150C may be less than a thickness D2 of the base electrode 150B in the horizontal direction (i.e., the second direction DR2 or the third direction DR3). The protective electrode 150C may contain a material which is less easily oxidized than the material of the pad electrode ELP and/or the base electrode 150B. Namely, the protective electrode 150C may prevent the oxidization of the base electrode 150B. For example, the protective electrode 150C may contain nickel (Ni) or gold (Au).

The protective electrode 150C may be formed using a plating method such as that described above.

Figure 20:
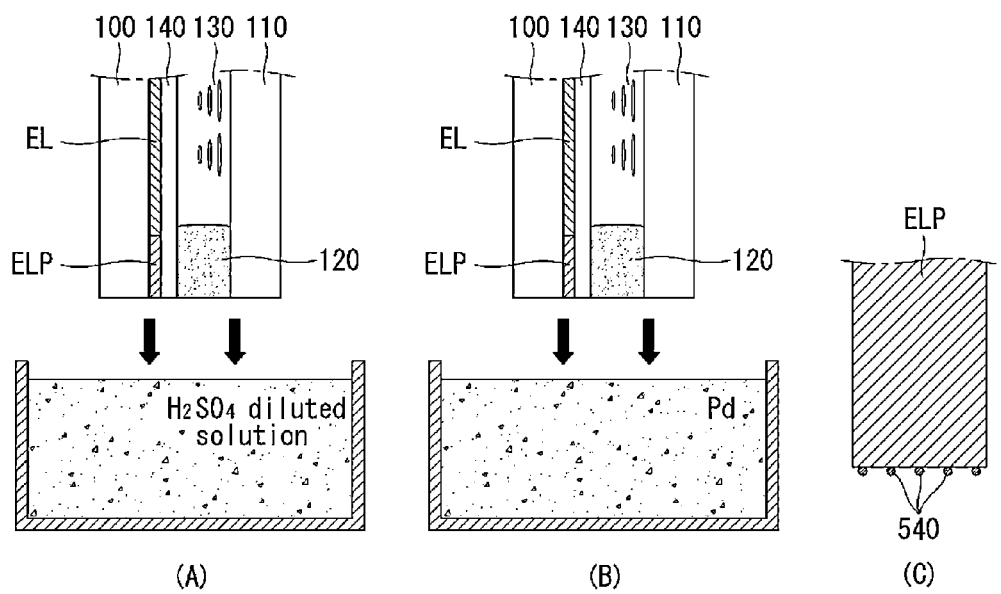
Figure 21:
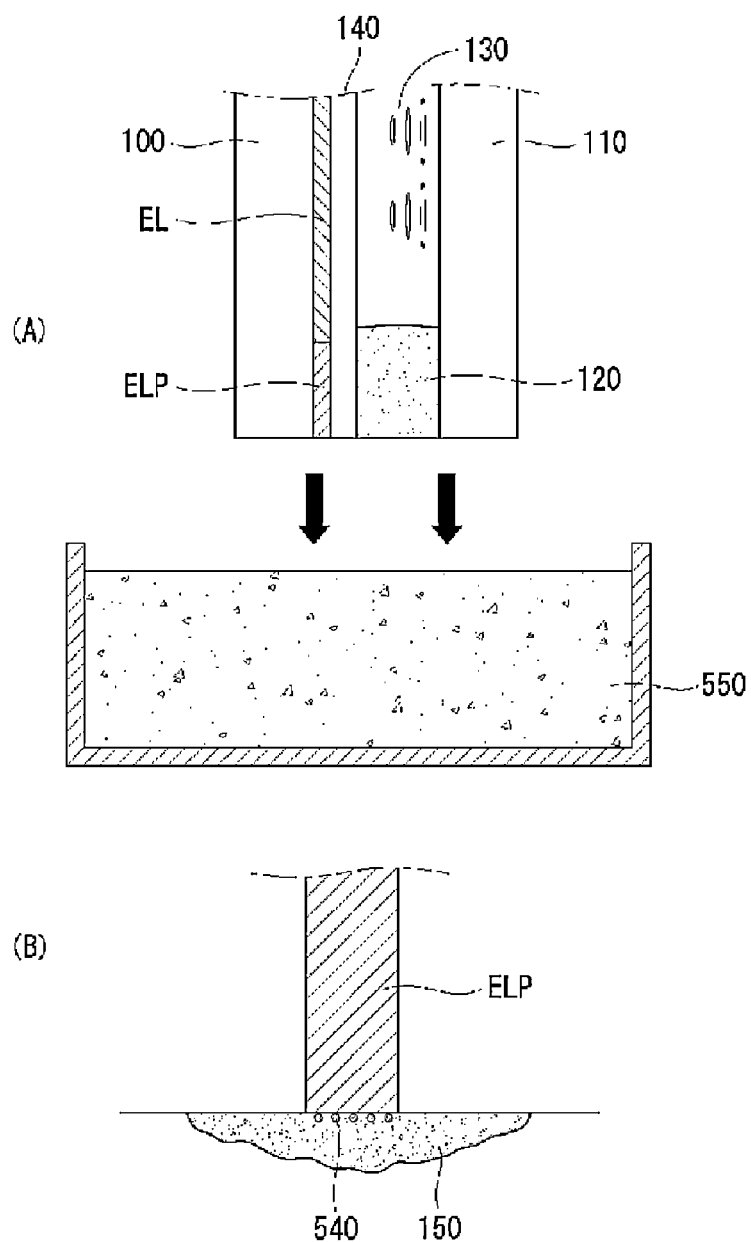

For example, after the base electrode 150B is formed on the side of the pad electrode ELP using the method shown in FIGS. 20 and 21, the protective electrode 150C may be formed on the surface of the base electrode 150B using the method shown in FIGS. 20A through 21B.

Figure 23:
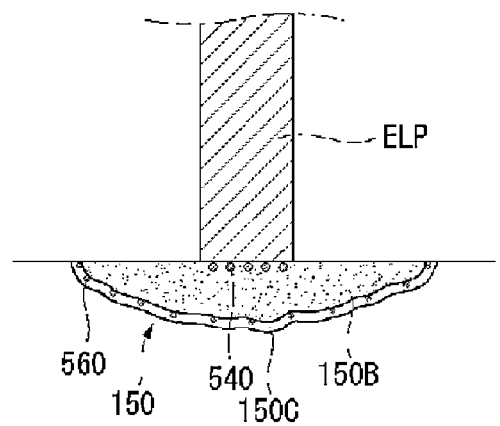

In this instance, as shown in FIG. 23, other seeds 560 may be formed between the base electrode 150B and the protective electrode 150C. The seeds 560 formed between the base electrode 150B and the protective electrode 150C may be formed of the same material as the seeds 540 formed between the pad electrode ELP and the base electrode 150B.

An area of the side electrode 150 may sufficiently increase so as to efficiently provide for the electrical connection between the side electrode 150 and the flexible substrate.

Figure 24:
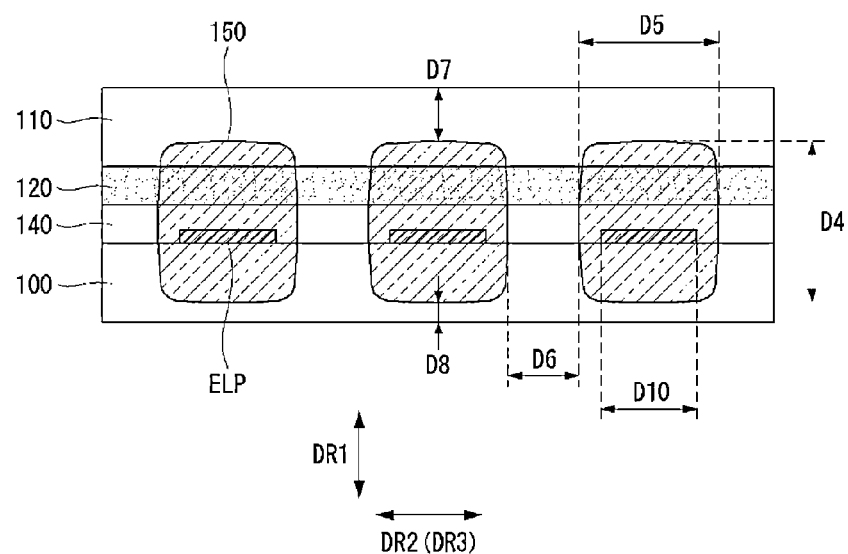

In certain embodiments, as shown in FIG. 24, the side electrode 150 may include a portion positioned on the side of the first substrate 100 and a portion positioned on the side of the second substrate 110. Simply for ease of explanation, in the following examples, the first direction DR1 will be considered the vertical direction, and the second and third directions DR2 and DR3 will be considered perpendicular horizontal directions. However, it is understood that directions may be adjusted as necessary for a particular orientation of the display panel 10.

In this instance, a width D4 of the side electrode 150 in the vertical direction (i.e., the first direction DR1) may be greater than a width D10 of the pad electrode ELP in the horizontal direction (i.e., the second direction DR2 or the third direction DR3). Further, the width D4 of the side electrode 150 in the vertical direction (i.e., the first direction DR1) may be greater than a width D5 of the side electrode 150 in the horizontal direction (i.e., the second direction DR2 or the third direction DR3). Further, the width D4 of the side electrode 150 in the vertical direction (i.e., the first direction DR1) may be greater than a distance D6 between the adjacent side electrodes 150. A distance D8 between the side electrode 150 and the end of the first substrate 100 in the vertical direction (i.e., the first direction DR1) may be less than the distance D6 between the adjacent side electrodes 150. Further, a distance D7 between the side electrode 150 and the end of the second substrate 110 in the vertical direction (i.e., the first direction DR1) may be less than the distance D6 between the adjacent side electrodes 150.

When the pad electrode ELP is formed on the first substrate 100, the distance D8 between the side electrode 150 and the end of the first substrate 100 in the vertical direction (i.e., the first direction DR1) may be less than the distance D7 between the side electrode 150 and the end of the second substrate 110 in the vertical direction (i.e., the first direction DR1).

Figure 25:
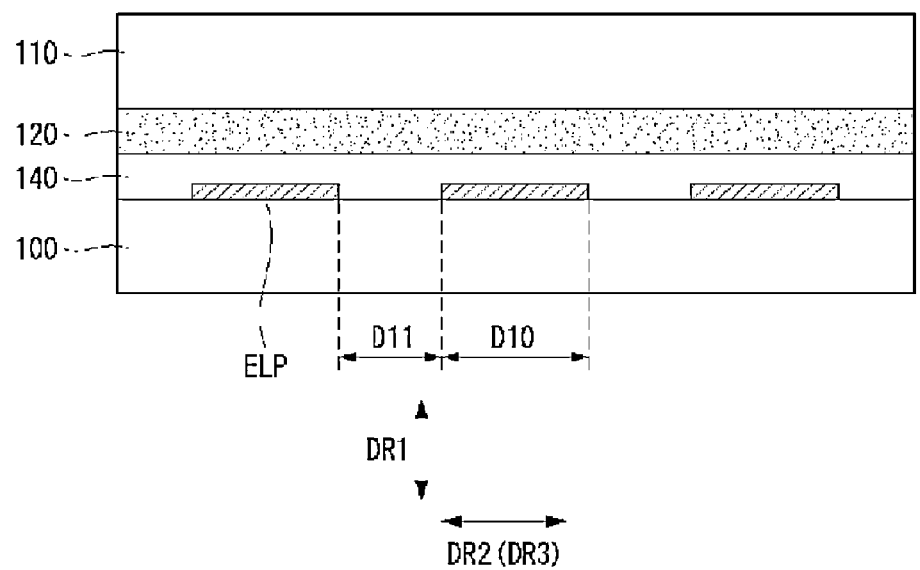

A cross-sectional area of the pad electrode ELP may sufficiently increase so as to sufficiently reduce an electrical resistance at a boundary between the pad electrode ELP and the side electrode 150. For example, as shown in FIG. 25, a width D10 of the pad electrode ELP in the horizontal direction (i.e., the second direction DR2 or the third direction DR3) may be greater than a distance D11 between the adjacent pad electrodes ELP.

The side electrode 150 may include a gate side electrode 150G connected to one end of the gate pad electrode GLP and a data side electrode 150D connected to one end of the data pad electrode DLP.

Figure 26:
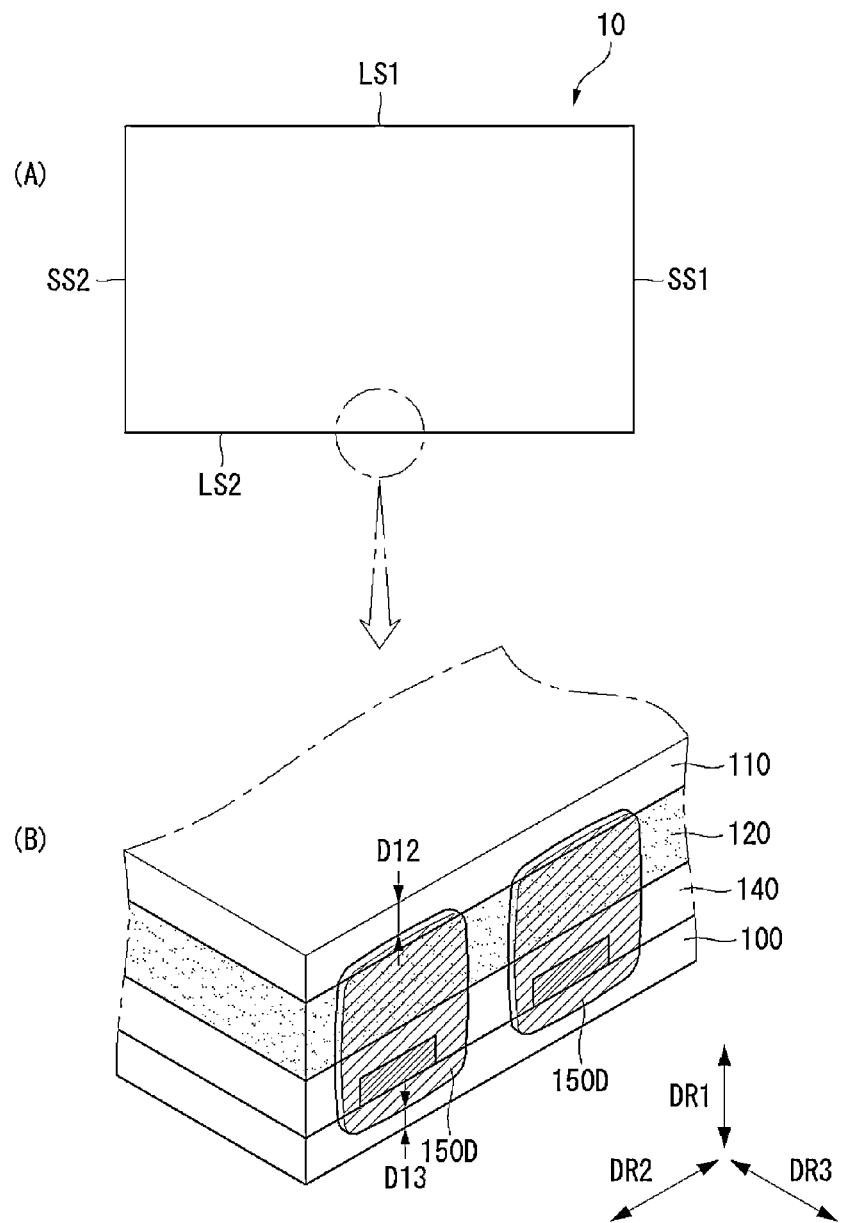

For example, as shown in FIGS. 26A and 26B, the data side electrode 150D may be disposed on the side of the display panel 10 in the area around the second long side LS2 of the display panel 10. The data side electrode 150D may be connected to the data pad electrode DLP.

Because the data pad electrode DLP is formed on the first substrate 100, a distance D13 between the data side electrode 150D and the end of the first substrate 100 in the vertical direction (i.e., the first direction DR1) may be less than a distance D12 between the data side electrode 150D and the end of the second substrate 110 in the vertical direction (i.e., the first direction DR1).

Alternatively, the distance D13 between the data side electrode 150D and the end of the first substrate 100 in the vertical direction (i.e., the first direction DR1) may be almost equal to the distance D12 between the data side electrode 150D and the end of the second substrate 110 in the vertical direction (i.e., the first direction DR1) depending on the manufacturing method.

Figure 27:
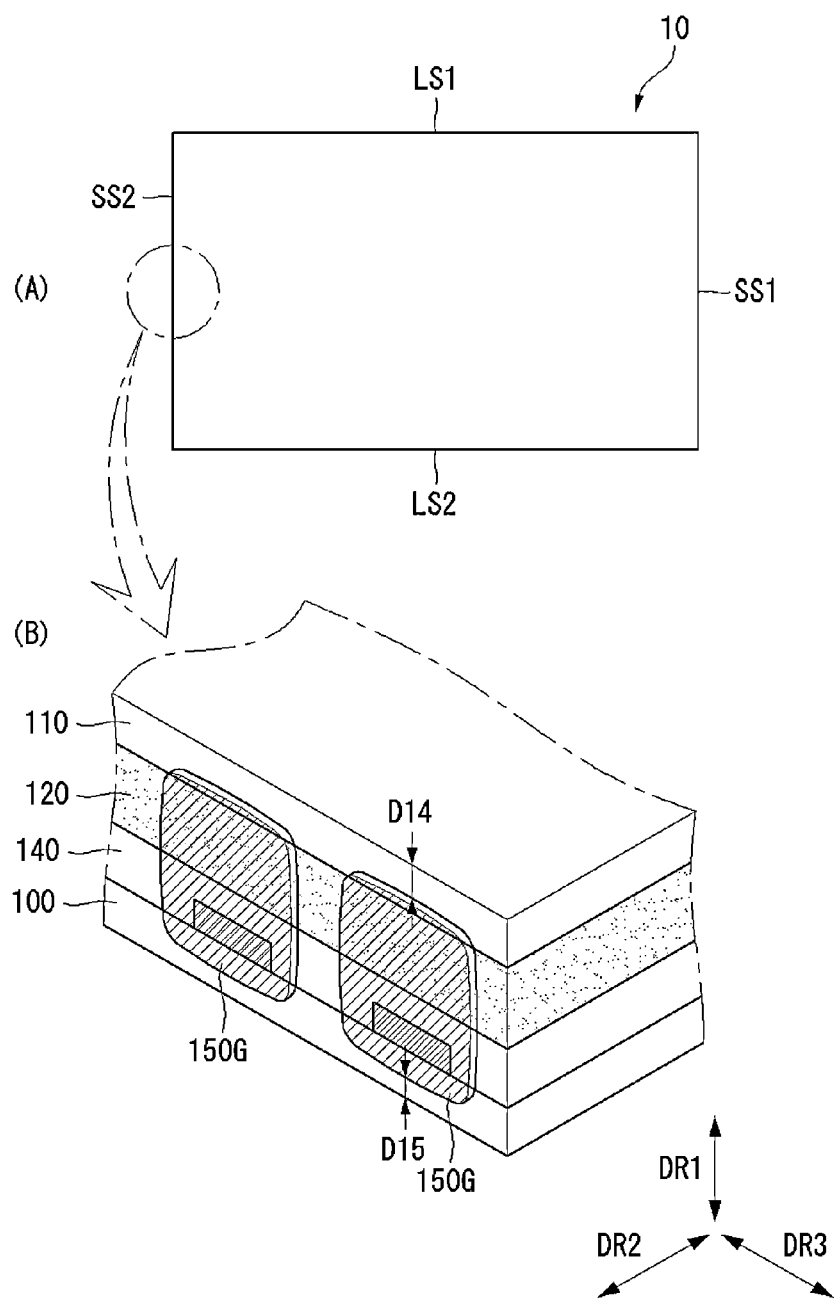

As shown in FIGS. 27A and 27B, the gate side electrode 150G may be disposed on the side of the display panel 10 in the area around the second short side SS2 of the display panel 10. The gate side electrode 150G may be connected to the gate pad electrode GLP. Because the gate pad electrode GLP is formed on the first substrate 100, a distance D15 between the gate side electrode 150G and the end of the first substrate 100 in the vertical direction (i.e., the first direction DR1) may be less than a distance D14 between the gate side electrode 150G and the end of the second substrate 110 in the vertical direction (i.e., the first direction DR1).

Alternatively, the distance D15 between the gate side electrode 150G and the end of the first substrate 100 in the vertical direction (i.e., the first direction DR1) may be almost equal to the distance D14 between the gate side electrode 150G and the end of the second substrate 110 in the vertical direction (i.e., the first direction DR1) depending on the manufacturing method.

Figure 28:
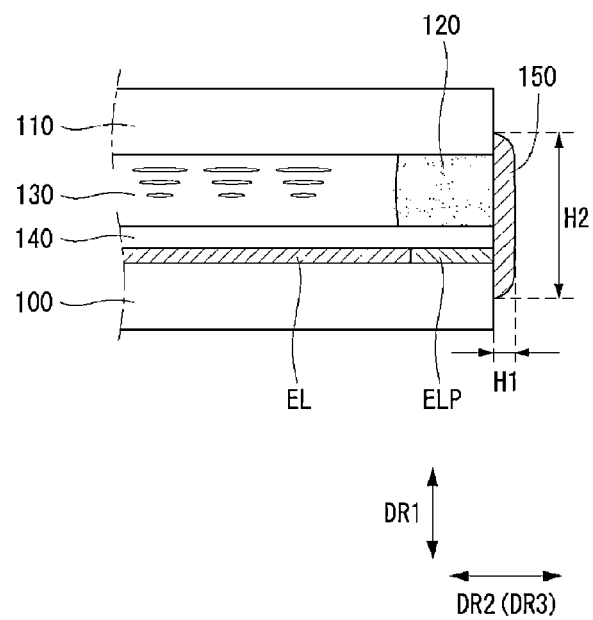

As shown in FIG. 28, a width H2 of the side electrode 150 in the vertical direction DR1 may be greater than a width H1 of the side electrode 150 in the horizontal direction DR2 or DR3, so as to increase a contact area between the side electrode 150 and the flexible substrate.

Figure 29:
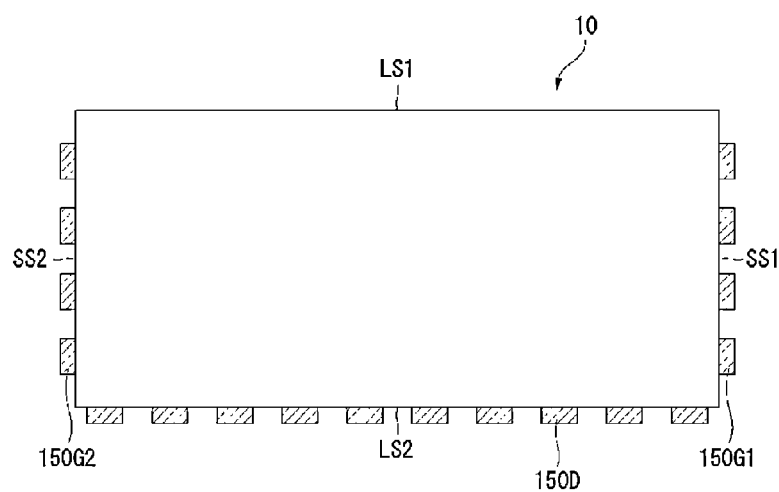

As shown in FIG. 29, the data side electrode 150D may be disposed on the second long side LS2 of the display panel 10, a first gate side electrode 150G1 of the gate side electrode 150G may be disposed on the first short side SS1 of the display panel 10, and a second gate side electrode 150G2 of the gate side electrode 150G may be disposed on the second short side SS2 of the display panel 10.

Figure 30:
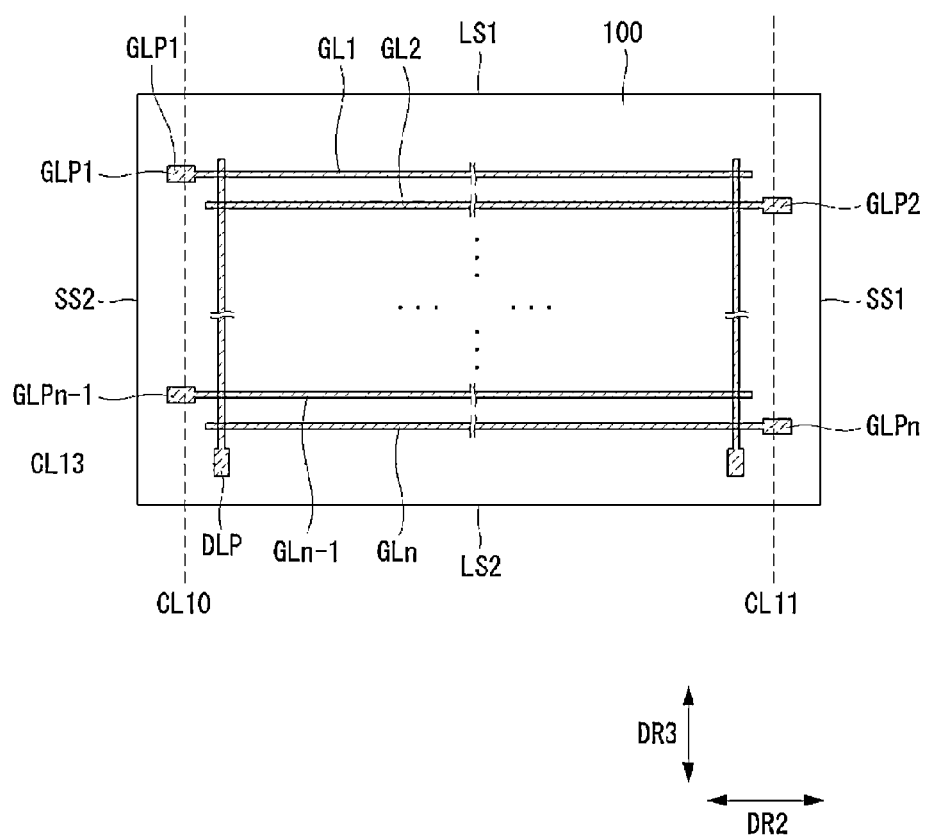

In this instance, the gate pad electrodes GLP may be respectively formed on the first short side SS1 and the second short side SS2 of the first substrate 100. For example, as shown in FIG. 30, odd-numbered gate pad electrodes GLP (for example, first, third, . . . , and (n−1)th gate pad electrodes GLP1, GLP3, . . . , and GLPn−1) of the plurality of gate pad electrodes GLP may be positioned on the second short side SS2 of the first substrate 100, where 'n' is an even natural number. Further, even-numbered gate pad electrodes GLP (for example, second, fourth, . . . , and nth gate pad electrodes GLP2, GLP4, . . . , and GLPn) of the plurality of gate pad electrodes GLP may be positioned on the first short side SS1 of the first substrate 100, where 'n' is an even natural number.

The first short side SS1 of the first substrate 100 may be cut along an eleventh cutting line CL11 and the second short side SS2 of the first substrate 100 may be cut along a tenth cutting line CL10, so as to expose one end of the gate pad electrode GLP to each of the first and second short sides SS1 and SS2 of the display panel 10.

As described above, when the gate pad electrodes GLP are respectively disposed on the first and second short sides SS1 and SS2 of the first substrate 100, a cross-sectional area of each gate pad electrode GLP may sufficiently increase.

Figure 31:
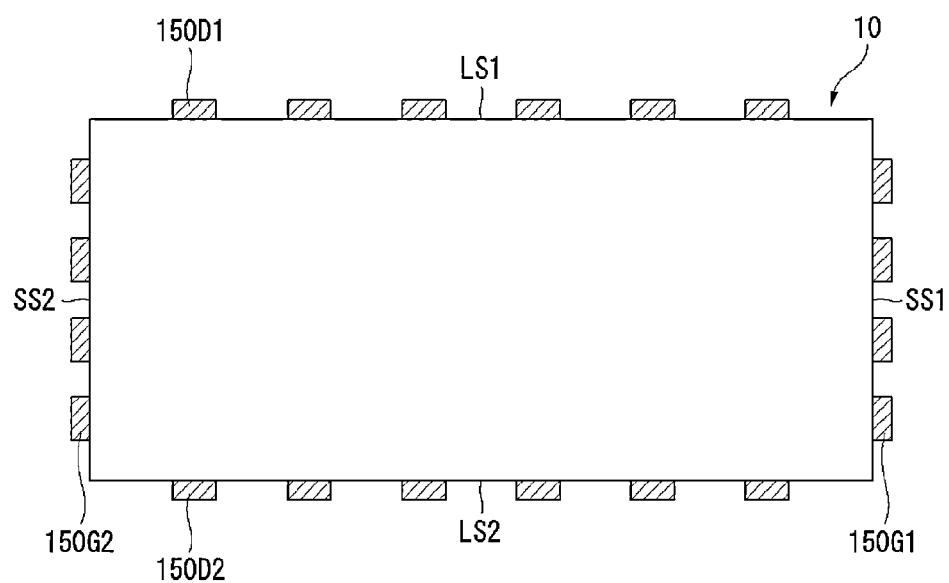

As shown in FIG. 31, a first data side electrode 150D1 of the data side electrode 150D may be disposed on the first long side LS1 of the display panel 10, a second data side electrode 150D2 of the data side electrode 150D may be disposed on the second long side LS2 of the display panel 10, the first gate side electrode 150G1 of the gate side electrode 150G may be disposed on the first short side SS1 of the display panel 10, and the second gate side electrode 150G2 of the gate side electrode 150G may be disposed on the second short side SS2 of the display panel 10.

Figure 32:
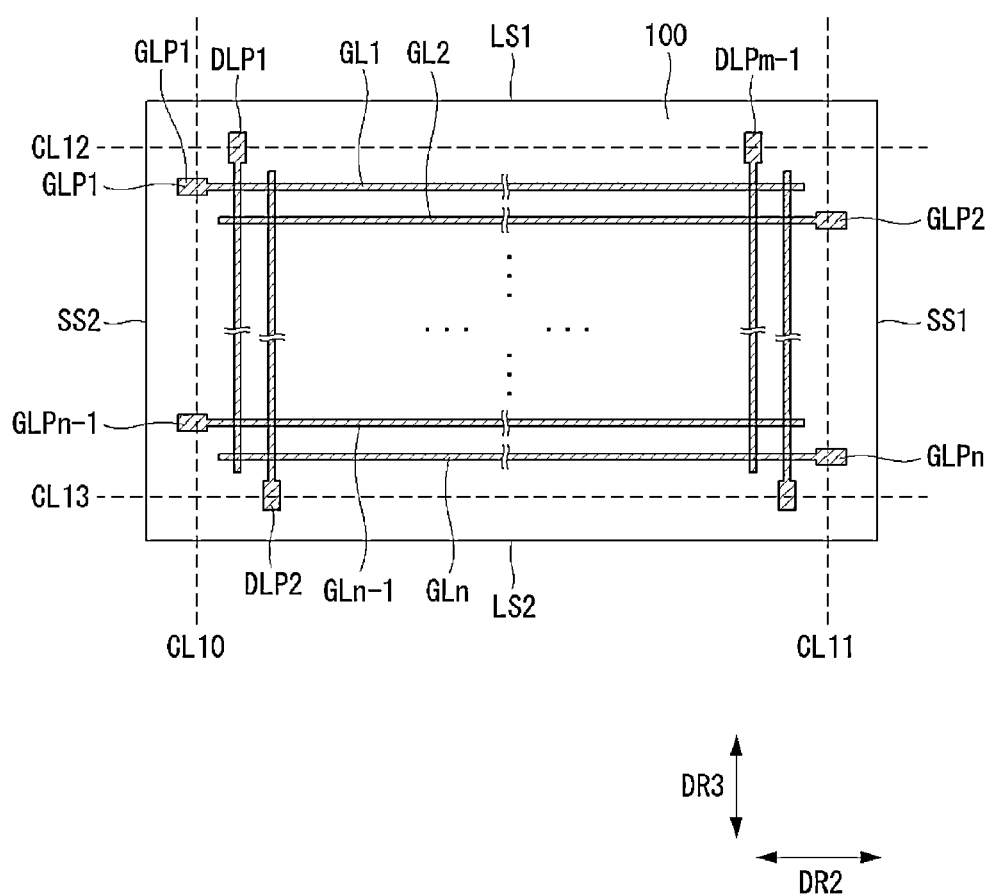

In this instance, the gate pad electrodes GLP may be respectively disposed on the first and second short sides SS1 and SS2 of the first substrate 100, and the data pad electrodes DLP may be respectively disposed on the first and second long sides LS1 and LS2 of the first substrate 100. For example, as shown in FIG. 32, odd-numbered data pad electrodes DLP (for example, first, third, . . . , and (n−1)th data pad electrodes DLP1, DLP3, . . . , and DLPn−1) of the plurality of data pad electrodes DLP may be positioned on the first long side LS1 of the first substrate 100. Further, even-numbered data pad electrodes DLP (for example, second, fourth, . . . , and nth data pad electrodes DLP2, DLP4, . . . , and DLPn) of the plurality of data pad electrodes DLP may be positioned on the second long side LS2 of the first substrate 100.

The first long side LS1 of the first substrate 100 may be cut along a twelfth cutting line CL12 and the second long side LS2 of the first substrate 100 may be cut along a thirteenth cutting line CL13, so as to expose one end of the data pad electrode DLP to each of the first and second long sides LS1 and LS2 of the display panel 10.

As described above, when the data pad electrodes DLP are respectively disposed on the first and second long sides LS1 and LS2 of the first substrate 100, a cross-sectional area of each data pad electrode DLP may sufficiently increase.

FIGS. 33 to 62 illustrate a portion of a display device in which a flexible substrate is connected to the side of a display panel. In the following description, descriptions of the structure described above are omitted.

Figure 33:
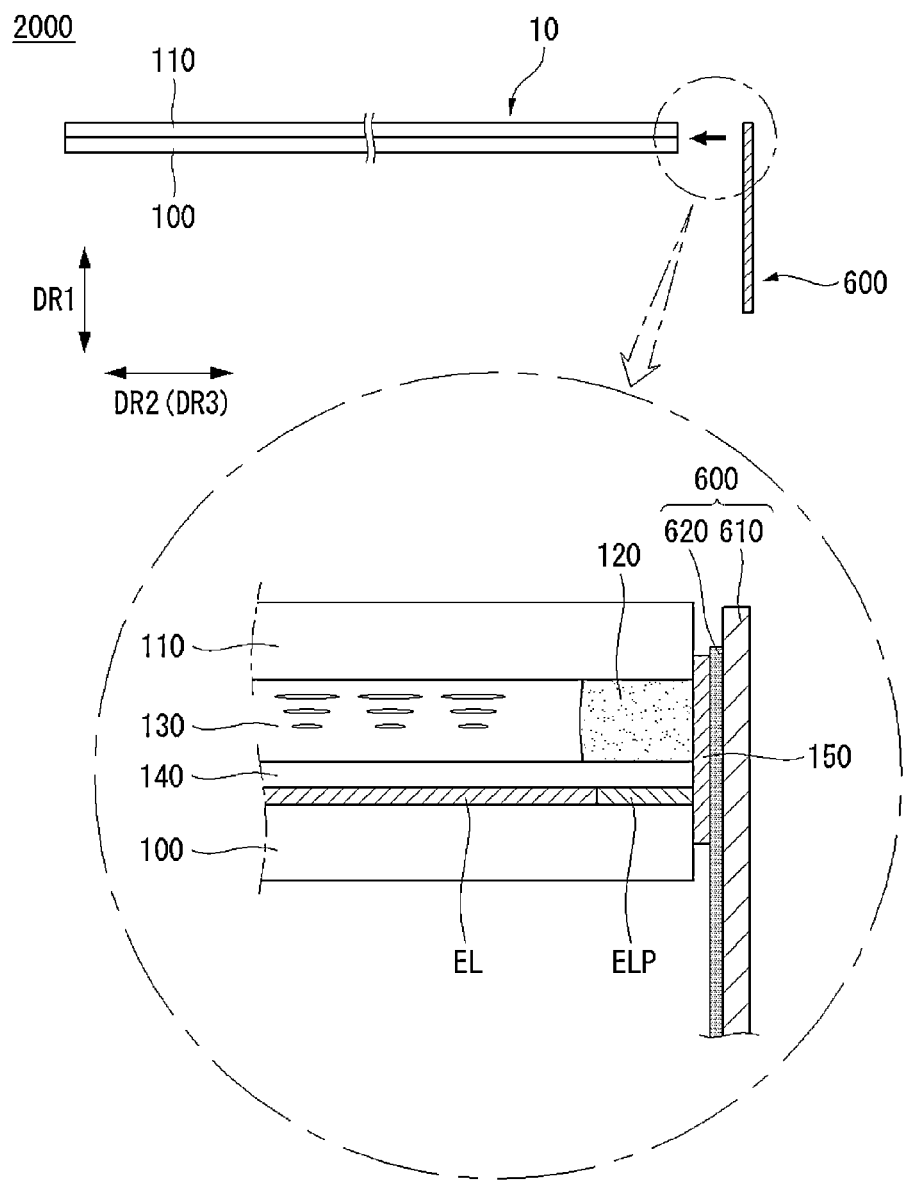
FIGS. 33 to 62 illustrate a flexible substrate connected to a side of a display panel, in accordance with embodiments as broadly described herein.
Figure 34:
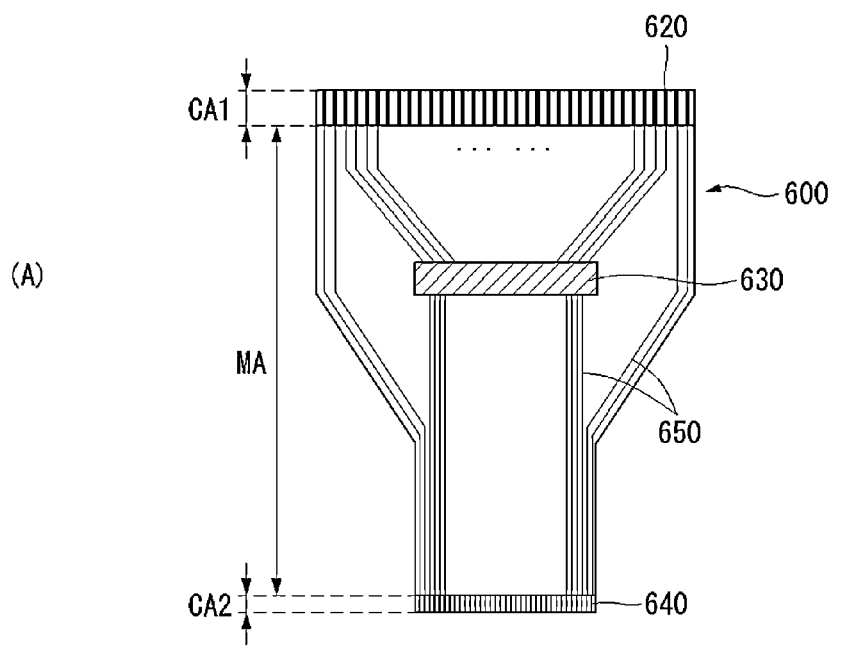
Figure 34:
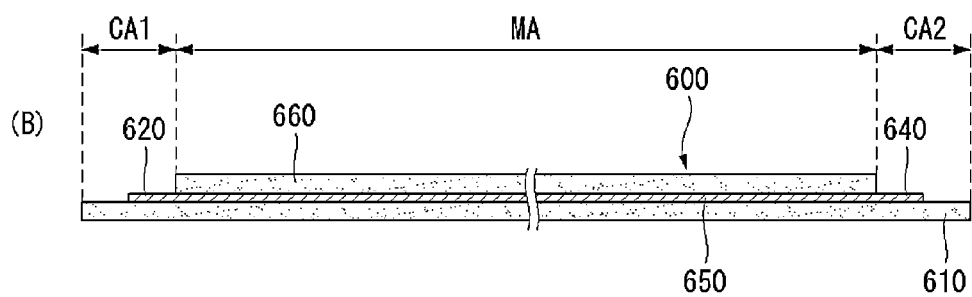

As shown in FIG. 33, a display device 2000 according to an embodiment as broadly described herein may include a display panel 10 and a flexible substrate 600 attached to the side of the display panel 10. Further detailed description of the display panel 10 may be briefly made or may be entirely omitted. Examples of the flexible substrate 600 may include a flexible circuit board for a tape carrier package (TCP), a flexible printed circuit (FPC) board, or a chip-on film (COF).

In certain embodiments, the flexible substrate 600 may electrically connect a driver supplying a driving signal to pad electrodes ELP. For this, the flexible substrate 600 may be electrically connected to a side electrode 150 formed on the side of the display panel 10. For this, the flexible substrate 600 may include a connection electrode 620.

As shown in FIG. 34A, the flexible substrate 600 may be divided into a first connection area CA1 corresponding to the side electrode 150, a second connection area CA2 corresponding to the driver, and a middle area MA positioned between the first connection area CA1 and the second connection area CA2. A transmission line 650 may be formed in the middle area MA. The connection electrode 620 for electrical connection with the side electrode 150 may be disposed in the first connection area CA1. An electrode 640 for electrical connection with the driver may be disposed in the second connection area CA2.

An integrated circuit (IC) module 650, which performs a predetermined switching operation or supplies a predetermined driving signal to the display panel 10 in response to a predetermined control signal supplied by the driver, may be disposed in the middle area MA. In certain embodiments, the IC module 650 may be omitted.

The transmission line 650 formed in the middle area MA may electrically connect the connection electrode 620 formed in the first connection area CA1 to the electrode 640 formed in the second connection area CA2. The connection electrode 620, the transmission line 650, and the electrode 640 formed on the flexible substrate 600 may be commonly referred to as an electrode.

As shown in FIG. 34B, which is a cross-sectional view of the flexible substrate 600, the flexible substrate 600 may include a base layer 610 having flexibility, the electrodes 620, 640, and 650 positioned on the base layer 610, and a cover layer 660 including a portion covering the electrodes 620, 640, and 650. The cover layer 660 may have flexibility. The electrodes 620, 640, and 650 may include a portion (i.e., the connection electrode 620) connected to the side electrode 150. The base layer 610 and the cover layer 660 may contain a resin material having the flexibility, so that the flexible substrate 600 may bend.

FIG. 34B shows an example where the electrodes 620, 640, and 650 of the flexible substrate 600 each have a single-layered structure. However, embodiments not limited thereto. For example, the electrodes 620, 640, and 650 of the flexible substrate 600 may have a multi-layered structure.

At least one of the base layer 610 or the cover layer 660 of the flexible substrate 600 may contain a black material. In this instance, the flexible substrate 600 may be black. Thus, even if the flexible substrate 600 is exposed, view of the display panel will not be obstructed by the flexible substrate 600.

The electrical connection between the flexible substrate 600 and the side electrode 150 may be performed using various methods, to be described below.

Figure 35:
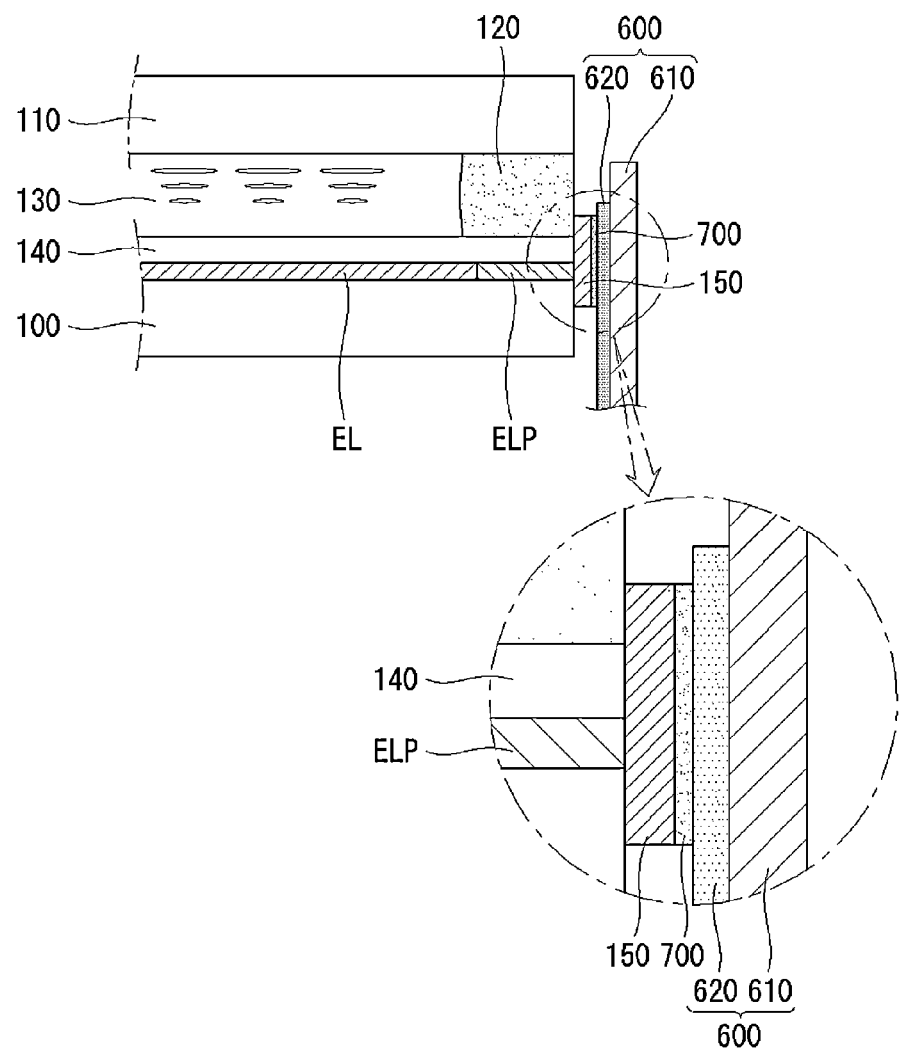

As shown in FIG. 35, a metal layer 700 may be disposed between the side electrode 150 and the connection electrode 620 of the flexible substrate 600. The metal layer 700 may electrically connect the side electrode 150 with the connection electrode 620 of the flexible substrate 600. The metal layer 700 may be manufactured using, for example, an organic metal compound by a process described below.

Figure 36:
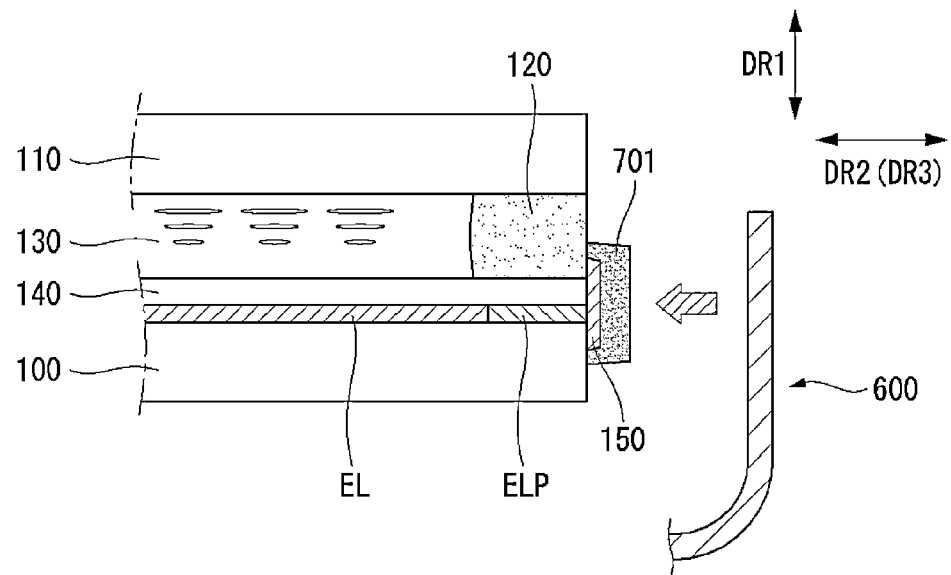
Figure 37:
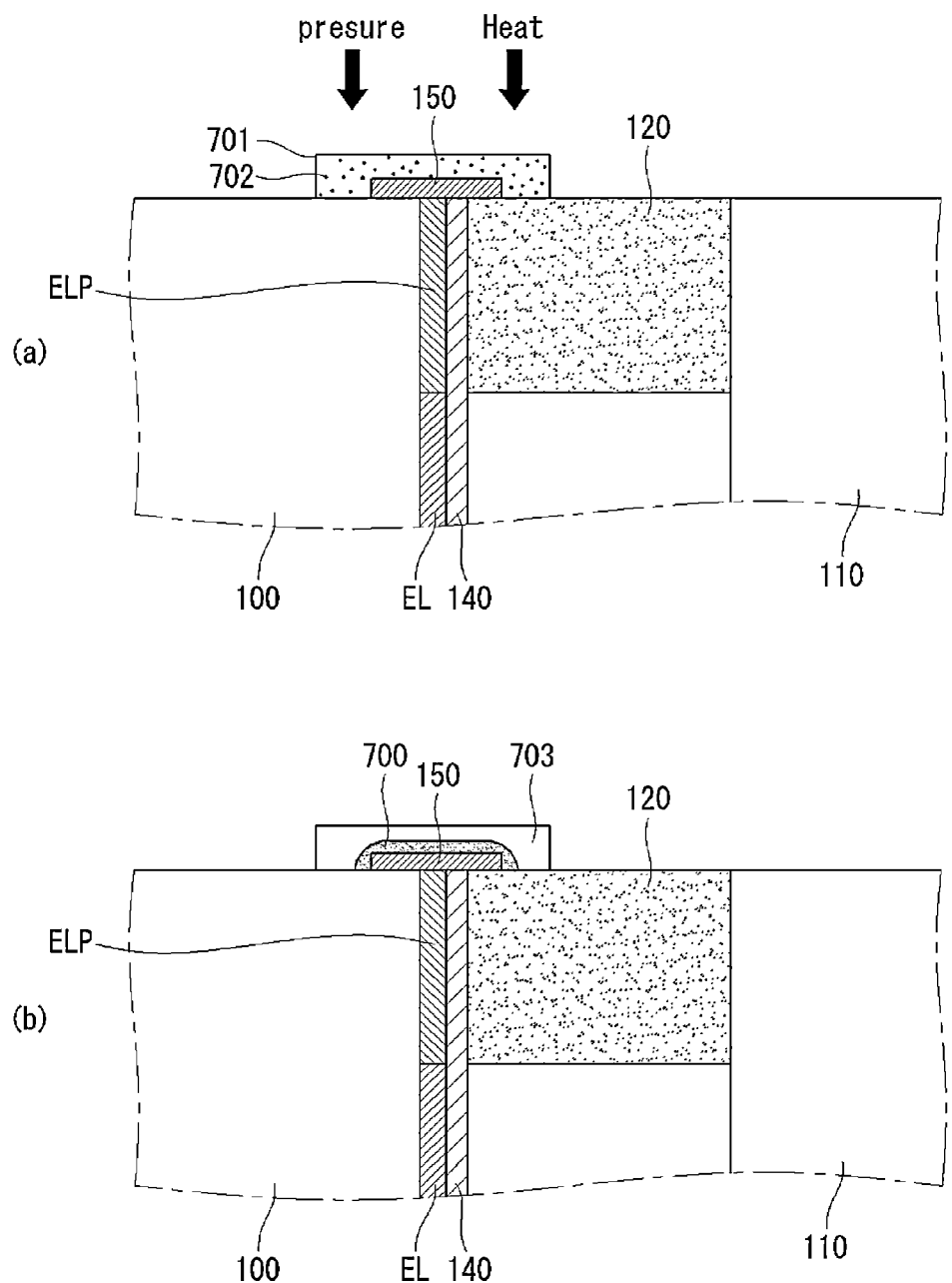

As shown in FIG. 36, the side electrode 150 may be formed on the side of the display panel 10 after a cutting process, and then an organic material containing a metal material may be applied to the side electrode 150, thereby forming an organic metal layer 701. Alternatively, sheets formed of an organic material containing a metal material may be laminated on the side of the display panel 10 to form the organic metal layer 701.

In certain embodiments, the organic metal layer 701 may be formed of the organic metal compound. The organic metal compound may be a material including a chemical bonding between a metal and carbon and may be formed by distributing a metal material of nanounit into an organic material.

The metal applicable to the organic metal compound may be a material with high electrical conductivity, for example, silver (Ag), gold (Au), and palladium (Pd). The organic metal compound may further include an organic solvent, a binder, etc. in addition to the metal material. The applicable organic metal compound may be an organic metal compound of a solid state and a liquid state manufactured by mixing or reacting metal alkoxide, metal acetate, a metal compound containing a metal acid compound and ethylene glycol, propanediol and its derivative, butanediol and its derivative, pentanediol and its derivative, and diol containing hexanol at a predetermined mole percent and using trimethyl phosphate (TMP), triethyl phosphate (TEP), and triphenyl phosphate (TPP) as an additive.

The organic metal layer 701 shown in FIG. 36 may be formed using the above organic metal compound. The organic metal layer 701 may cover the side electrode 150 on the side of the display panel 10. Afterwards, the flexible substrate 600 may be disposed on the organic metal layer 701, and a pressure may be applied to the flexible substrate 600 at a predetermined temperature.

When an ambient temperature is greater than or equal to a critical temperature, the chemical bonding between the metal material and carbon in the organic metal compound forming the organic metal layer 701 may be broken. The metal material may be gathered between the side electrode 150 and the connection electrode 620 of the flexible substrate 600 to form the metal layer 700.

In certain embodiments, as shown in FIG. 37A, the organic metal layer 701 containing a metal material 702 may be formed on the side of the display panel 10, and then a pressure may be applied to the flexible substrate 600 disposed on the organic metal layer 701 at a temperature of about 120 to 300° C. for about 5 seconds to two minutes. In certain embodiments, the pressure may be applied to the flexible substrate 600 disposed on the organic metal layer 701 at a temperature of about 180° C. for about 5 seconds to 30 seconds. In this instance, the organic solvent contained in the organic metal layer 701 may be evaporated, and the nanoscale metal materials may be sufficiently gathered between the side electrode 150 and the connection electrode 620 of the flexible substrate 600 to form the metal layer 700.

As shown in FIG. 37B, epoxy, acrylic, etc. may remain around the metal layer 700 to form an organic layer 703. Namely, the organic layer 703 may contain an acrylic material and/or an epoxy material. Because the organic layer 703 has adhesion, the organic layer 703 may firmly attach the flexible substrate 600 to the side of the display panel 10. Further, the organic layer 703 may contain a component which is not contained in the metal layer 700 in the metal material 702 contained in the organic metal layer 701.

As described above, when the organic metal compound is used to electrically connect the side electrode 150 to the connection electrode 620 of the flexible substrate 600, the metal layer 700 may be formed between the side electrode 150 and the connection electrode 620 of the flexible substrate 600 to more efficiently maintain the electrical connection between the side electrode 150 and the connection electrode 620 of the flexible substrate 600. Further, the flexible substrate 600 may be firmly attached to the side of the display panel 10 by forming the organic layer 703 around the metal layer 700.

Figure 38:
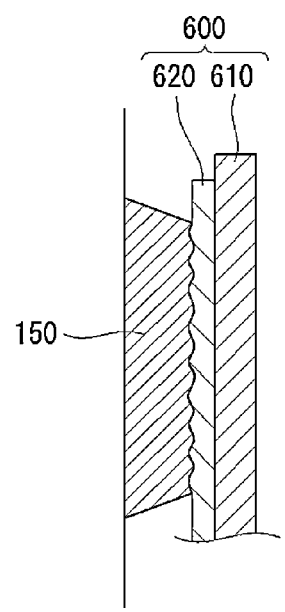

As shown in FIG. 38, the side electrode 150 may directly contact the connection electrode 620 of the flexible substrate 600. For example, at least one of the side electrode 150 or the connection electrode 620 may be melted at a contact surface between the side electrode 150 of the display panel 10 and the connection electrode 620 of the flexible substrate 600 to bring the side electrode 150 into contact with the connection electrode 620. An ultrasonic wave may be used to bond the side electrode 150 to the connection electrode 620 of the flexible substrate 600 so that they directly contact each other.

Figure 39:
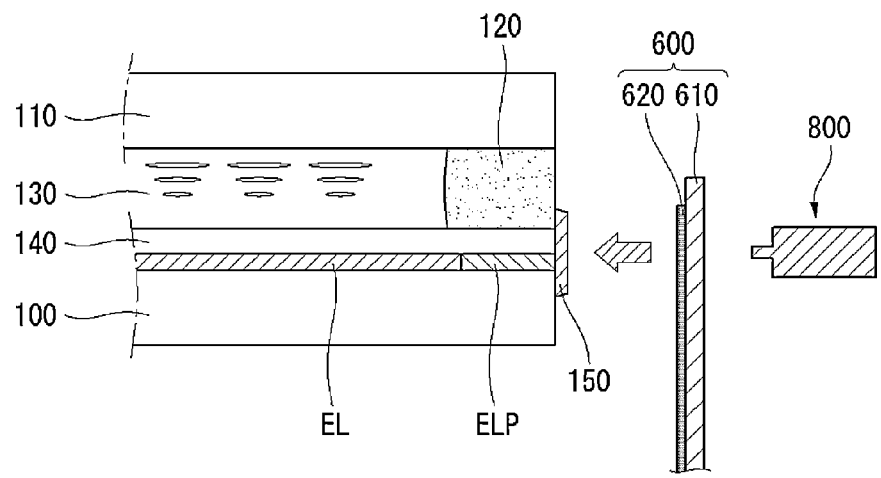

As shown in FIG. 39, the flexible substrate 600 including the connection electrode 620 may be positioned on the side of the display panel 10 on which the side electrode 150 is formed. An ultrasonic wave may be irradiated onto a bonding portion between the side electrode 150 and the connection electrode 620 using an ultrasonic head 800.

The side electrode 150 and/or the connection electrode 620 may be melted due to friction between the side electrode 150 and the connection electrode 620 and thus may be electrically bonded to each other in the form shown in FIG. 38.

As described above, when an ultrasonic bonding method using an ultrasonic wave is used in establishing the electrical bonding between the side electrode 150 and the connection electrode 620, the side electrode 150 and/or the connection electrode 620 may be melted and thus may be directly bonded to each other. Hence, an adhesive strength between the side electrode 150 and the connection electrode 620 may be improved.

In certain embodiments, the ultrasonic bonding method may be performed at a relatively high temperature so as to more easily bond the side electrode 150 to the connection electrode 620. For example, the ultrasonic bonding method may be performed at a relatively high temperature of about 130° C. to 150° C.

Figure 40:
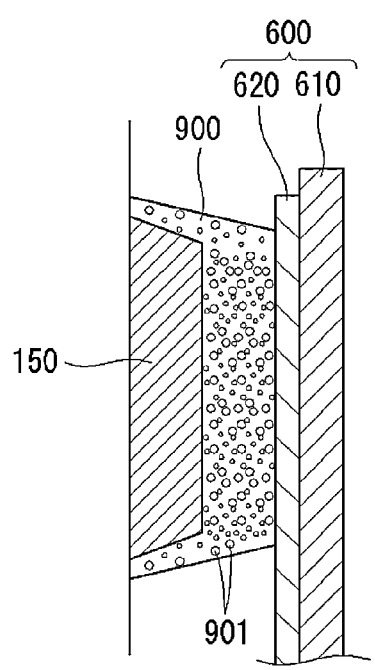

As shown in FIG. 40, an adhesive layer 900 including a plurality of conductive particles 901 may be disposed between the side electrode 150 and the connection electrode 620 of the flexible substrate 600, thereby electrically connecting the side electrode 150 to the connection electrode 620 of the flexible substrate 600.

The adhesive layer 900 may be, for example, an anisotropic conductive adhesive or an anisotropic conductive adhesive sheet. In this instance, the adhesive layer 900 including the conductive particles 901 may be disposed between the side electrode 150 and the connection electrode 620 of the flexible substrate 600, and a pressure of about 2 to 4 Pa may be applied to the flexible substrate 600 at a temperature of at least 180° C. for about 8 to 15 seconds, thereby electrically connecting the side electrode 150 to the connection electrode 620 of the flexible substrate 600.

Figure 41:
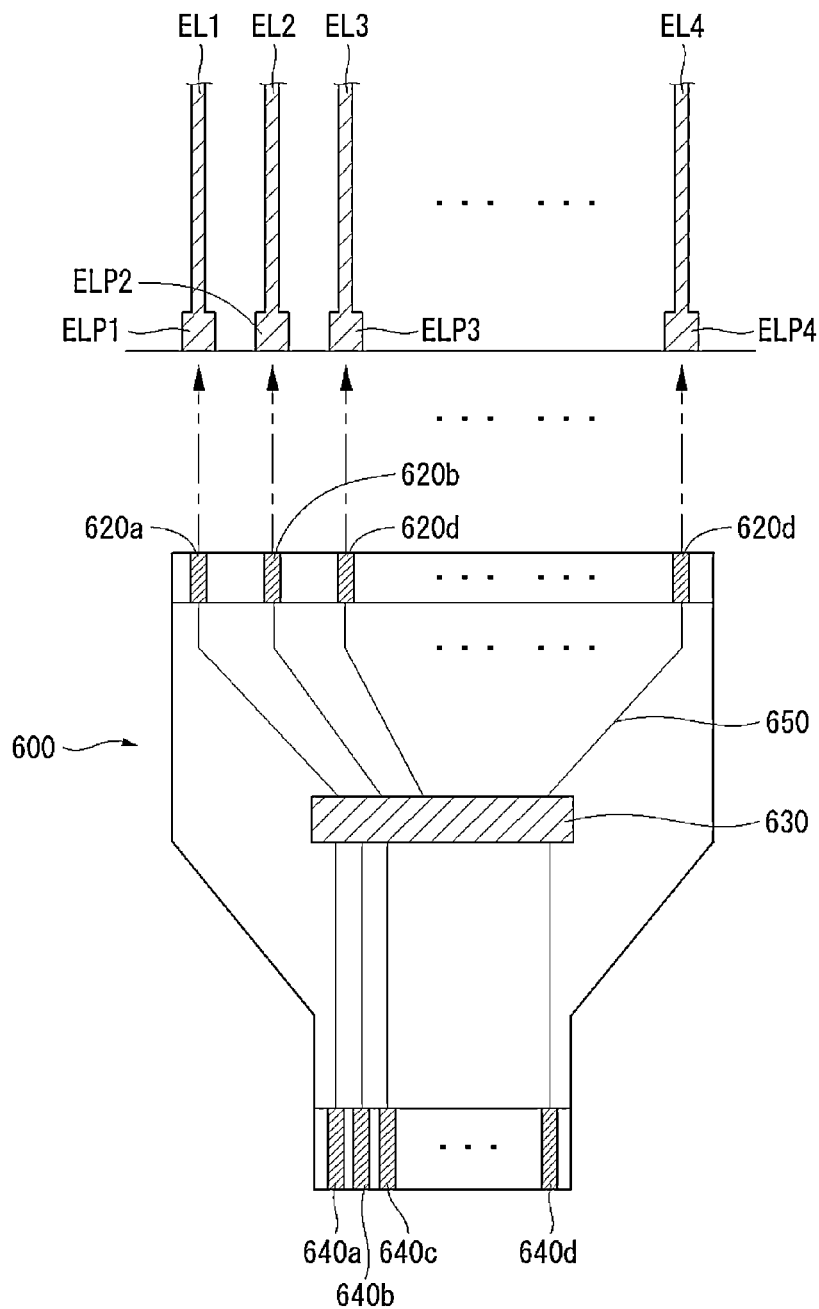

The pad electrodes ELP may respectively correspond to the connection electrodes 620 of the flexible substrate 600. For example, as shown in FIG. 41, a first connection electrode 620a of the connection electrodes 620 formed on the flexible substrate 600 may correspond to a first electrode line EL1 and a first pad electrode ELP1 of the display panel 10, and a second connection electrode 620b may correspond to a second electrode line EL2 and a second pad electrode ELP2 of the display panel 10. In this instance, the driving signal may be supplied to the first electrode line EL1 through the first connection electrode 620a, and the driving signal may be supplied to the second electrode line EL2 through the second connection electrode 620b.

Figure 42:
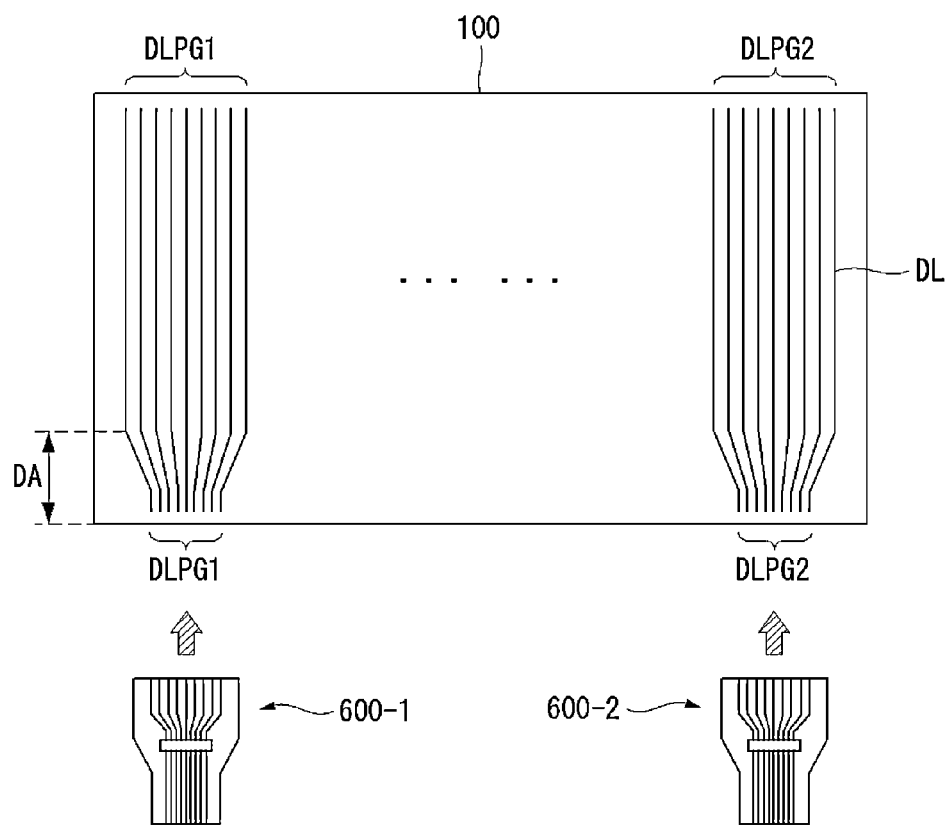

Each flexible substrate 600 may correspond to the plurality of electrode lines EL. For example, as shown in FIG. 42, a first flexible substrate 600-1 may correspond to a first data line group DLG1 including the plurality of data lines DL, and a second flexible substrate 600-2 may correspond to a second data line group DLG2 including the plurality of data lines DL. The above configuration made use of the data lines DL as the electrode lines EL. However, the above configuration may be applied to the gate lines GL.

As shown in FIG. 42, the first data line group DLG1 may correspond to a first data pad electrode group DLPG1, and the second data line group DLG2 may correspond to a second data pad electrode group DLPG2. A travelling direction of at least one data line DL included in the data line group DLG may change in the dummy area DA, so as to connect the data line group DLG to the flexible substrate 600. For example, a travelling direction of the data line DL included in the first data line group DLG1 may change, so as to reduce a distance between the adjacent data lines DL belonging to the first data line group DLG1. An area, in which a travelling direction of the electrode line EL changes, may be referred to as the dummy area DA or the bezel area.

Figure 43:
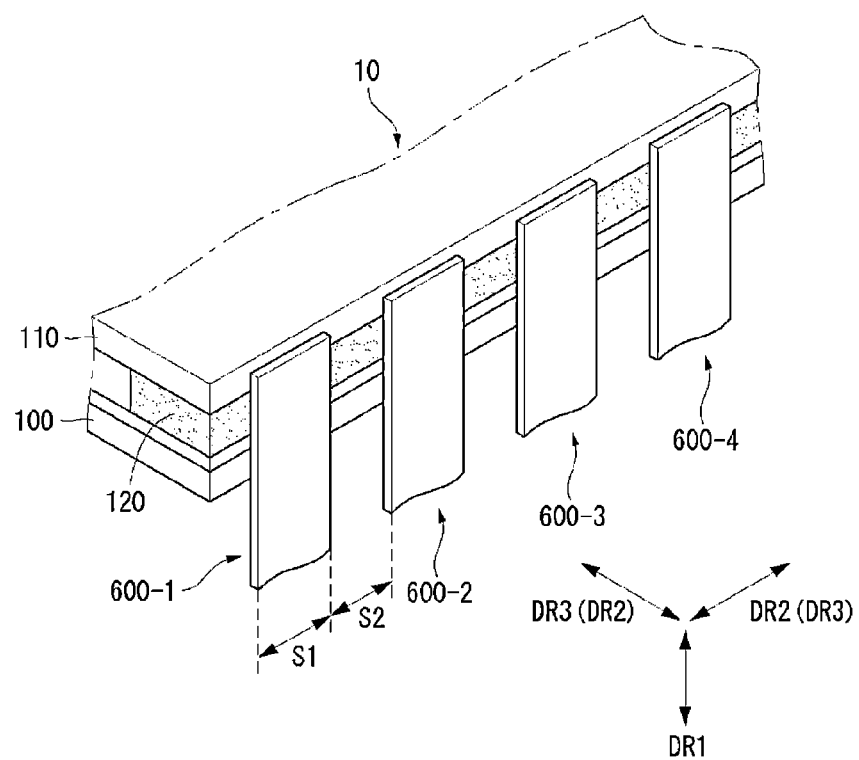

As shown in FIG. 43, a plurality of flexible substrates 600-1 to 600-4 may be attached to the side of the display panel 10. A width S1 of the flexible substrate 600 in the horizontal direction DR2 or DR3 may be greater than a distance S2 between adjacent flexible substrates 600.

As described above, when the distance S2 between the adjacent flexible substrates 600 in the horizontal direction DR2 or DR3 decreases, the size of the area in which the travelling direction of the electrode line EL changes may also decrease. Hence, the size of the bezel area may further decrease.

Figure 44:
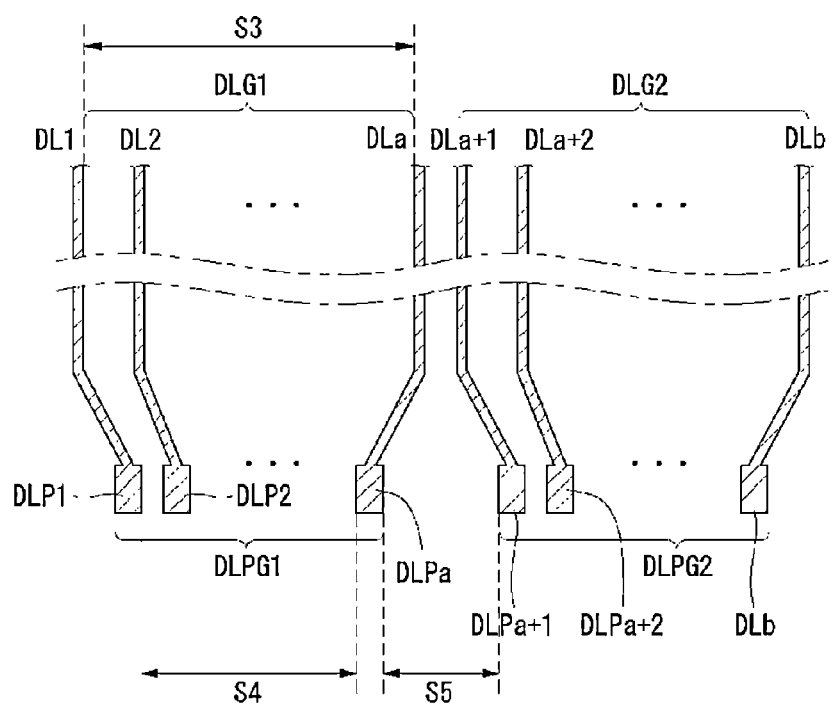

As shown in FIG. 44, a width of the data line group DLG in a direction crossing (vertical to) the data line DL may be greater than a width of the data pad electrode group DLPG corresponding to the data line group DLG. For example, a width S3 of the first data line group DLG1 in a direction crossing (vertical to) the data line DL may be greater than a width S4 of the first data pad electrode group DLPG1 corresponding to the first data line group DLG1.

Further, a width of the data pad electrode group DLPG may be greater than a distance between the adjacent data pad electrode groups DLPG. For example, the width S4 of the first data pad electrode group DLPG1 in the direction crossing (vertical to) the data line DL may be greater than a distance S5 between the first data pad electrode group DLPG1 and the second data pad electrode group DLPG2. In FIG. 44, the distance S5 between the first data pad electrode group DLPG1 and the second data pad electrode group DLPG2 may be a distance between an a-th data pad electrode DLPa closest to the second data pad electrode group DLPG2 among the data pad electrodes belonging to the first data pad electrode group DLPG1 and an (a+1)th data pad electrode DLPa+1 closest to the first data pad electrode group DLPG1 among the data pad electrodes belonging to the second data pad electrode group DLPG2.

A width S6 of an area (for example, the dummy area), in which a travelling direction of the data line DL changes in a direction horizontal to the data line DL, may be less than the distance S5 between the adjacent data pad electrode groups DLPG. In this instance, the size of the bezel area may further decrease.

Figure 45:
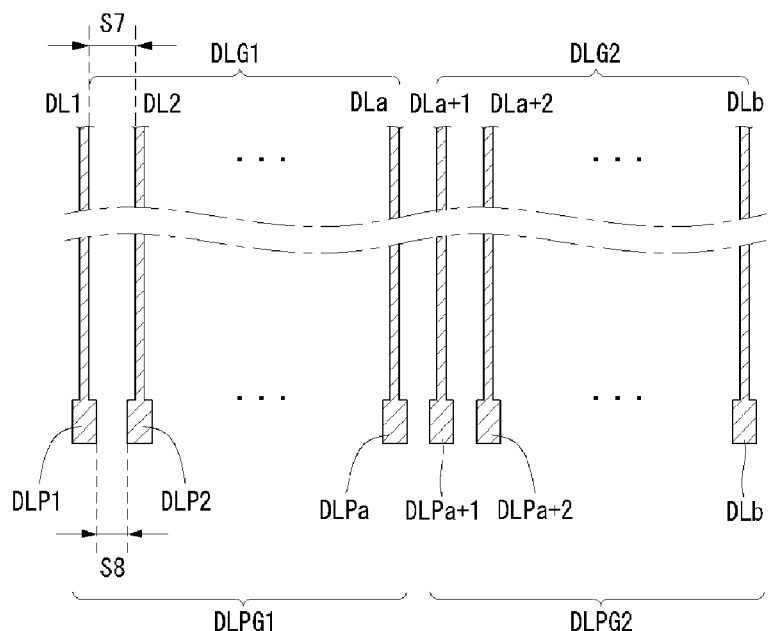

As shown in FIG. 45, the electrode line EL and the pad electrode ELP may be positioned on a straight line without a change in the travelling direction of the electrode line EL. In this instance, the size of the bezel area may further decrease.

The flexible substrate 600 may include a gate flexible substrate 600G electrically connected to the gate side electrode 150G and a data flexible substrate 600D electrically connected to the data side electrode 150D.

Figure 46:
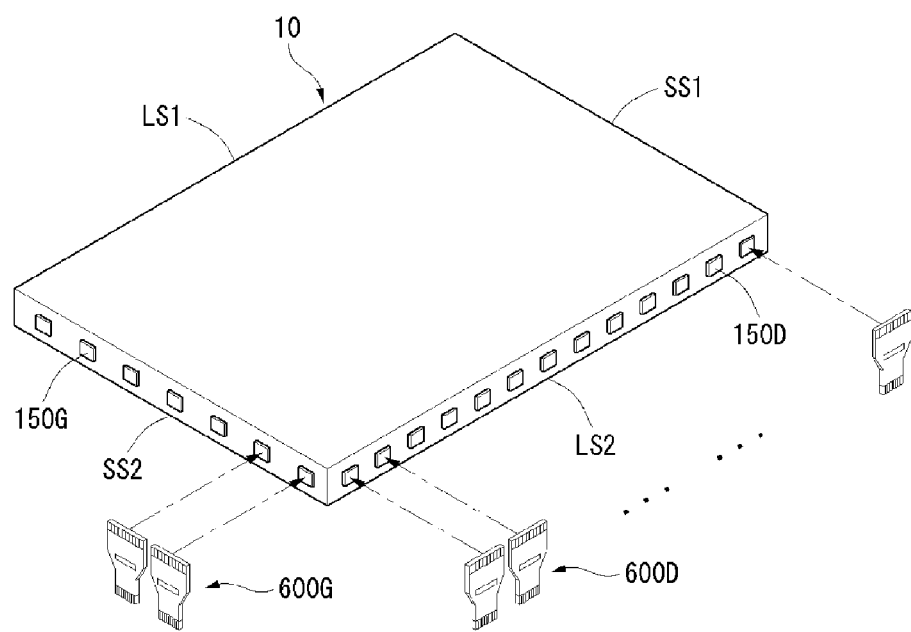

For example, as shown in FIG. 46, the gate side electrode 150G may be disposed on the second short side SS2 of the display panel 10, and the gate flexible substrate 600G may be electrically connected to the gate side electrode 150G. Further, the data side electrode 150D may be disposed on the second long side LS2 of the display panel 10, and the data flexible substrate 600D may be electrically connected to the data side electrode 150D.

Figure 47:
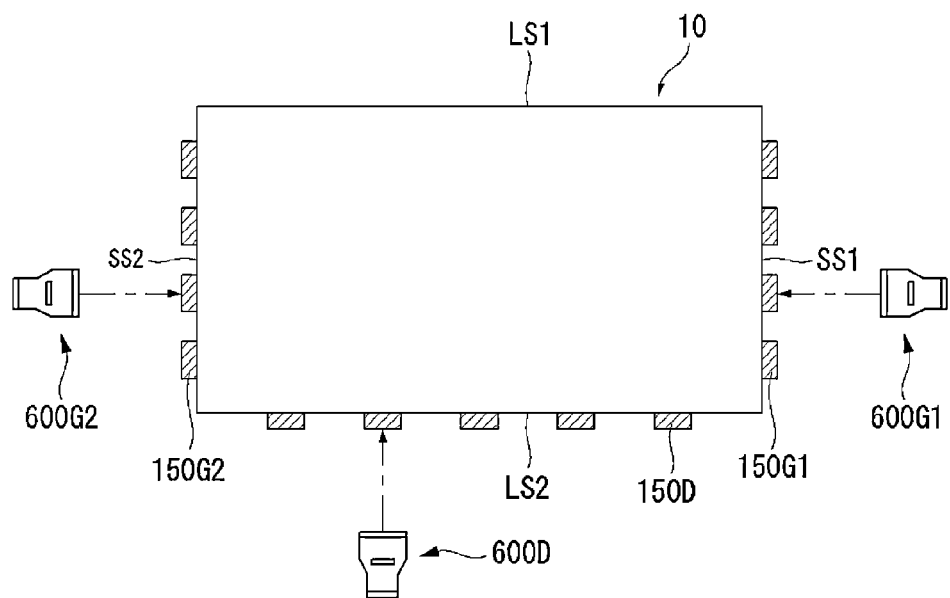

As shown in FIG. 47, it is assumed that the data side electrode 150D is disposed on the second long side LS2 of the display panel 10, the first gate side electrode 150G1 of the gate side electrode 150G is disposed on the first short side SS1 of the display panel 10, and the second gate side electrode 150G2 of the gate side electrode 150G is disposed on the second short side SS2 of the display panel 10.

In this instance, a first gate flexible substrate 600G1 may be electrically connected to the first gate side electrode 150G1, and a second gate flexible substrate 600G2 may be electrically connected to the second gate side electrode 150G2.

Figure 48:
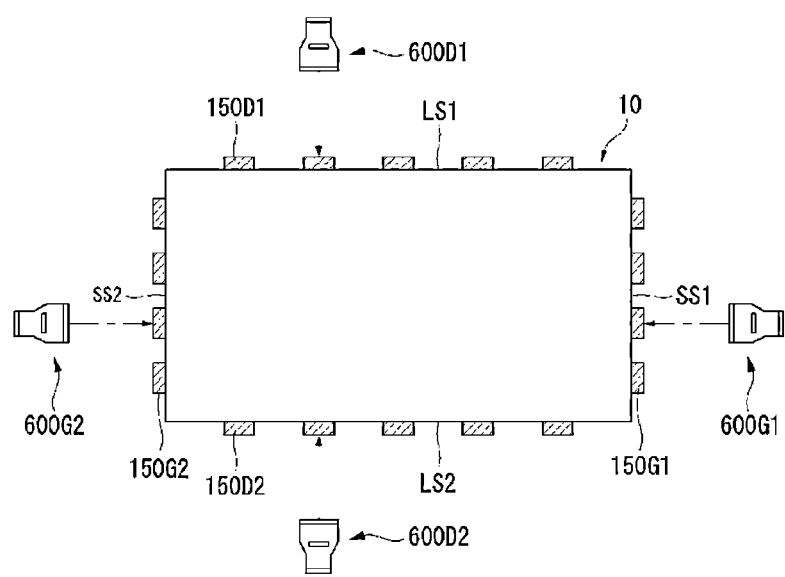

In the exemplary arrangement shown in FIG. 48, the first data side electrode 150D1 of the data side electrode 150D is disposed on the first long side LS1 of the display panel 10, the second data side electrode 150D2 of the data side electrode 150D is disposed on the second long side LS2 of the display panel 10, the first gate side electrode 150G1 of the gate side electrode 150G is disposed on the first short side SS1 of the display panel 10, and the second gate side electrode 150G2 of the gate side electrode 150G is disposed on the second short side SS2 of the display panel 10. In this instance, a first data flexible substrate 600D1 may be electrically connected to the first data side electrode 150D1, and a second data flexible substrate 600D2 may be electrically connected to the second data side electrode 150D2.

Each flexible substrate 600 may be electrically connected to the plurality of side electrodes 150. Hence, the flexible substrate 600 in an area between the adjacent side electrodes 150 may be connected to the side of the display panel 10.

Figure 49:
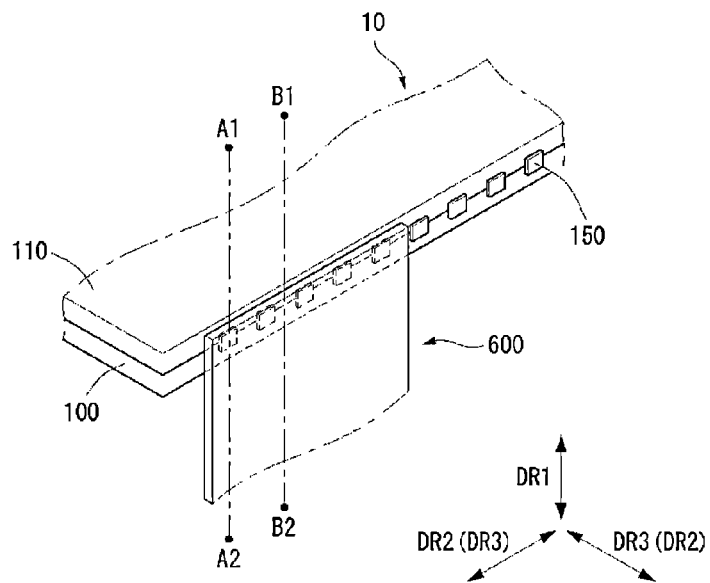
Figure 50:
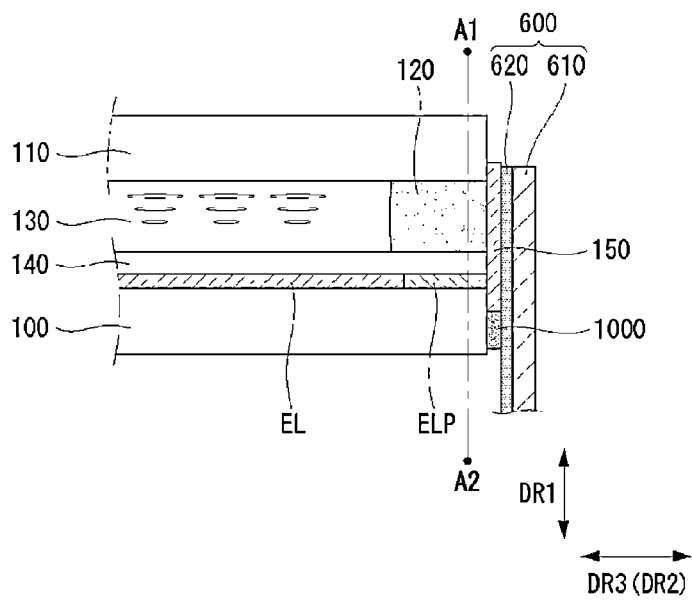

For example, as shown in FIG. 50, which is a cross-sectional view taken along line A1-A2 of FIG. 49 passing through the side electrode 150 in the vertical direction DR1 in a state where the flexible substrate 600 is connected to the side electrode 150, the side electrode 150 may be connected to the connection electrode 620 of the flexible substrate 600. In this instance, a first adhesive layer 1000 may be disposed between the first substrate 100 and the flexible substrate 600 so as to improve an adhesive strength between the flexible substrate 600 and the display panel 10.

Figure 51:
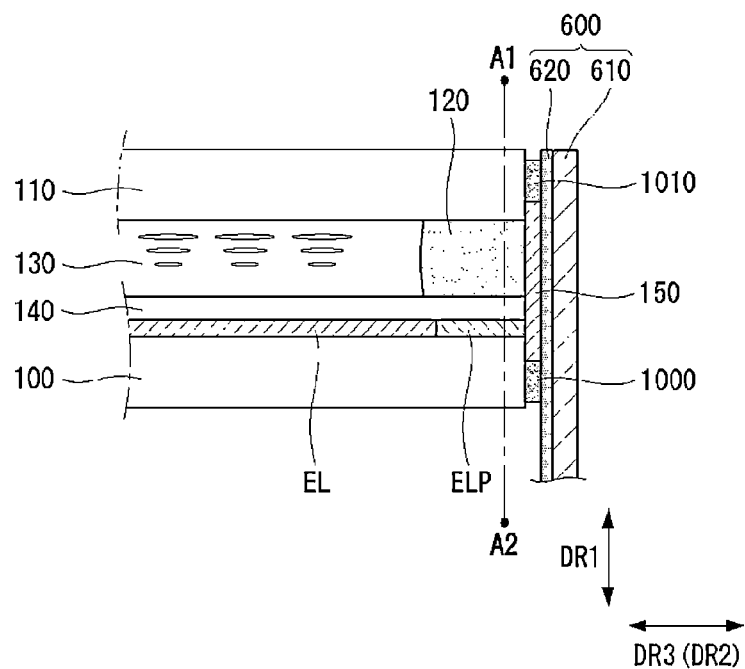

As shown in FIG. 51, a second adhesive layer 1010 may be additionally disposed between the second substrate 110 and the flexible substrate 600 so as to improve adhesion between the flexible substrate 600 and the display panel 10.

Figure 52:
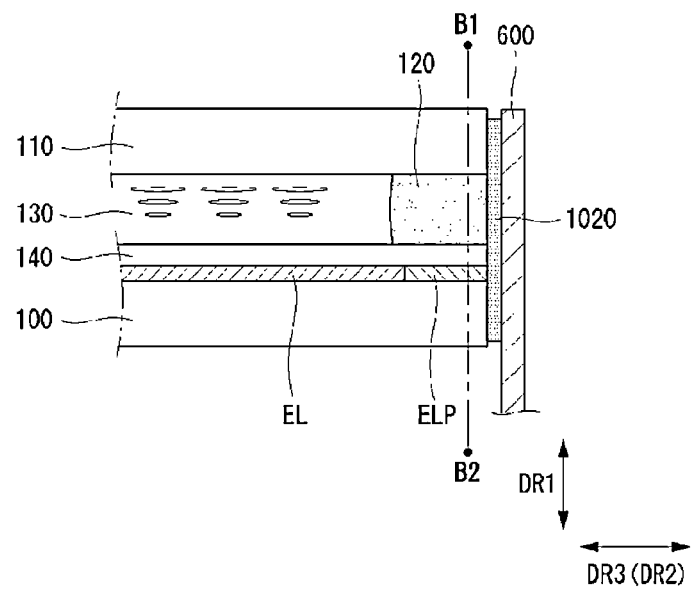

Alternatively, as shown in FIG. 52, which is a cross-sectional view taken along line B1-B2 of FIG. 49 passing through an area between the adjacent side electrodes 150 in the vertical direction DR1 in a state where the flexible substrate 600 is connected to the side electrode 150, the flexible substrate 600 may be attached to at least one of the first substrate 100, the second substrate 110, the seal 120, or the pad electrode ELP. For this, a third adhesive layer 1020 may be disposed between the side of the display panel 10 and the flexible substrate 600. The third adhesive layer 1020 may include a portion positioned on the sides of the first substrate 100, the second substrate 110, the seal 120, and/or the pad electrode ELP.

As described above, the adhesive layer or the adhesive sheet may attach the flexible substrate 600 to the side of the display panel 10.

Figure 53:
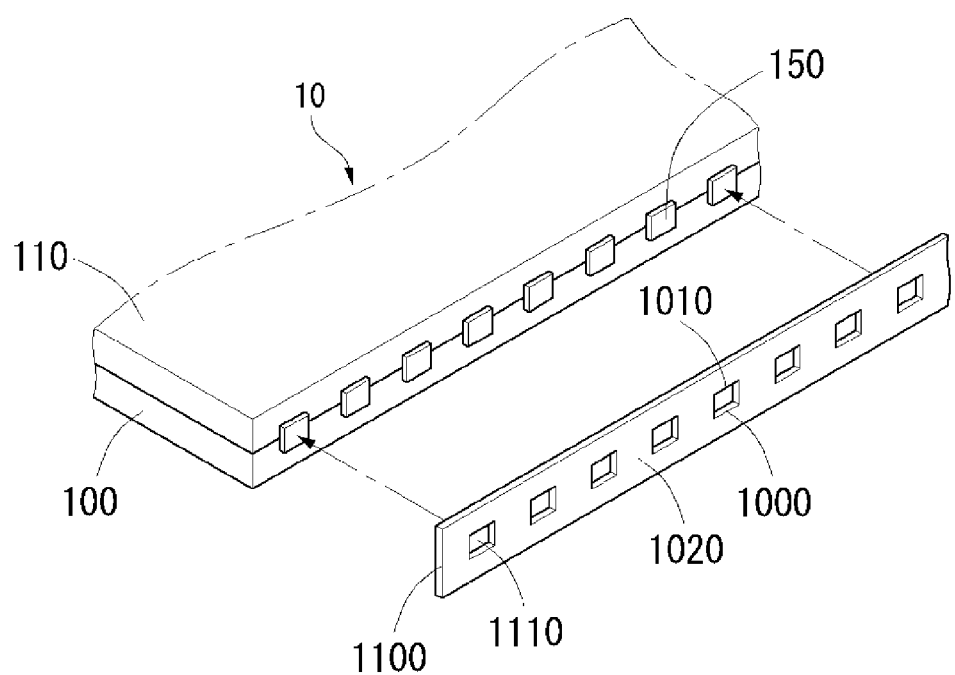

For example, as shown in FIG. 53, an adhesive sheet 1100 having a hole 1110 exposing the side electrode 150 may be attached to the side of the display panel 10, with the side electrode 150 formed on the side of the display panel 10.

The adhesive sheet 1100 may include first, second and third adhesive layers 1000, 1010, and 1020.

On the other hand, as described above with reference to FIGS. 36 and 37, when the flexible substrate 600 is connected to the side electrode 150 using the organic metal compound, the organic layer 703 having the adhesion is additionally employed, and thus the adhesive sheet 1100 may be omitted.

Further, as described above with reference to FIG. 40, when the adhesive layer 900 including the conductive particles 901 is used, the adhesive sheet 1100 may be omitted.

The connection electrode 620 may have as wide an area as possible, so as to reduce an electrical resistance between the connection electrode 620 of the flexible substrate 600 and the side electrode 150.

Figure 54A:
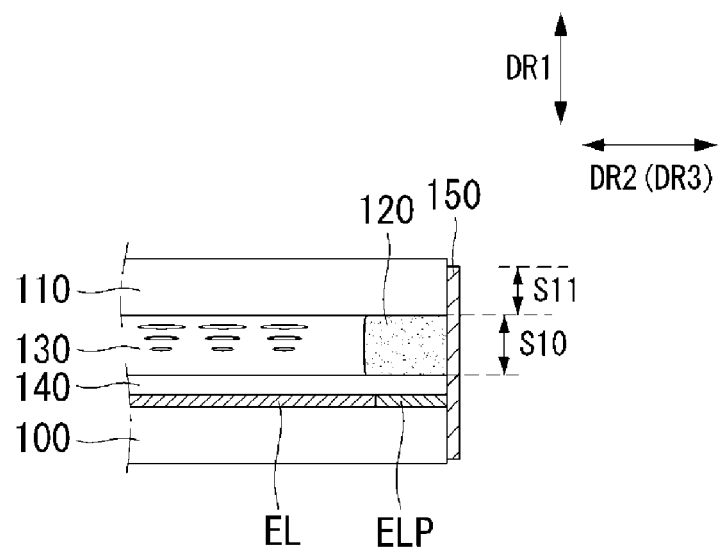
Figure 54B:
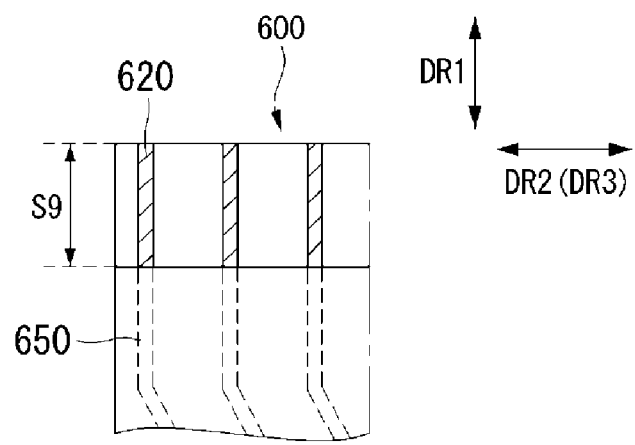

For example, as shown in FIG. 54B, a width S9 of the connection electrode 620 in the vertical direction DR1 may be greater than a width S10 of the seal 120 in the vertical direction DR1 by a predetermined length S11. In this instance, a contact area between the connection electrode 620 of the flexible substrate 600 and the side electrode 150 may increase.

Figure 55:
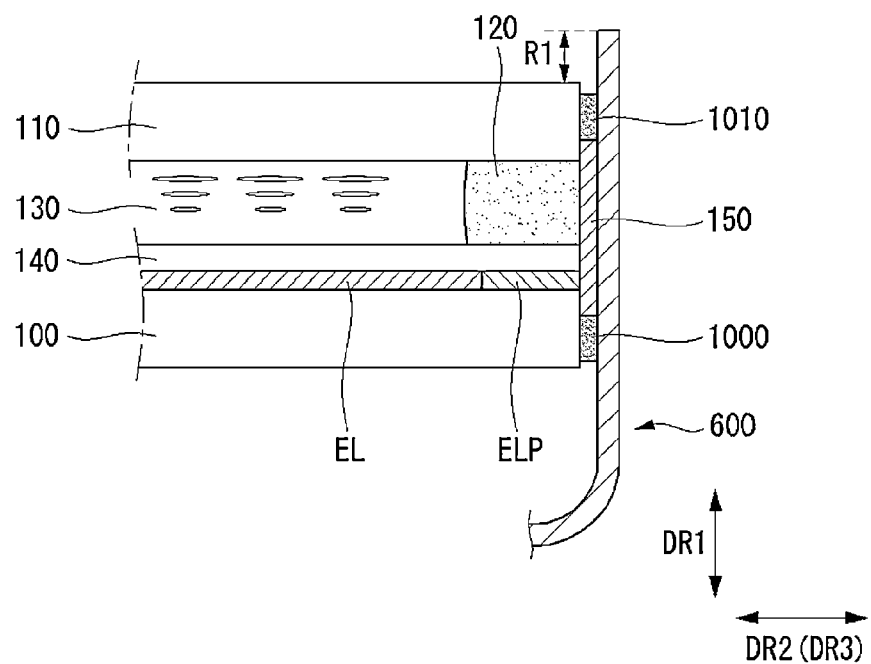

As shown in FIG. 55, the flexible substrate 600 may include a portion which extends further than the front surface of the second substrate 110 in the vertical direction DR1 by a predetermined length R1. In this instance, a length of the flexible substrate 600 may sufficiently increase.

A resin layer may be formed on the side of the display panel 10, so as to firmly connect the flexible substrate 600 to the display panel 10.

Figure 56:
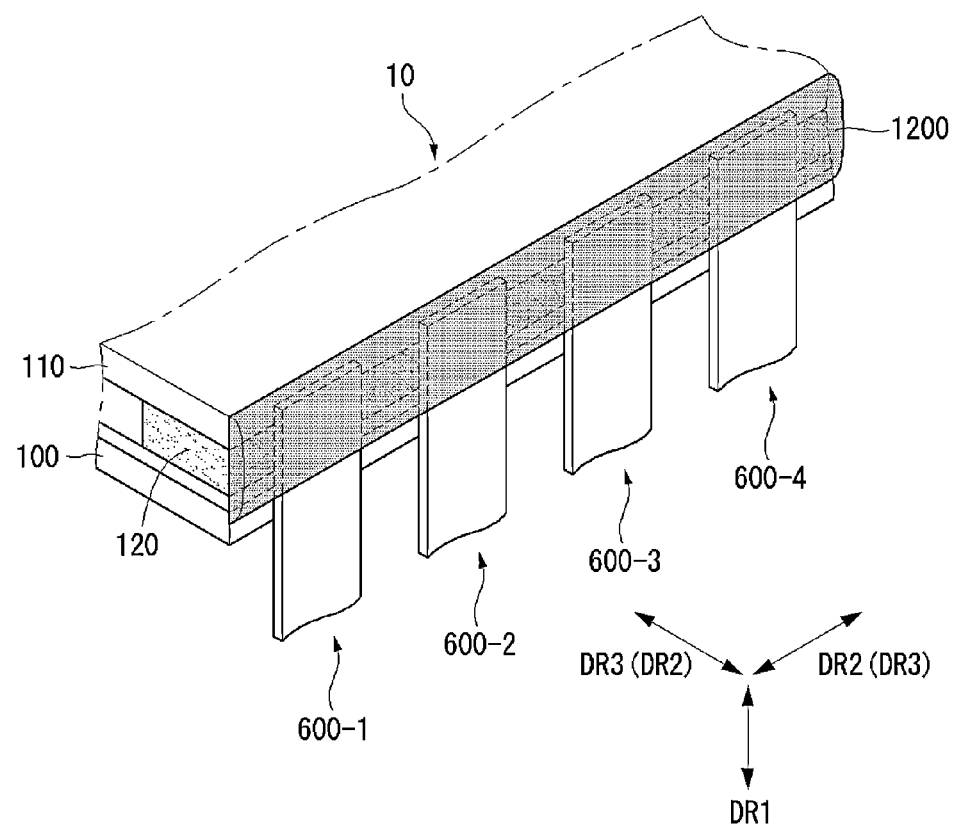

For example, as shown in FIG. 56, a resin layer 1200 covering at least a portion of the flexible substrate 600 may be formed at the edge of the display panel 10 and extend in the horizontal direction DR2 or DR3. The resin layer 1200 may cover a portion of the second substrate 110 and/or a portion of the seal 120. The resin layer 1200 may contain a photosensitive material. The resin layer 1200 may contain a black dye, so that the flexible substrate 600 is not seen.

Figure 57:
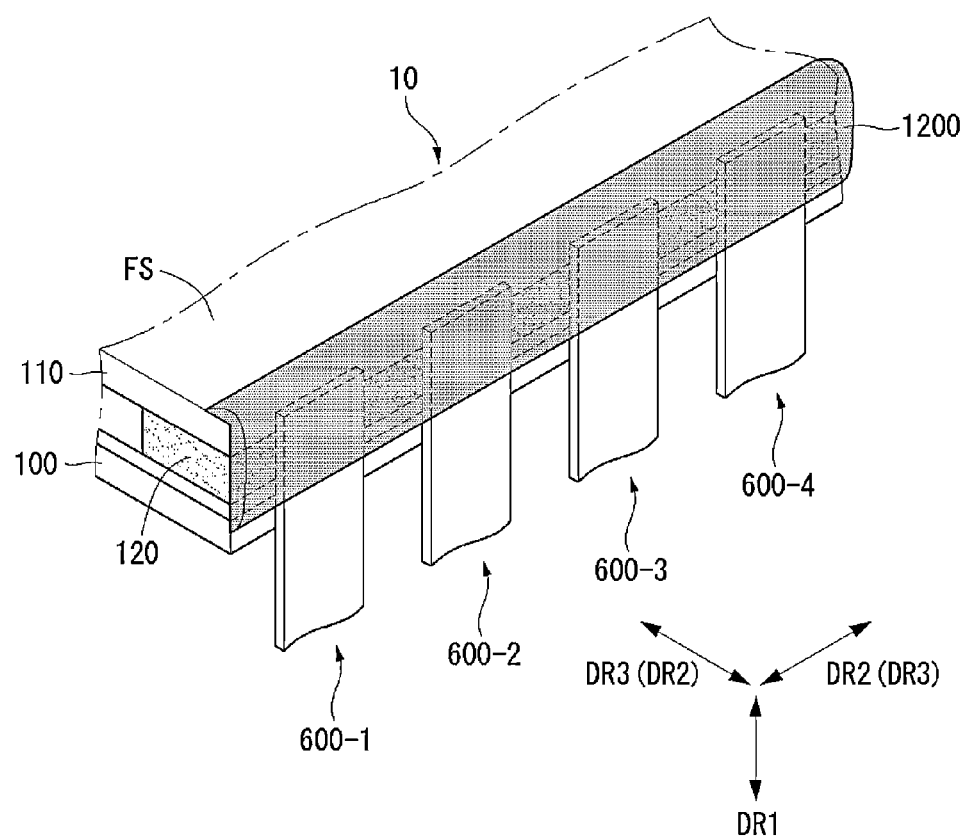
Figure 58:
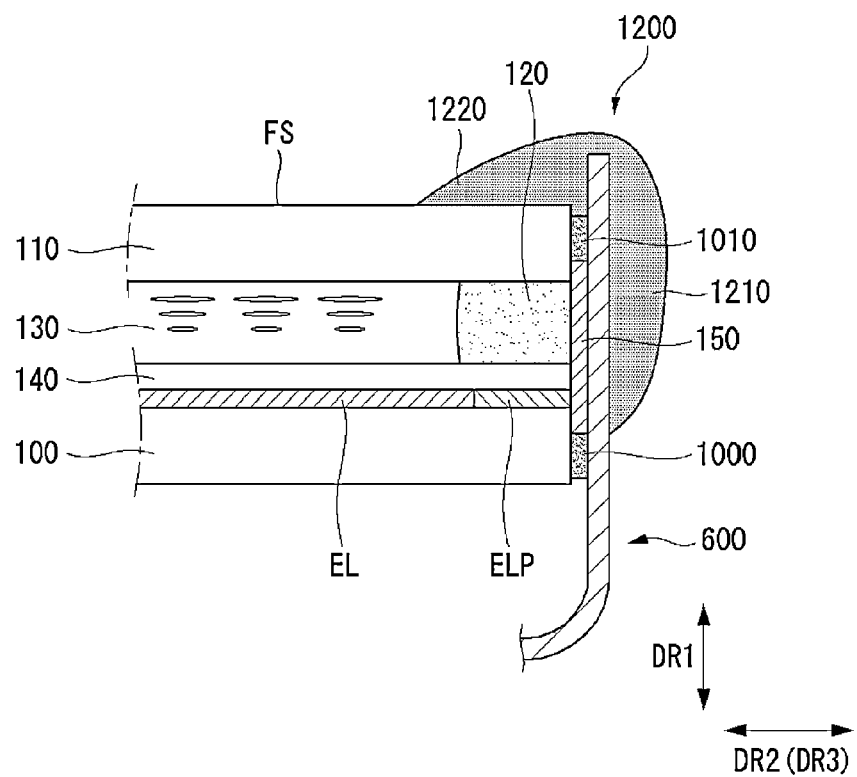

As shown in FIGS. 57 and 58, the resin layer 1200 may include a portion positioned on the front surface FS of the second substrate 110. In other words, the resin layer 1200 may include a first portion 1210 positioned on the side of the display panel 10 and a second portion 1220 positioned in the front of the display panel 10. The first portion 1210 of the resin layer 1200 may cover at least a portion of the flexible substrate 600.

As described above, when the resin layer 1200 includes the second portion 1220 positioned in the front of the display panel 10, the structural stability of the display panel 10 may be improved because the resin layer 1200 covers the end of the flexible substrate 600, even if the flexible substrate 600 includes a portion extending beyond the front surface of the display panel 10.

Figure 59:
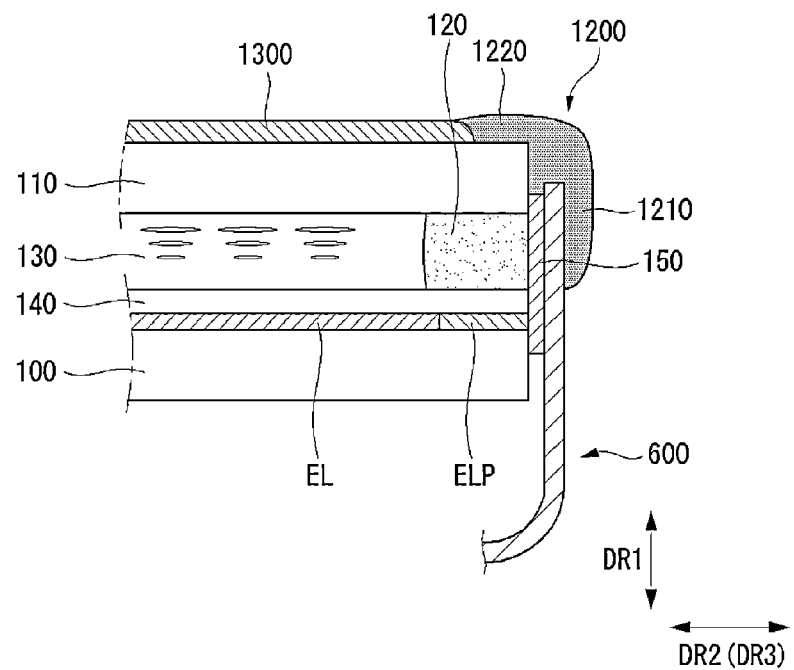

As shown in FIG. 59, a film type filter 1300 may be attached to the front surface of the second substrate 110 of the display panel 10. The film type filter 1300 may be, for example, a polarizing filter or a three-dimensional (3D) filter. The second portion 1220 of the resin layer 1200 may contact the film type filter 1300. The resin layer 1200 may be contoured to surround the edge of the display panel 10.

Figure 60:
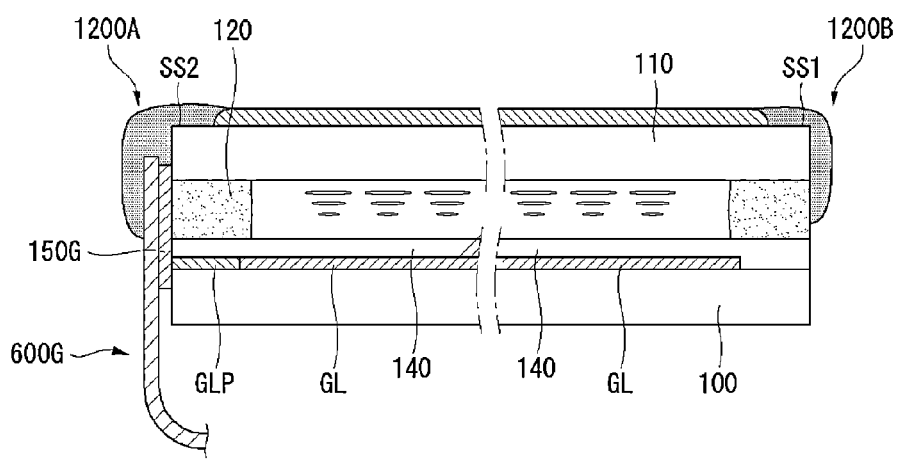

In the example shown in FIG. 60, the gate side electrode 150G is formed in the area around the second short side SS2 of the display panel 10, and the gate flexible substrate 600G is connected to the gate side electrode 150G. In this instance, a first resin layer 1200A may be positioned on the second short side SS2 of the display panel 10 and may cover at least a portion of the gate flexible substrate 600G. A second resin layer 1200B may be positioned on the first short side SS1 of the display panel 10 and may cover a portion of the second substrate 110.

Figure 61:
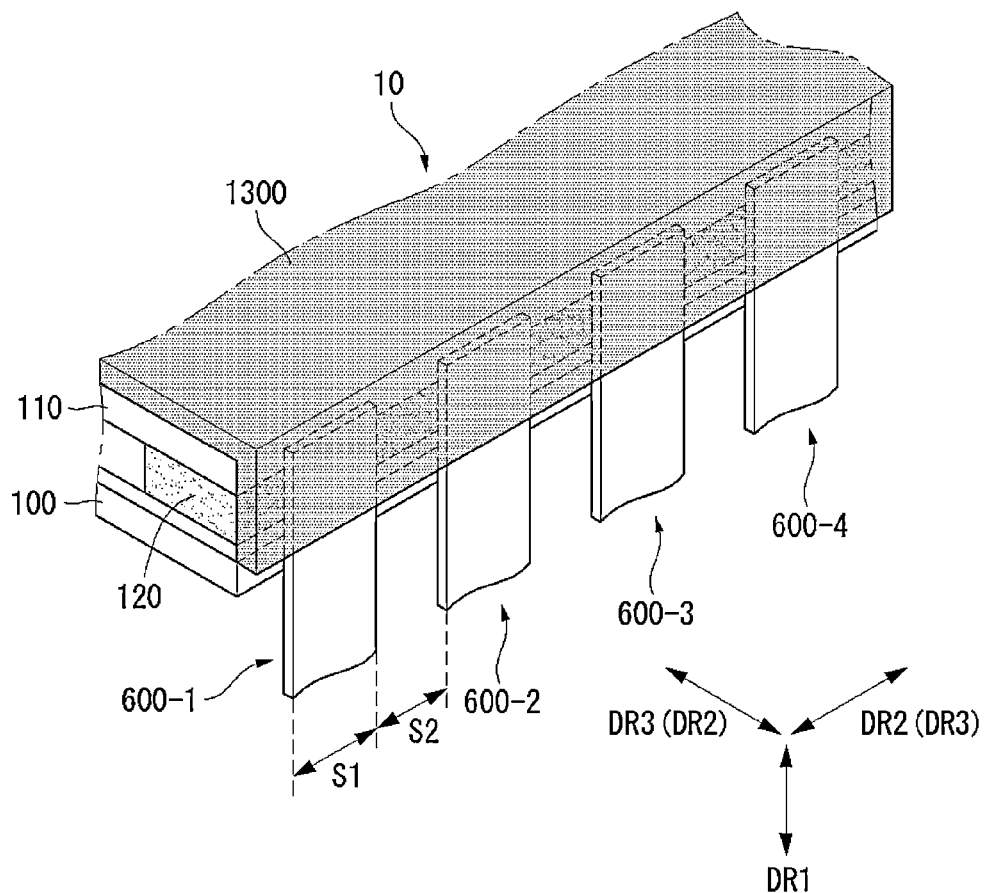
Figure 62:
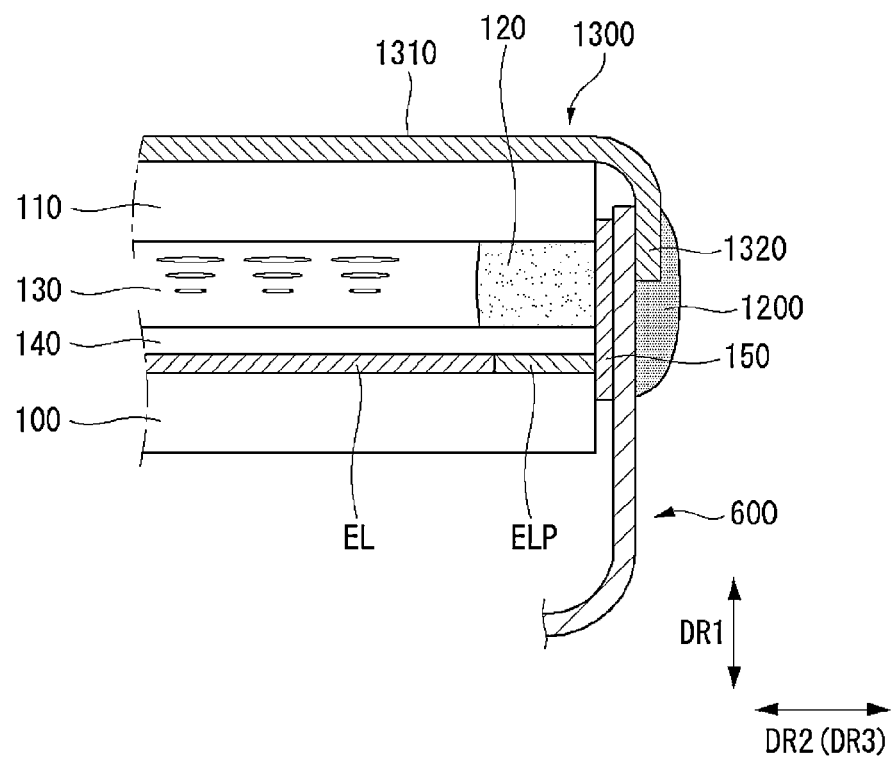

As shown in FIG. 61, the film type filter 1300 attached to the front surface of the second substrate 110 may extend to the side of the display panel 10. In this instance, the film type filter 1300 may cover a portion of the flexible substrate 600.

As described above, when the film type filter 1300 extends to the side of the display panel 10, the resin layer 1200 may be formed to cover an end of the film type filter 1300 and a portion of the flexible substrate 600.

FIGS. 63 to 74 illustrate a display device according to another exemplary embodiment as broadly described herein. In the following description, the descriptions of the configuration and the structure described above are omitted where appropriate, simply for sake of brevity. Further, in the following description, the exemplary embodiment employs a liquid crystal display including a liquid crystal display panel as an example of the display device. However, the embodiment is not limited thereto. For example, a backlight device may be omitted in the following configuration.

Figure 63:
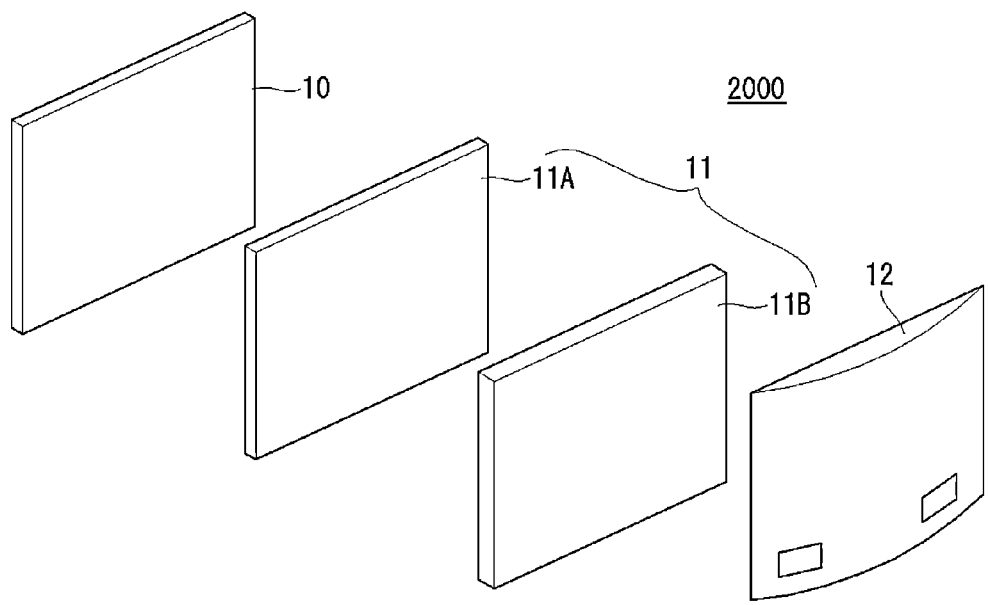
FIGS. 63 to 74 illustrate a display device according to another exemplary embodiment as broadly described herein.

As shown in FIG. 63, a display device 2000 according to an embodiment as broadly described herein may include a display panel 10, a backlight device 11 including an optical layer 11A and a light source module 11B, and a cover 12. The optical layer 11A may be disposed between the display panel 10 and the cover 12.

The optical layer 11A may include a plurality of sheets. For example, the optical layer 11A may include at least one of a prism sheet and/or a diffusion sheet.

The light source module 11B of the backlight device 11 may be disposed at a rear of the optical layer 11A. The backlight device 11 may include a light guide plate. The light source module 11B may include various kinds of light sources. For example, the light sources of the light source part 11B may be one of a light emitting diode (LED) chip, a LED package having at least one LED chip and the like. In this instance, the light source may be a colored LED emitting at least one of red, green, and blue light or a white LED. The backlight device 11 may be one of a direct type backlight device or an edge type backlight device. The cover 12 may be positioned at a rear of the backlight device 11. The cover 12 may protect the backlight device 11 from an external impact and/or an external applied pressure.

Figure 64:
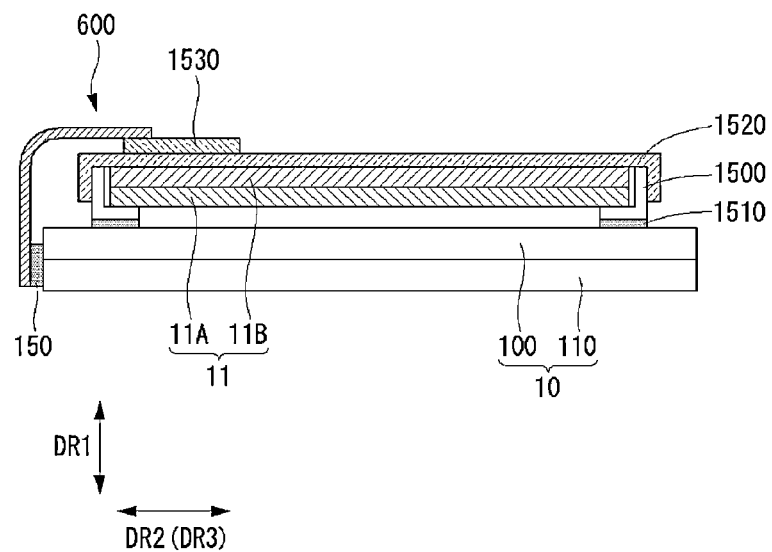

As shown in FIG. 64, a bracket 1500 may be disposed on a back surface of a first substrate 100 of the display panel 10. The bracket 1500 may be attached to the first substrate 100 using an adhesive layer 1510. The backlight device 11 including the optical layer 11A and the light source module 11B may be disposed on the bracket 1500. A frame 1520 may be disposed at the rear of the backlight device 11. A driver 1530 may be disposed on the frame 1520. The driver 1530 may be referred to as a driving board. A flexible substrate 600 may electrically connect a side electrode 150 formed on the side of the display panel 10 to the driver 1530.

Figure 65:
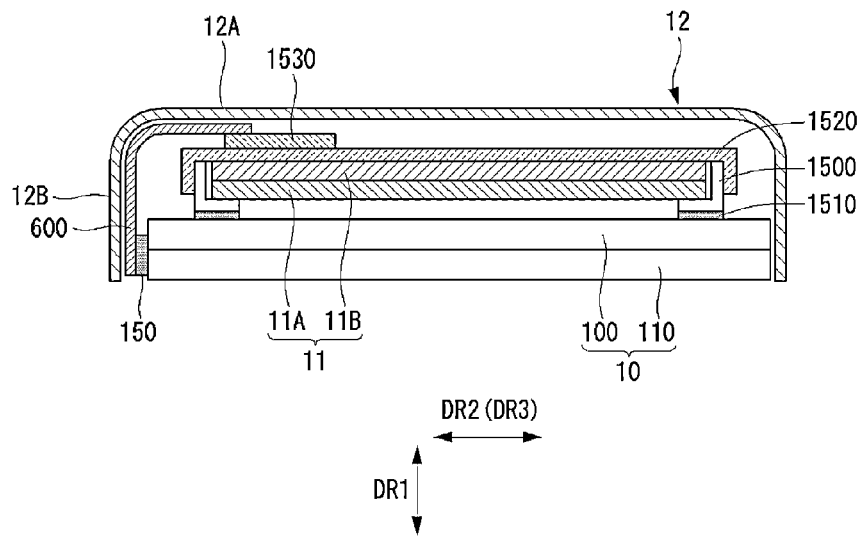

As shown in FIG. 65, the cover 12 may include a back wall 12A positioned at the rear of the display panel 10 and a side wall 12B positioned on the side of the display panel 10. Namely, the cover 12 may cover the rear and the side of the display panel 10. The back wall 12A and the side wall 12B of the cover 12 may be formed as a single body. As described above, at least one edge of a front surface FS of the display panel 10 may be exposed in a state where the cover 12 is disposed at the rear of the display panel 10.

In this embodiment, the exposure of at least one edge of the front surface FS of the display panel 10 may indicate that when a viewer in the front of the display device 2000 (for example, at a first position P1) watches the display panel 10, the viewer may view the edge of the front surface FS of the display panel 10. In this instance, a visual effect, in which the screen size of the display device 2000 may appear to be greater than the actual screen size of the display device 2000, may be obtained.

Figure 66:
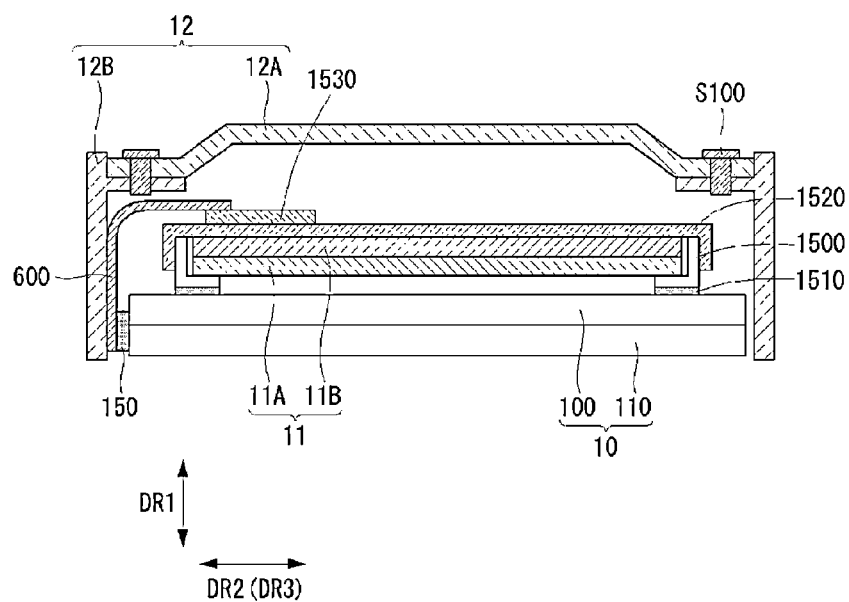

As shown in FIG. 66, the cover 12 may be physically divided into the back wall 12A and the side wall 12B. In this instance, the back wall 12A and the side wall 12B of the cover 12 may be fastened to each other using a fastener S100 such as, for example, a screw.

Figure 67:
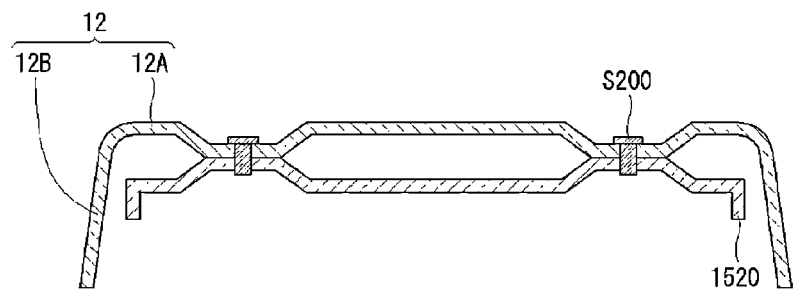

The cover 12 may be connected to the frame 1520. For example, as shown in FIG. 67, the back wall 12A of the cover 12 may be fastened to the frame 1520 using a predetermined fastener S200.

Figure 68:
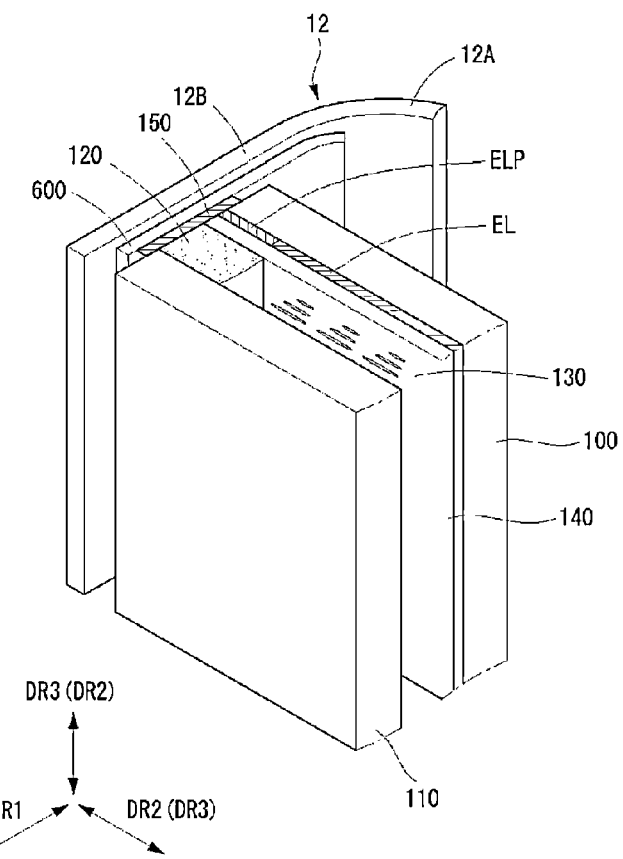

As shown in FIG. 68, the flexible substrate 600 may be exposed in an area between the side wall 12B of the cover 12 and the display panel 10. For example, when the viewer in the front of the display device 2000 watches the area between the side wall 12B of the cover 12 and the display panel 10, the flexible substrate 600 may be visible.

As described above, when a base layer and/or a cover layer of the flexible substrate 600 contain a black material, the view may not be obstructed even if the flexible substrate 600 is exposed to the area between the side wall 12B of the cover 12 and the display panel 10.

Figure 69:
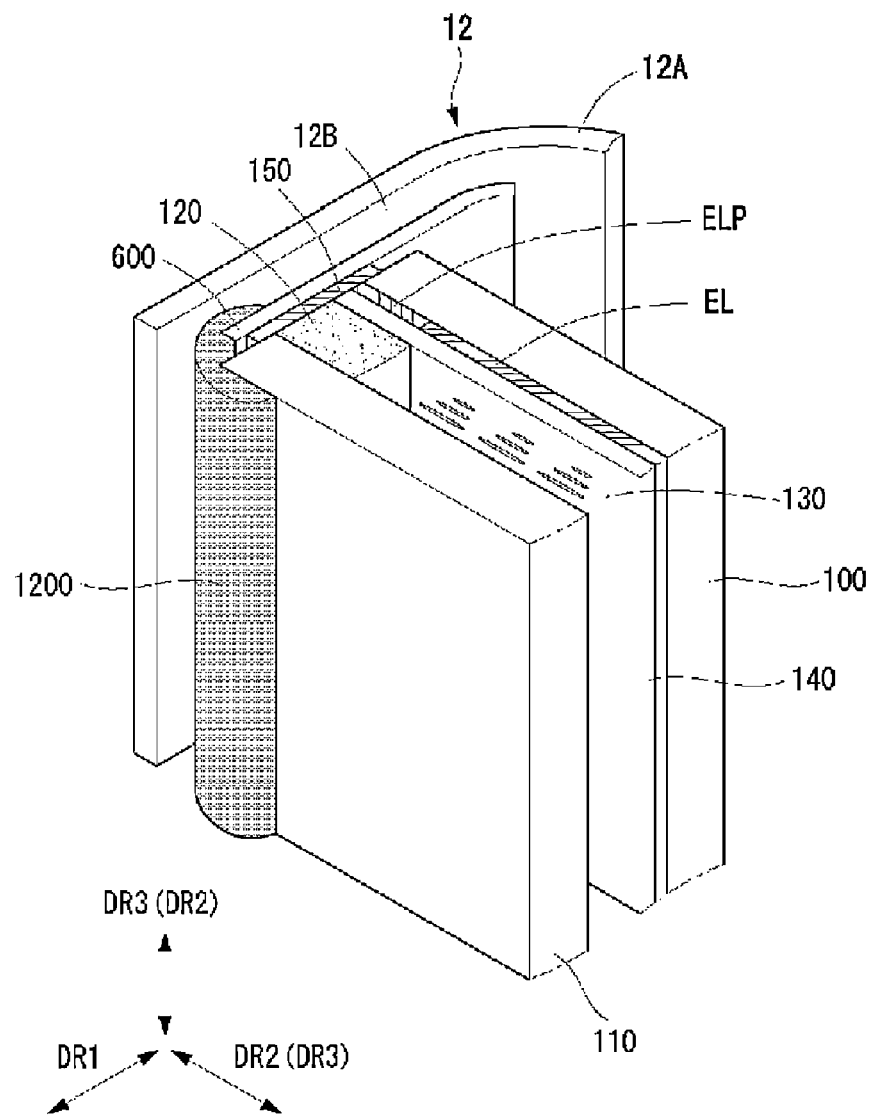

As shown in FIG. 69, when a resin layer 1200 is formed at an edge of the display panel 10, the resin layer 1200 may include a portion positioned between the side wall 12B of the cover 12 and the side of the display panel 10. An area between the side wall 12B of the cover 12 and the side of the display panel 10 may be covered by the resin layer 1200. In this instance, the resin layer 1200 may also include a black material as a dye.

Figure 70:
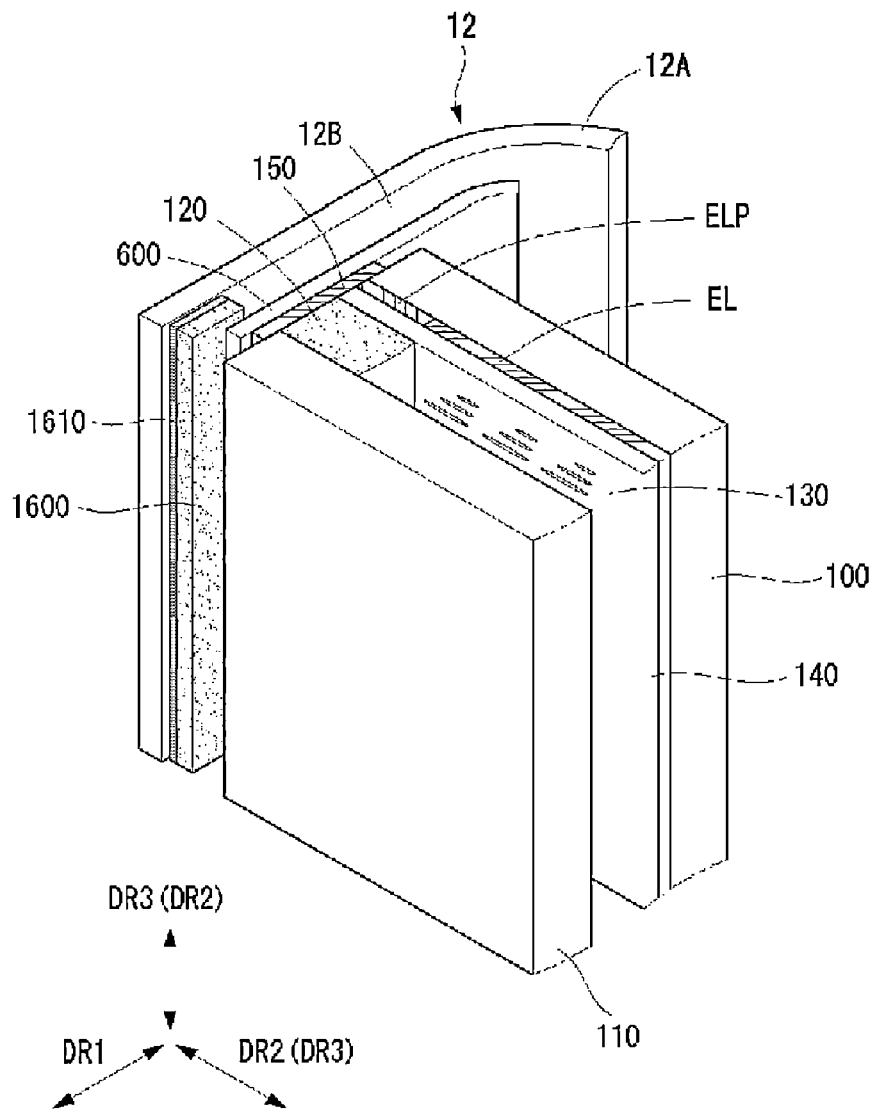

Alternatively, as shown in FIG. 70, a buffer layer 1600 having elasticity may be disposed between the side wall 12B of the cover 12 and the side of the display panel 10. The buffer layer 1600 may be formed of a material having elasticity, for example, a sponge material. The buffer layer 1600 may prevent interference collision between the side wall 12B of the cover 12 and the side of the display panel 10 and may prevent foreign materials, such as dust, from entering between the side wall 12B of the cover 12 and the side of the display panel 10. The buffer layer 1600 may be substantially black. The buffer layer 1600 may be attached to the side wall 12B of the cover 12. For this, an adhesive layer 1610 may be disposed between the side wall 12B of the cover 12 and the buffer layer 1600.

Figure 71:
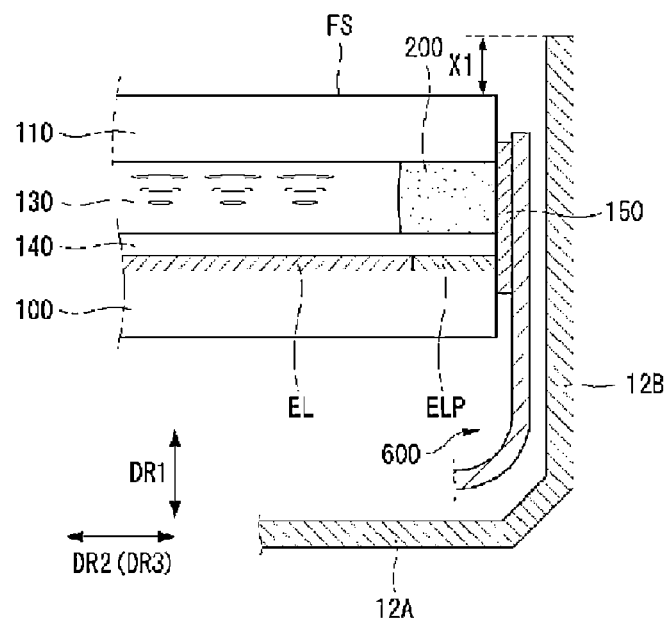

As shown in FIG. 71, the side wall 12B of the cover 12 may include a portion which protrudes beyond the front surface FS of the display panel 10, i.e., a front surface of a second substrate 110 by a predetermined height X1 in a vertical direction DR1. In this instance, the side wall 12B of the cover 12 may efficiently protect the side of the display panel 10.

Figure 72:
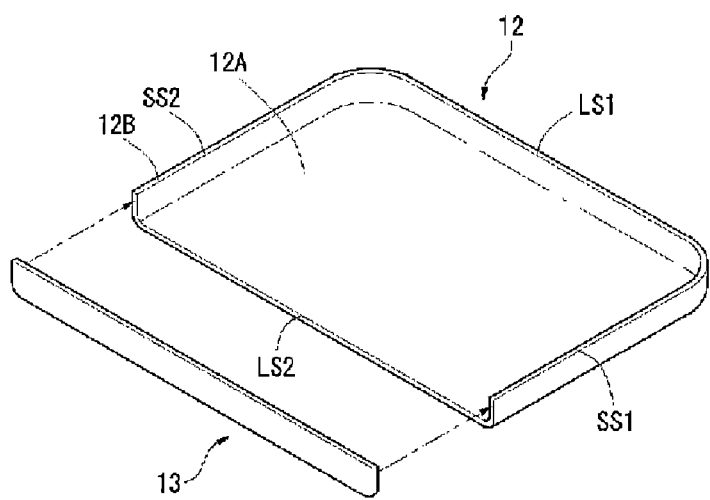
Figure 73:
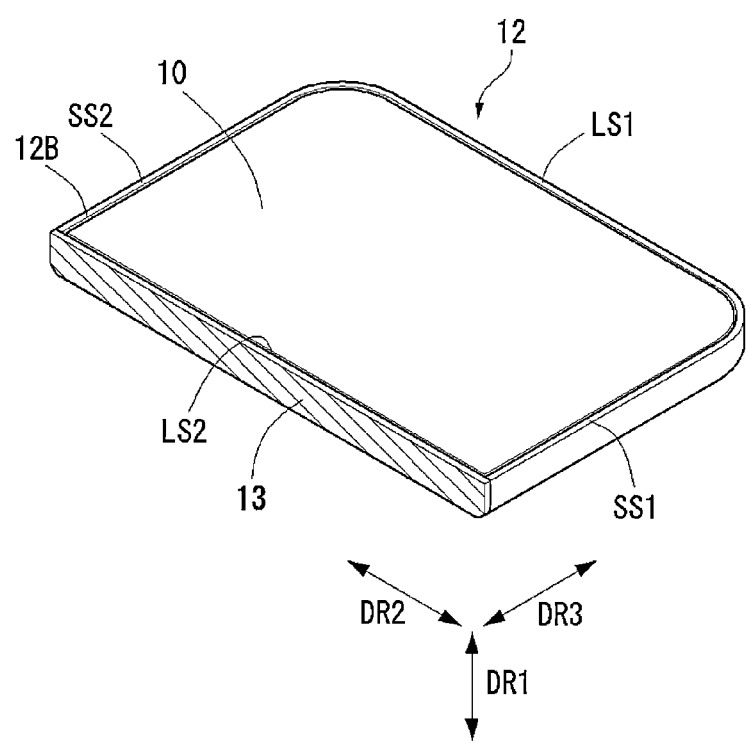

As shown in FIGS. 72 and 73, the display device 2000 according to this embodiment may further include a bottom cover 13. The bottom cover 13 may be connected to the cover 12. As shown in FIG. 73, the side wall 12B of the cover 12 may correspond to a first long side LS1, a first short side SS1, and a second short side SS2 of the display panel 10. The bottom cover 13 may be disposed on a second long side LS2 opposite the first long side LS1 of the display panel 10.

Hence, the side wall 12B of the cover 12 may cover the side of the display panel 10 in an area around the first long side LS1, the first short side SS1, and the second short side SS2 of the display panel 10. The bottom cover 13 may cover the side of the display panel 10 in the area around the second long side LS2 of the display panel 10.

The edge of the front surface of the display panel 10 may be exposed to the first long side LS1, the second long side LS2, the first short side SS1, and the second short side SS2 of the display panel 10. More specifically, because the flexible substrate 600 is attached to the side of the display panel 10, the edge of the front surface of the display panel 10 may be exposed to the first long side LS1, the second long side LS2, the first short side SS1, and the second short side SS2 of the display panel 10.

Figure 74:
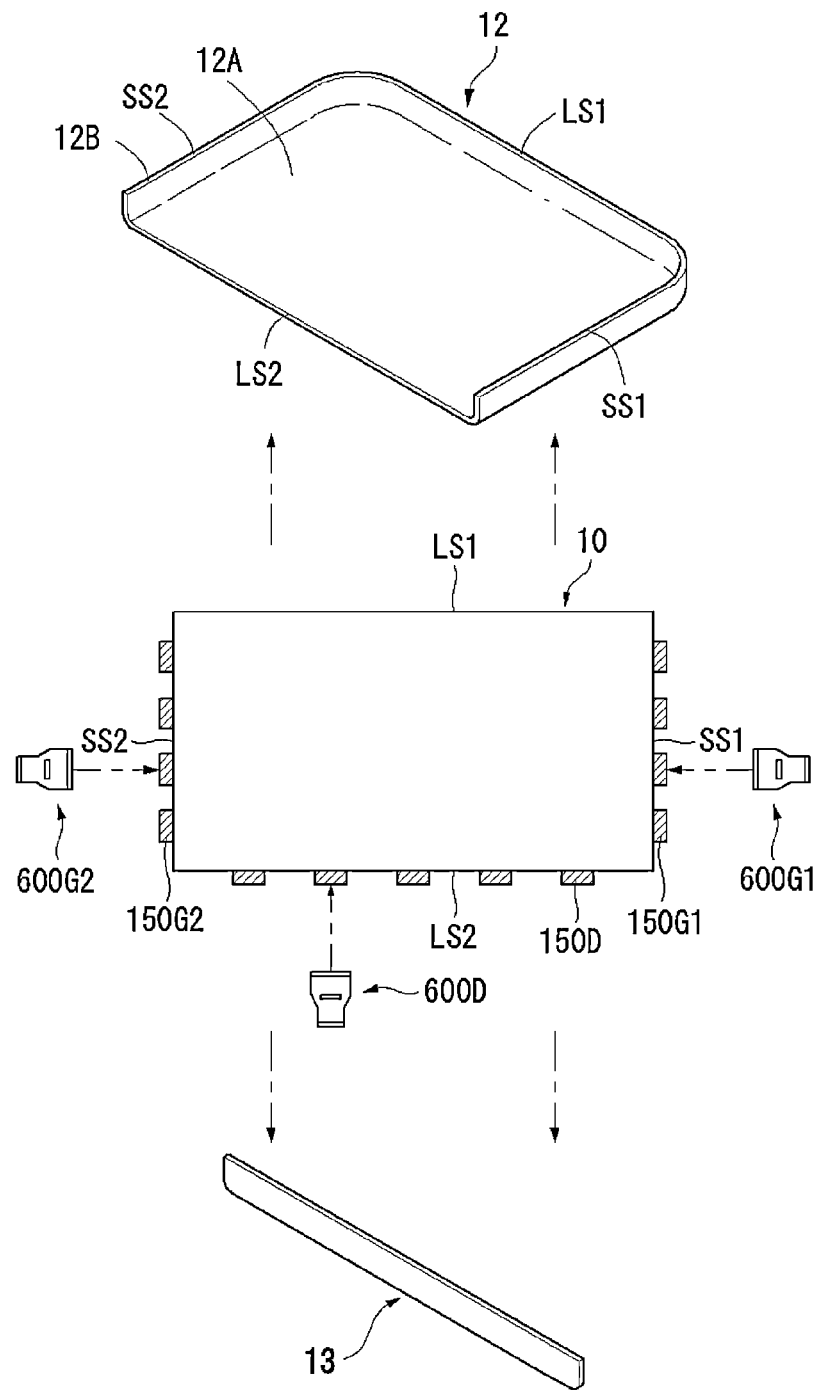

In the exemplary embodiment shown in FIG. 74, a data side electrode 150D is disposed on the second long side LS2 of the display panel 10, a first gate side electrode 150G1 of a gate side electrode 150G is disposed on the first short side SS1 of the display panel 10, and a second gate side electrode 150G2 of the gate side electrode 150G is disposed on the second short side SS2 of the display panel 10. In this instance, a first gate flexible substrate 600G1 may be electrically connected to the first gate side electrode 150G1, and a second gate flexible substrate 600G2 may be electrically connected to the second gate side electrode 150G2.

A data flexible substrate 600D may be disposed between the side of the display panel 10 and the bottom cover 13 in the area around the second long side LS2 of the display panel 10. The first gate flexible substrate 600G1 may be disposed between the side of the display panel 10 and the side wall 12B of the cover 12 in the area around the first short side SS1 of the display panel 10.

Further, the second gate flexible substrate 600G2 may be disposed between the side of the display panel 10 and the side wall 12B of the cover 12 in the area around the second short side SS2 of the display panel 10. In this instance, the area around the first long side LS1, the first short side SS1, and the second short side SS2 of the display panel 10 may be cut. Hence, the edge of the front surface of the display panel 10 may be exposed to the first long side LS1, the second long side LS2, the first short side SS1, and the second short side SS2 of the display panel 10.

Figure 75:
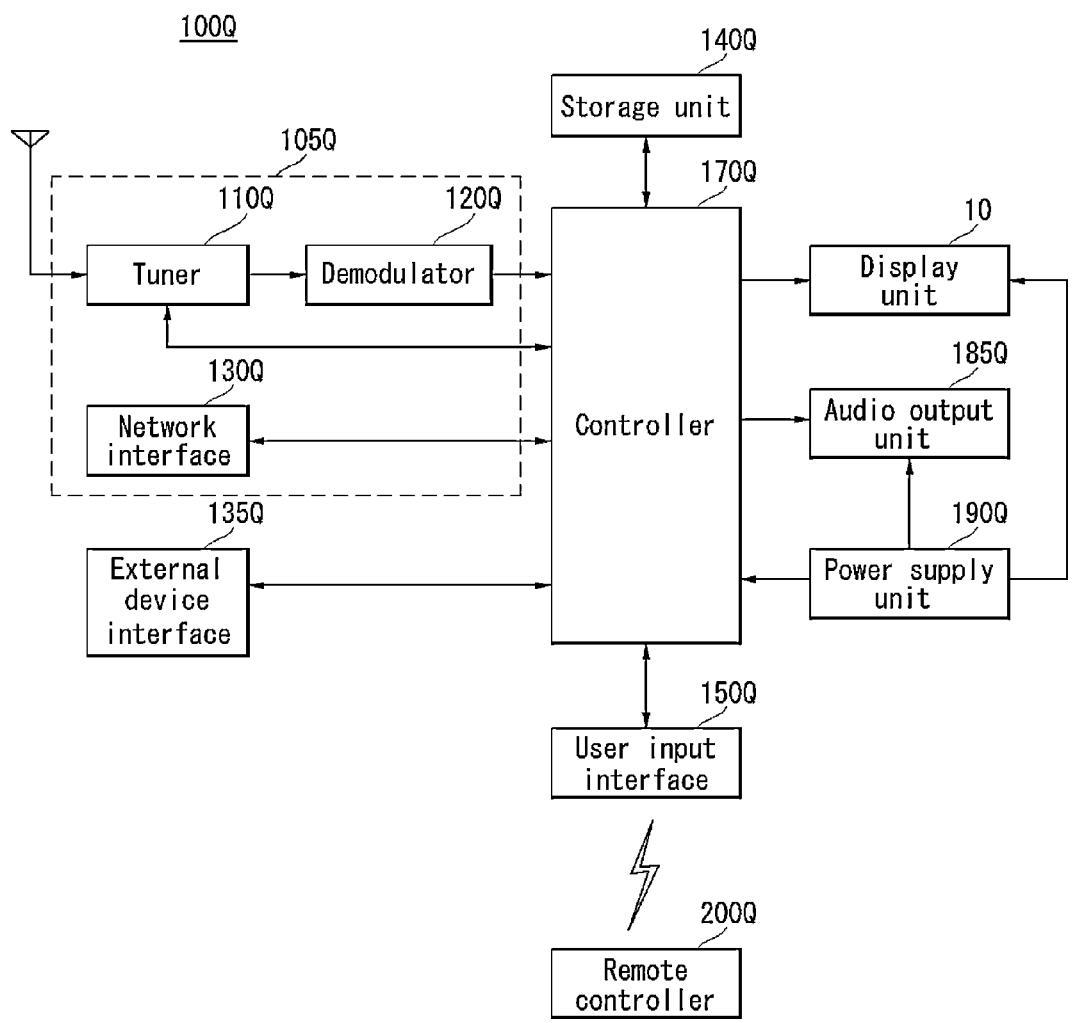
FIG. 75 illustrates exemplary electronic equipment including a display device in accordance with embodiments as broadly described herein.

FIG. 75 illustrates an example of a piece of electronic equipment, to which the display device according to embodiments as broadly described herein may be applied. In the following description, previous descriptions of the configuration and the structure are not repeated. Hereinafter, a broadcasting signal receiver may serve as an electronic device to which the display device, according to embodiments, is applied. The display device, according to embodiments, may be applied to other electronic devices such as, for example, cell phones.

A display device 10 shown in FIG. 75 may correspond to the display panel and the display device shown in FIGS. 1 to 74.

As shown in FIG. 75, a broadcasting signal receiver 100Q according to embodiments as broadly described herein may include a broadcasting receiver 105Q, an external device interface 135Q, a storage device 140Q, a user input interface 150Q, a controller 170Q, a display device 10, an audio output device 185Q, a power supply device 190Q, and a photographing device. The broadcasting receiver 105Q may include a tuner 110Q, a demodulator 120Q, and a network interface 130Q.

If necessary, the broadcasting signal receiver 100Q may be designed so that it includes the tuner 110Q and the demodulator 120Q and does not include the network interface 130Q. On the contrary, the broadcasting signal receiver 100Q may be designed so that it includes the network interface 130Q and does not include the tuner 110Q and the demodulator 120Q.

The tuner 110Q tunes a radio frequency (RF) broadcasting signal, which corresponds to a channel selected by the user or all of previously stored channels, among RF broadcasting signals received through an antenna. Further, the tuner 110Q converts the tuned RF broadcasting signal into a middle frequency signal, a base band image signal, or a voice signal.

The demodulator 120Q receives a digital IF signal converted by the tuner 110Q and performs a demodulating operation.

A stream signal output by the demodulator 120Q may be input to the controller 170Q. The controller 170Q performs demultiplexing, image/voice signal processing, etc. Then, the controller 170Q outputs an image to the display device 10 and outputs a voice to the audio output device 185Q.

The external device interface 135Q may connect an external device to the broadcasting signal receiver 100Q. For this, the external device interface 135Q may include an audio-visual (AV) input/output device or a wireless communication device.

The network interface 130Q provides an interface for connecting the broadcasting signal receiver 100Q to a wired/wireless network including an internet network.

The network interface 130Q may correspond to the wireless communication device, which was described in detail above.

The storage device 140Q may store a program for the signal processing of the controller 170Q and the control operation of the controller 170Q or may store the processed image signal, the processed voice signal, or a data signal.

The user input interface 150Q may transfer the signal the user inputs to the controller 170Q, or may transfer the signal from the controller 170Q to the user.

For example, the user input interface 150Q may receive and process control signals indicating turn-on or turn-off operation, channel selection, screen setting, etc. from a remote controller 200Q based on various communication manners such as an RF communication manner and an infrared communication manner. Alternatively, the user input interface 150Q may operate so that the control signal from the controller 170Q is transmitted to the remote controller 200Q.

For example, the user input interface 150Q may transfer a control signal, which is input from a power key, a channel key, a volume key, a local key, etc., to the controller 170Q.

The controller 170Q may perform the demultiplexing processing on the stream input through the tuner 110Q, the demodulator 120Q, or the external device interface 135Q or may perform the processing of demultiplexed signals, thereby generating or outputting the signals for outputting the image or the voice.

The image signal processed by the controller 170Q may be input to the display device 10 and may display an image corresponding to the image signal. Further, the image signal processed by the controller 170Q may be input to an external output device through the external device interface 135Q.

The voice signal processed by the controller 170Q may be output to the audio output device 185Q. Further, the voice signal processed by the controller 170Q may be input to the external output device through the external device interface 135Q.

The controller 170Q may control the entire operation of the broadcasting signal receiver 100Q. For example, the controller 170Q may control the tuner 110Q, so that the tuner 110Q tunes a RF broadcasting signal corresponding to a channel selected by the user or a previously stored channel.

The controller 170Q may control the broadcasting signal receiver 100Q using a user command or an internal program input through the user input interface 150Q.

The display device 10 may convert the image signal, the data signal, and an OSD signal, which are processed by the controller 170Q, or the image signal and the data signal which are received from the external device interface 135Q, into red, green, and blue signals and may generate a driving signal.

The audio output device 185Q may receive the voice signal (for example, stereo signal, 3.1 channel signal, or 5.1 channel signal) processed by the controller 170Q and may output the voice.

The power supply device 190Q supplies the power required in all of the components of the broadcasting signal receiver 100Q.

The remote controller 200Q transmits the user command the user inputs to the user input interface 150Q. For this, the remote controller 200Q may use Bluetooth, RF communication, infrared communication, Ultra-wideband (UWB), Zigbee, etc.

The remote controller 200Q may receive the image, the voice, or the data signal output from the user input interface 150Q and may display the image, the voice, or the data signal or may output the voice or the vibration.

The broadcasting signal receiver 100Q may not include the tuner 110Q and the demodulator 120Q. Further, the broadcasting signal receiver 100Q may receive image contents through the network interface 130Q or the external device interface 135Q and may reproduce the image contents.

In one embodiment, there is provided a display panel including a first substrate on which an electrode line and a switching element are disposed, a second substrate positioned opposite the first substrate, a seal part configured to attach the first substrate to the second substrate, a pad electrode which is disposed at a position overlapping the seal part in a vertical direction and is electrically connected to the electrode line, and a side electrode which is connected to one end of the pad electrode and includes a portion positioned on the side of the seal part.

A width of the pad electrode may be greater than a width of the electrode line.

One end of the pad electrode and one end of the seal part may be disposed on a straight line.

A width of the side electrode in the vertical direction may be greater than a width of the electrode line in a horizontal direction.

A width of the side electrode in the vertical direction may be greater than a distance between the adjacent side electrodes.

A distance between the side electrode and an end of the first substrate in the vertical direction may be less than a distance between the adjacent side electrodes.

The side electrode may include a portion positioned on the side of the first substrate and a portion positioned on the side of the second substrate.

The electrode line may include a gate line and a data line crossing the gate line. The pad electrode may include a gate pad electrode electrically connected to the gate line and a data pad electrode electrically connected to the data line. The side electrode may include a gate side electrode connected to one end of the gate pad electrode and a data side electrode connected to one end of the data pad electrode.

The gate pad electrode and the gate side electrode may be positioned on a short side of the first substrate. The data pad electrode and the data side electrode may be positioned on a long side of the first substrate.

The side electrode may include a base electrode and a protective electrode coated on the surface of the base electrode. The base electrode may contact the pad electrode.

A thickness of the protective electrode in a horizontal direction may be less than a thickness of the base electrode in the horizontal direction.

The side electrode may contain a material having electrical conductivity greater than the electrode line and the pad electrode.

A color filter may be disposed on the second substrate.

The display panel may also include a flexible substrate which is attached to the side of the display panel and is electrically connected to the side electrode.

A width of the flexible substrate in a horizontal direction may be greater than a distance between the adjacent flexible substrates.

The flexible substrate may include at least one of a portion attached to the side of the first substrate, a portion attached to the side of the seal part, and a portion attached to the side of the second substrate.

The display panel may also include a resin layer configured to cover at least a portion of the flexible substrate and a portion of the second substrate.

The resin layer may include a first part positioned on the side of the display panel and a second part positioned in the front of the display panel.

The display panel may also include a film type filter attached to a front surface of the second substrate. The second part of the resin layer may contact the film type filter.

The display panel may also include a cover positioned in the rear of the display panel. At least one edge of a front surface of the display panel may be exposed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
 a display panel; and
 a cover positioned on at least one side of the display panel;
 wherein the display panel includes,
 a first substrate on which an electrode line and a switching element are disposed,
 a second substrate positioned opposite the first substrate,
 a seal part configured to attach the first substrate to the second substrate,
 a pad electrode electrically connected to the electrode line, the pad electrode disposed at a position overlapping the seal part in a first direction,
 a side electrode connected to one end of the pad electrode and including a portion positioned on the side of the seal part,
 a flexible substrate attached to a side of the display panel and electrically connected to the side electrode,
 wherein the side electrode comprises a protective electrode formed on a surface of the side electrode, and a material of the protective electrode is different from a material of the side electrode.

2. The display device of claim 1, wherein the protective electrode is formed using a plating method.

3. The display device of claim 1, wherein in a second direction, a width of the pad electrode is different from a width of the electrode line.

4. The display device of claim 1, wherein in a second direction, a width of the pad electrode is greater than a distance between adjacent pad electrodes.

5. The display device of claim 1, wherein in a second direction, a width of the side electrode is greater than a distance between adjacent side electrodes.

6. The display device of claim 1, wherein a height of the side electrode in a first direction is greater than a distance between adjacent side electrodes in a second direction.

7. The display device of claim 1, wherein the flexible substrate comprises:
 a base layer formed by a resin material having flexibility, and
 at least one electrode positioned on the base layer and connected to the side electrode.

8. The display device of claim 1, wherein a color of at least one portion of the flexible substrate is black.

9. The display device of claim 1, wherein a height of the side electrode in a first direction is greater than a width of the side electrode in a second direction.

10. The display device of claim 1, wherein the side electrode covers at least one side portion of the first substrate, the second substrate, the seal part or the pad electrode.

11. The display device of claim 1, further comprising a resin layer covering at least a portion of the flexible substrate.

12. The display device of claim 11, wherein a color of at least a portion of the resin layer is black.

13. The display device of claim 1, wherein the flexible substrate comprises at least one transmission lines corresponding to at least one of a data line or a gate line.

14. The display device of claim 1, wherein the flexible substrate is exposed between a side portion of the cover and the display panel.

15. The display device of claim 1, further comprising a buffer layer positioned between a side portion of the cover and the display panel.

16. The display device of claim 15, wherein the buffer layer has a prescribed elasticity.

17. The display device of claim 15, wherein the buffer layer is adhered to the side portion of the cover.

18. The display device of claim 1, further comprising a driver which is electrically connected to the side electrode by the flexible substrate.

19. The display panel of claim 1, wherein the flexible substrate comprises a portion extended more than a front surface of the second substrate.

20. The display panel of claim 1, wherein the electrode line comprises a gate line and a data line crossing each other,
 the pad electrode comprises a gate pad electrode and a data pad electrode, the gate pad electrode being electrically connected with the gate line, and the data pad electrode being electrically connected to the data line,
 the side electrode comprises a gate side electrode and a data side electrode, the gate side electrode being connected to one end of the gate pad electrode, and the data side electrode being connected to one end of the data pad electrode, and
 the flexible substrate comprises a flexible gate and a flexible data substrate, the flexible gate substrate being electrically connected to the gate side electrode, and the flexible gate substrate being electrically connected to the data side electrode.

21. The display panel of claim 20, wherein the gate pad electrode, the gate side electrode, and the flexible gate substrate are positioned on a first side of the first substrate, and
 the data pad electrode, the data side electrode, and the flexible data substrate are positioned on a second side of the first substrate, the second side of the first substrate being longer in length than the first side of the first substrate.

* * * * *